United States Patent …

(12) United States Patent
Inaguma et al.

(10) Patent No.: US 7,723,901 B2
(45) Date of Patent: May 25, 2010

(54) VIBRATING GYROSENSOR AND VIBRATING ELEMENT

(75) Inventors: Teruo Inaguma, Miyagi (JP); Junichi Honda, Miyagi (JP); Koji Suzuki, Miyagi (JP); Kazuo Takahashi, Miyagi (JP); Eiji Nakashio, Miyagi (JP)

(73) Assignee: Sony Corporation, Tokyo (JP)

( * ) Notice: Subject to any disclaimer, the term of this patent is extended or adjusted under 35 U.S.C. 154(b) by 1038 days.

(21) Appl. No.: 11/363,395

(22) Filed: Feb. 27, 2006

(65) Prior Publication Data

US 2006/0202591 A1    Sep. 14, 2006

(30) Foreign Application Priority Data

| Feb. 28, 2005 | (JP) | ............ P2005-054844 |
| Mar. 18, 2005 | (JP) | ............ P2005-080473 |
| Jun. 16, 2005 | (JP) | ............ P2005-176869 |
| Jun. 16, 2005 | (JP) | ............ P2005-176870 |
| Dec. 27, 2005 | (JP) | ............ P2005-374324 |

(51) Int. Cl.
*H01L 41/08* (2006.01)
(52) U.S. Cl. .................... 310/330; 310/370
(58) Field of Classification Search ......... 310/330–332, 310/370
See application file for complete search history.

(56) References Cited

U.S. PATENT DOCUMENTS

| 4,494,409 | A | * | 1/1985 | Kondo et al. ............... 310/330 |
| 5,539,270 | A | * | 7/1996 | Kaji et al. ............... 310/332 |
| 5,723,790 | A |   | 3/1998 | Andersson |
| 5,753,912 | A | * | 5/1998 | Matsuyama ............... 73/105 |
| 5,765,046 | A |   | 6/1998 | Watanabe et al. |
| 5,796,000 | A |   | 8/1998 | Fujiu et al. |
| 6,308,567 | B1 |   | 10/2001 | Higuchi et al. |
| 6,497,148 | B1 | * | 12/2002 | Abe et al. ............... 73/504.16 |
| 7,004,029 | B2 | * | 2/2006 | Sakai ............... 73/514.32 |

(Continued)

FOREIGN PATENT DOCUMENTS

EP    0369352    11/1989

(Continued)

OTHER PUBLICATIONS

EP Communication dated May 9, 2008 for Application No. 06003942.7-1236.

(Continued)

*Primary Examiner*—J. SanMartin
(74) *Attorney, Agent, or Firm*—Sonnenschein Nath & Rosenthal LLP

(57) ABSTRACT

A vibrating gyrosensor includes a support substrate on which a wiring pattern having a plurality of lands is formed, and a vibrating element mounted on a surface of the support substrate. The vibrating element includes a base part having a mounting surface on which a plurality of terminals, and a vibrator part integrally projected in a cantilever manner from one of the sides of the base part and having a substrate-facing surface coplanar with the mounting surface of the base part. The vibrator part has a first electrode layer, a piezoelectric layer, and a second electrode layer, which are formed on the substrate-facing surface in that order. Furthermore, a reinforcing part is formed at the base end of the vibrator part so that the sectional area of the vibrator part gradually increases toward the base part.

18 Claims, 40 Drawing Sheets

U.S. PATENT DOCUMENTS

| | | | |
|---|---|---|---|
| 7,263,884 B2* | 9/2007 | Takahashi et al. | 73/504.15 |
| 7,322,242 B2* | 1/2008 | Merassi et al. | 73/514.38 |
| 2003/0217609 A1 | 11/2003 | Fujimoto et al. | |
| 2009/0174292 A1* | 7/2009 | Takahashi et al. | 310/348 |

FOREIGN PATENT DOCUMENTS

| | | |
|---|---|---|
| EP | 1146533 | 12/1999 |
| EP | 1118836 | 12/2000 |
| JP | 63-8565 | 1/1988 |

OTHER PUBLICATIONS

European Search Report dated Jun. 30, 2006.

* cited by examiner

SiO₂ FILM THICKNESS FIXED AT 500 nm

SiO₂ GAS PRESSURE FIXED AT 0.4 Pa
SiO₂ FILM THICKNESS FIXED AT 300 nm

VARIATION IN CAPACITY DUE TO EXTERNAL DISTURBANCE

VARIATION IN OFFSET VOLTAGE DUE TO EXTERNAL DISTURBANCE

VARIATION IN OFFSET VOLTAGE

VIBRATION DIRECTION

SMALL DETECTION SIGNAL

LARGE DETECTION SIGNAL

VIBRATION DIRECTION

VIBRATION MODE IN CASE
OF SYMMETRIC ROOT

VIBRATION MODE IN CASE
OF ASYMMETRIC ROOT

VIBRATING GYROSENSOR AND VIBRATING ELEMENT

CROSS REFERENCES TO RELATED APPLICATIONS

The present invention contains subject matter related to Japanese Patent Application JP 2005-080473 filed in the Japanese Patent Office on Mar. 18, 2005, Japanese Patent Application JP 2005-054844 filed in the Japanese Patent Office on Feb. 28, 2005, Japanese Patent Application JP 2005-176869 filed in the Japanese Patent Office on Jun. 16, 2005, Japanese Patent Application JP 2005-080473 filed in the Japanese Patent Office on Mar. 18, 2005, Japanese Patent Application JP 2005-176870 filed in the Japanese Patent Office on Jun. 16, 2005, and Japanese Patent Application JP 2005-374324 filed in the Japanese Patent Office on Dec. 27, 2005, the entire contents of which are incorporated herein by reference.

BACKGROUND OF THE INVENTION

1. Field of the Invention

The present invention relates to an angular velocity sensor used, for example, for detecting motion blurring of a video camera, detecting a motion in a virtual reality device, detecting a direction in a car navigation system, and the like. Specifically the invention relates to a method for manufacturing a small vibrating gyrosensor and a vibrating element each including a cantilever vibrator.

2. Description of the Related Art

As consumer angular velocity sensors, so-called vibrating gyrosensors are widely used, in each which a cantilever vibrator is vibrated at a predetermined resonance frequency, and Coriolis' force produced by the influence of an angular velocity is detected by a piezoelectric element to detect the angular velocity.

The vibrating gyrosensors have the advantages of a simple mechanism, a short starting time, and a low manufacturing cost. For example, vibrating gyrosensors are mounted on electronic devices, such as a video camera, a virtual reality device, and a car navigation system, for detecting motion burring, an operation, and a direction, respectively.

A usual vibrating gyrosensor includes a vibrating element which is manufactured by machine-cutting an appropriate piezoelectric material to form a predetermined shape. A vibrating gyrosensor is required to have a smaller size and higher performance with reduction in size and weight and increases in functionality and performance of a main body device on which vibrating gyrosensor is mounted. However, it has been difficult to manufacture a small vibrating element with high precision due to the limit of machining precision.

Therefore, there has recently been proposed a vibrating gyrosensor including a cantilever vibrating element formed by laminating a pair of electrode layers with a piezoelectric thin film layer provided therebetween on a silicon substrate using a thin film technique for semiconductor processes (refer to, for example, Japanese Unexamined Patent Application Publication No. 7-113643). Such a gyrosensor may be reduced in size and thickness and thus complexed or increased in functionality by combination with a sensor for other purposes.

SUMMARY OF THE INVENTION

A vibrating gyrosensor is mounted on a mount substrate such as a control substrate or the like and further mounted on a main body device. Therefore, a vibrating gyrosensor is required to have a smaller size and higher performance with reduction in size and weight and increase in functionality and performance of the main body device. In a general vibrating gyrosensor, each electrode of a vibrating element is bonded to a land on a support substrate by a wire bonding process, and thus a wiring space is preferably formed around the vibrating element, thereby limiting miniaturization.

Therefore, in order to improve a mounting space and mounting efficiency, there has been investigated an attempt to surface-mount a vibrating element on a support substrate by a flip-chip mounting process used as a mounting process for semiconductor chips and the like. Similarly, in a vibrating gyrosensor, an attempt has been made to surface-mount a support substrate on a mount substrate, for improving the space and the efficiency of the mounting step.

On the other hand, when a vibrating element is reduced in size and surface-mounted, a vibrating gyrosensor is strongly affected by an external load such as vibration, impact, or the like applied from the outside. In a vibrating gyrosensor, the size of a vibrating element is also reduced to about $\frac{1}{100}$ by volume of that of a usual one, thereby causing difficulty in maintaining durability to a mechanical external load. Therefore, for example, when a device is mistakenly dropped, a vibrating eLement may be broken, particularly cracked, by high impact force, thereby causing the problem of decreasing the reliability.

Also, in a vibrating gyrosensor, it becomes difficult to secure a sufficient space between electrode layers or in a wiring pattern with attempts to decrease the size and thickness according to the demand for complication and increase in functionality. Furthermore, leakage occurs between electrode layers due to the influence of contamination with moisture, dust, or the like, which adhere to each electrode layer, and thus noise may occur. Therefore, the noise superposed on an output signal is output, thereby causing the problem of failing to detect a vibration with high precision.

Furthermore, when a vibrating gyrosensor is complicated or increased in functionality by being mounted together with other sensor components, electronic components, and the like on the same support substrate, insulation is preferably maintained between these components. In addition, it is desirable to protect electrode layers and a piezoelectric thin film layer, each of which is formed to a small thickness on a silicon substrate, and to prevent oxidation of each electrode layer.

On the other hand, in a semiconductor technique, generally, an appropriate doped N-type or P-type single crystal silicon substrate is used, and elements and fine patterns are formed on a main surface of the substrate by a thin film technique. Such a single crystal silicon substrate has the characteristics such as a low volume resistivity of several tens $\Omega \cdot$ cm. A usual vibrating gyrosensor has the problem that the characteristics of a vibrating element, which includes electrode layers formed together with a piezoelectric thin film layer on a single crystal silicon substrate used as a base, are greatly changed by external light and a heat load, thereby failing to stably detect a motion with high precision.

Although a detailed mechanism has been not yet known, it is thought that in a vibrating gyrosensor, holes and carriers present in a layer are exited by light or heat to generate a micro current which affects the characteristics of a vibrating element. Also, in a vibrating element, an electrode layer may be short-circuited with a silicon layer due to pin holes which are produced in the electrode layer and silicon layer through an oxide layer formed on the surface of the single crystal silicon substrate during the process, defects which are produced in an oxide film due to careless handling during the process, or defects which are produced in an oxide film due to patterning precision error or resist impurities in etching of the oxide film during the process. Namely, a usual vibrating gyrosensor has the problem that a short-circuit defect occurs between electrodes through a silicon layer having low volume resistivity, and the yield is decreased.

It is desirable to provide a vibrating gyrosensor having improved durability and low cost while maintaining the characteristic of micronization, and a method for manufacturing the same.

It is also desirable to provide a small vibrating gyrosensor capable of avoiding the influence of moisture, dust, and the like by sealing electrode layers and of precisely and stably detecting vibration, and a method for manufacturing the same.

It is further desirable to provide a vibrating gyrosensor improved in durability against external disturbances such as external light, heat, and the like, and improved in yield.

According to an embodiment of the invention, there is provided a vibrating gyrosensor including a support substrate on which a wiring pattern with a plurality of lands is formed, and a vibrating element mounted on a surface of the support substrate. The vibrating element includes a base part having a mount surface on which a plurality of terminals to be connected to the lands is formed, and a vibrator part integrally projected in a cantilever manner from one of the sides of the base part and having a surface facing the substrate, the surface being coplanar with the mount surface of the base part. Also, the vibrator part has a first electrode layer formed on the substrate-facing surface, a piezoelectric layer laminated on the first electrode layer, and a second electrode layer laminated on the piezoelectric layer. Furthermore, a reinforcing part is formed at the base end of the vibrator so that the sectional area of the vibrator part gradually increases toward the base part.

According to another embodiment of the invention, there is provided a method for manufacturing a vibrating element including a base part having a mount surface on which a plurality of terminals is formed, and a vibrator part integrally projected in a cantilever manner from one of the sides of the base part and having a surface facing the substrate, the surface being coplanar with the mount surface of the base part, and the vibrator part having a first electrode layer formed on the substrate-facing surface, a piezoelectric layer laminated on the first electrode layer, and a second electrode layer laminated on the piezoelectric layer. The method includes the steps of forming an etched recess in a first main surface of a silicon substrate by etching, the etched recess having an etched inclined surface inclined at a predetermined inclination angle and a depth corresponding to the thickness of the vibrator part of the vibrating element from the first main surface; forming the piezoelectric layer and the first and second electrode layers on a second main surface facing the etched recess of the silicon substrate; forming a U-shaped outside groove within the etched groove by pattering, the outside groove including a through groove for forming the outer shape of the vibrator part; and cutting the silicon substrate at both ends of the outside groove to cut out the base part of the vibrating element. In the step of forming the outside groove, both ends of the outside groove are formed at intermediate positions of the etched recess so as to form a reinforcing part at the base end of the vibrator part so that the sectional area of the vibrator part gradually increases toward the base.

By forming the reinforcing part at the base end of the vibrator part, the vibrator part may be prevented from being broken even when a larqe external load is applied to the vibrating element, and the durability may be improved while maintaining the characteristic of miniaturization. Since the reinforcing part may be formed in the process for manufacturing the vibrating element, a special step for forming the reinforcing part is not provided, and thus the vibrating element having the reinforcing part may be manufactured at low cost with high productivity.

When an insulating protective layer is formed on the substrate-facing surface of the vibrator part to seal the first electrode layer, the piezoelectric layer, and the second electrode layer, moisture, dust, and the like in air are cut off to prevent the adhesion to each of the electrode layers and prevent the oxidation of the electrode layers, electrically insulate the electrode layers, or mechanically protect the electrode layers and the piezoelectric layer. As a result, vibration may be stably and precisely detected.

Furthermore, an undoped single crystal silicon substrate is used as a constituent base material of the vibrating element, for decreasing the conductivity of the base material. Therefore, durability against external light and heat may be improved, and the rate of defects, such as interlayer short-circuit, during the manufacturing process may be decreased, thereby increasing the yield.

As described above, according to an embodiment of the invention, the reinforcing part is formed at the base end of the vibrator part, for improving mechanical strength, and the reinforcing part may be formed by a simple process. Therefore, it may be possible to improve durability against an external load such as an impact or the like and precisely detect a change in angular velocity.

Since the insulating protective layer is formed for sealing the electrode layers and the piezoelectric film layer formed on the surface of the vibrator part, it may be possible to prevent the adhesion of moisture and dust to the electrode layers which are small and thin and formed with a narrower space, and precisely detect vibration.

Furthermore, since an undoped single crystal silicon substrate is used as the base material of the vibrating element, it may be possible to improve durability against light and heat or decrease the rate of defects such as interlayer short-circuit in the manufacturing process, thereby improving the yield.

BRIEF DESCRIPTION OF THE DRAWINGS

FIGS. 44A and 44B are characteristic drawings of the defective fraction of a vibrating gyrosensor, in which FIG. 44A shows the defective fraction of a vibrating gyrosensor including a vibrating element according to an embodiment of the invention, and FIG. 44B shows the defective fraction of a vibrating gyrosensor of a comparative example including a vibrating element produced using a general silicon substrate;

FIGS. 48A and 48B are drawings each illustrating the relation between the symmetry of a vibrator part and the vibration mode, in which FIG. 48A shows the vibration mode of a symmetric vibrator part, and FIG. 48B shows the vibration mode of an asymmetric vibrator part;

FIGS. 49A and 49B are drawings illustrating a step of forming an outside groove for cutting out the outer shape of a vibrator part, in which FIG. 49A is a sectional view of a principal portion as viewed in the longitudinal direction of the vibrator part, and FIG. 49B is a sectional view of a principal portion as viewed from a direction perpendicular to the longitudinal direction of the vibrator part;

FIGS. 50A and 50B are drawings illustrating the operation of a second embodiment of the invention, in which FIG. 50A shows the vibration mode of a symmetric vibrator part, and FIG. 50B shows the vibration mode of an asymmetric vibrator part;

FIGS. 52A and 52B are drawings illustrating the relation between the symmetry of the root shape of a vibrator part and the vibration mode, in which FIG. 52A shows the vibration mode of a vibrator part having a symmetric root shape, and FIG. 52B shows the vibration mode of a vibrator part having an asymmetric root shape;

DESCRIPTION OF THE PREFERRED EMBODIMENTS

Vibrating gyrosensors according to embodiments of the present invention will be described in detail below with reference to the drawings.

The present invention is not limited to theses embodiments, and various modifications may be made on the basis of the technical idea of the invention. Although each of parts of component members will be described below using specified dimension values, each dimension value is a central reference value. Also, the dimension values of each part are not limited to these central reference values, and each part may be formed with dimension values within a general tolerance range. Furthermore, the dimension values of the vibrating gyrosensors are not limited these dimension values, and each part may be appropriately formed according to characteristic specifications.

First Embodiment (Schematic Configuration of Vibrating Gyrosensor)

Figure 1:
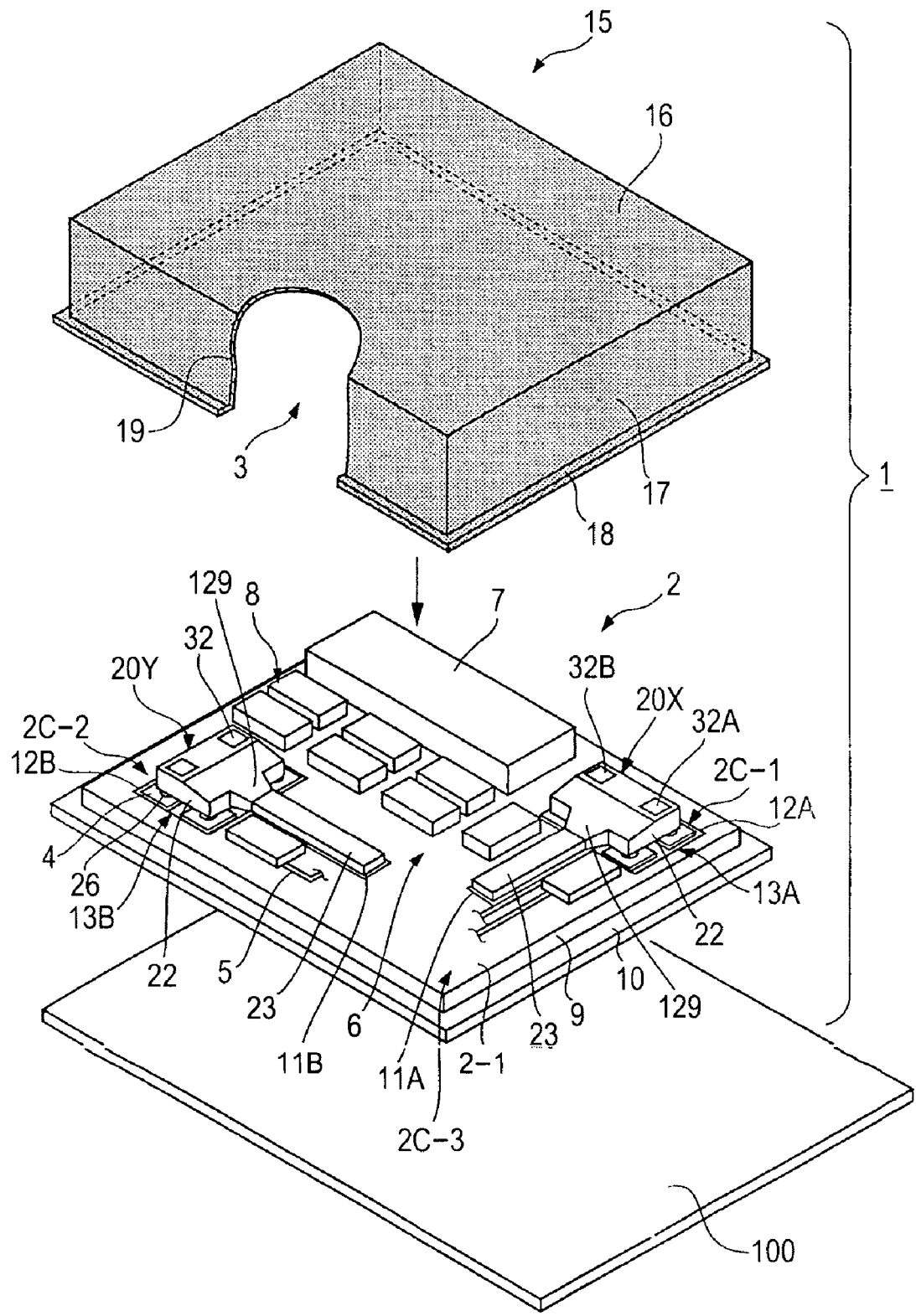
FIG. 1 is a perspective view of the whole of a vibrating gyrosensor according to a first embodiment of the present invention, with a cover member being removed.

Referring to FIG. 1, a vibrating gyrosensor 1 has an exterior member including a support substrate 2 and a cover member 15 combined with a first main surface 2-1 of the support substrate 2 to form a component mounting space 3. For example, the vibrating gyrosensor 1 is mounted on a video camera to serve as a mechanism for correcting motion blurring. Also, for example, the vibrating gyrosensor 1 is used for a virtual reality device to serve as a motion detector or used for a car navigation system to serve as a direction detector.

The vibrating gyrosensor 1 includes, for example, a ceramic substrate or a glass substrate as the support substrate 2. Also, a predetermined wiring pattern 5 having a plurality of lands 4 is formed on the first main surface 2-1 of the support substrate 2 to form a component mounting region 6. In the component mounting region 6 are mixed-loaded a pair of first and second vibrating elements 20X and 20Y (hereinafter generically referred to as "vibrating elements 20" unless otherwise specified), which are mounted to detect vibrations in different axial directions and which will be described in detail below, IC circuit elements 7, and many ceramic capacitors and electronic components 8, which are externally provided.

Figure 2:
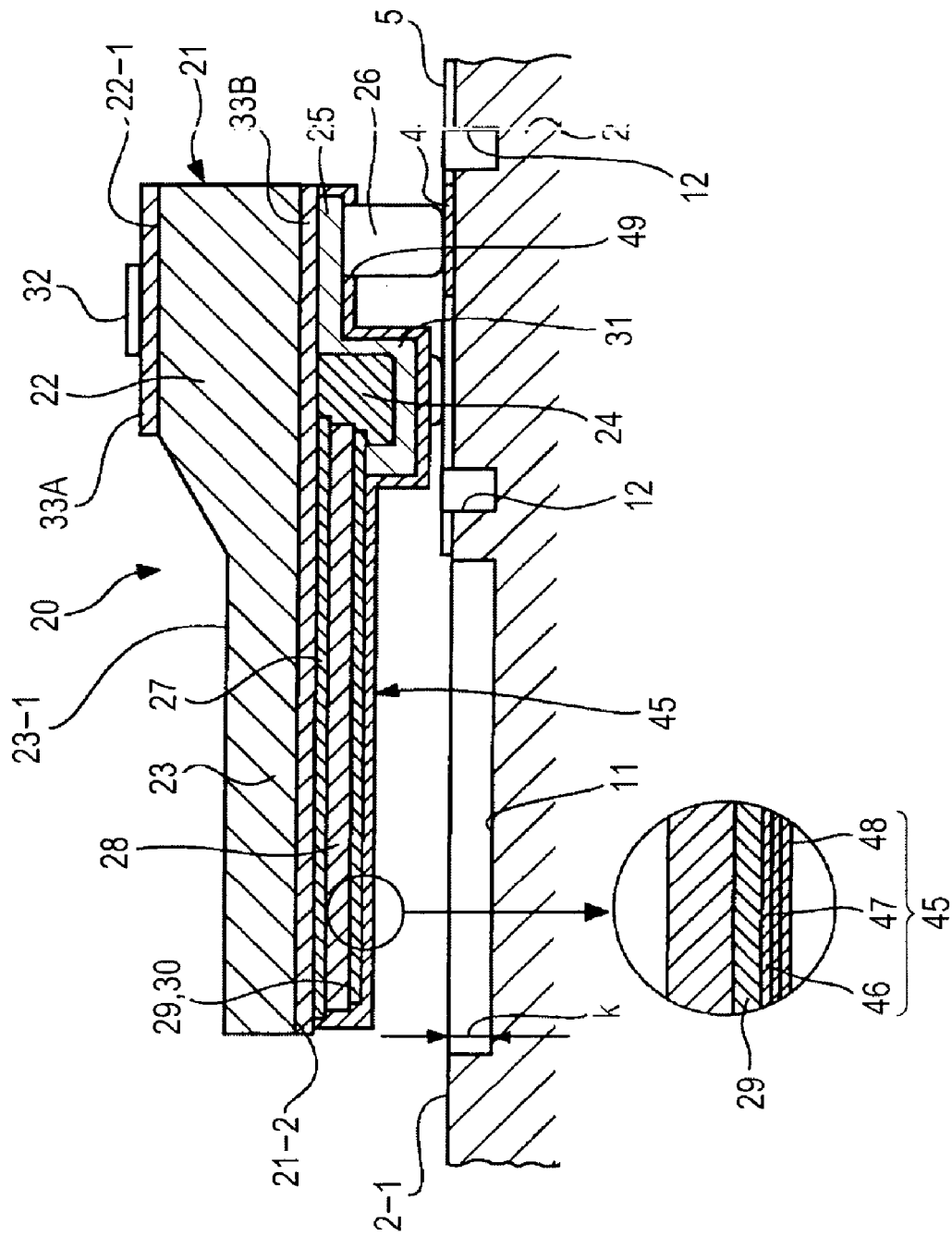
FIG. 2 is a sectional view of a principal portion of a vibrating element of the vibrating gyrosensor shown in FIG. 1.

In the component mounting region 6 of the support substrate 2, the vibrating elements 20 as well as the IC circuit elements 7 and the electronic components 8 are surface-mounted by a flip-chip process using a proper mounting machine. The pair of the vibrating elements 20X and 20Y having the same shape is mounted at the opposite corners 2C-1 and 2C-2 of the first main surface 2-1 of the support substrate 2 so as to have different axial lines. As shown in FIG. 2, each of the vibrating elements 20 has a base part 22 having a mount surface on which a plurality of terminals 25 to be connected to respective lands 4 through gold bumps 26 is formed, and a vibrator part 23 integrally projected from one of the sides of the base part 22 in a cantilever manner. The structure of each vibrating element 20 will be described in detail below.

As shown in FIG. 1, the base part 22 of the first vibrating element 20X is fixed to a floating island-like first vibrating element mounting region 13A formed at the corner 2C-1 of the component mounting region 6 of the support substrate 2, and the vibrator part 23 integrally projected from the base part 22 is directed toward the corner 2C-3 adjacent to the corner 2C-1 along the side edge of the support substrate 2. The base part 22 of the other second vibrating element 20Y is fixed to a floating island-like second vibrating element mounting region 13B formed at the corner 2C-2 of the component mounting region 6 of the support substrate 2, and the vibrator part 23 integrally projected from the base part 22 is directed toward the corner 2C-3 adjacent to the corner 2C-2 along the side edge of the support substrate 2.

In other words, the first and second vibrating elements 20X and 20Y are mounted at an angle of 90° on the support substrate 2 so that the vibrator parts 23 are directed toward the corner 2C-3. The vibrating gyrosensor 1 is adapted to detect vibrations in two axial directions perpendicular to each other using the pair of the vibrating elements 20X and 20Y. However, the vibrating elements 20X and 20Y may be mounted at an appropriate angle on the support substrate 2 according to the specifications of a main body device.

The vibrating gyrosensor 1 detects angular velocities around the longitudinal directions of the vibrator parts 23 of the vibrating elements 20 in a state in which the vibrators 23 are resonated. In the vibrating gyrosensor 1, the first and second vibrating elements 20X and 20Y are mounted at an angle on the support substrate 2, for simultaneously detecting the angular velocities in the X-axis and Y-axis directions. For example, in a video camera, the vibrating gyrosensor serves as a motion blur correcting mechanism which outputs a control signal based on a vibration state due to motion blurring.

Next, the configuration of the support substrate 2 will be described in detail.

(Load Buffering Structure)

The vibrating gyrosensor 1 may be decreased in size and thickness by thinning the thickness of the support substrate 2. Therefore, strain or stress may occur in the support substrate 2 due to an external load such as vibration, an impact, or the like which is applied from the outside. In this embodiment, a buffer structure for an external load is provided on the support substrate 2, for decreasing the influence on the vibrating elements 20 mounted on the support substrate 2 even when strain or stress occurs.

Figure 3:
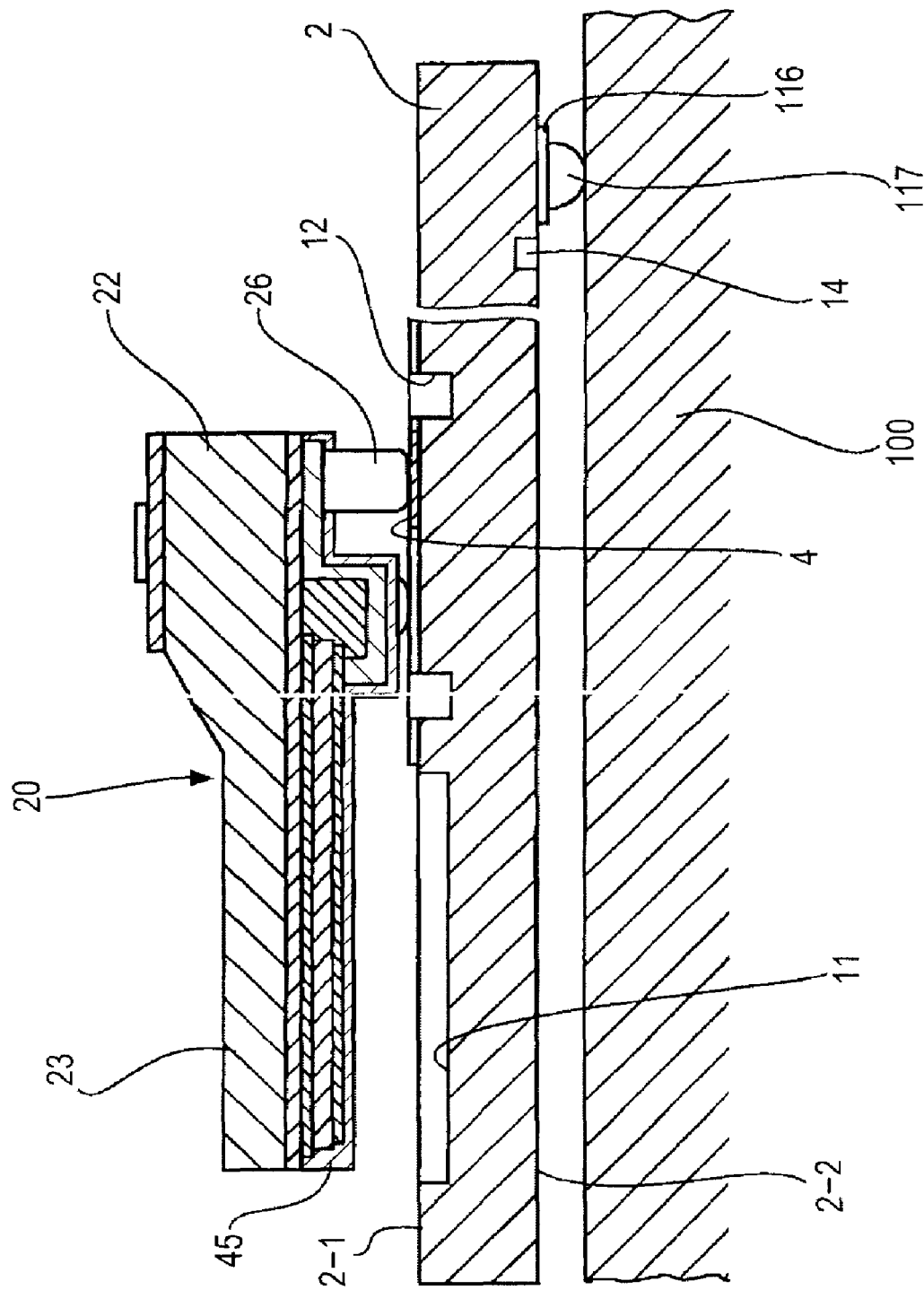
FIG. 3 is a sectional view of a principal portion of the vibrating element of the vibrating gyrosensor shown in FIG. 2 in a state in which the vibrating gyrosensor is mounted on a control substrate.

As shown in FIGS. 1 to 3, first load buffering grooves 12A and 12B (hereinafter generically referred to as "first load buffering grooves 12" unless otherwise specified) are formed at the corners 2C-1 and 2C-2, respectively, of the first main surface 2-1. The vibrating element mounting regions 13A and 13B (hereinafter generically referred to as the "vibrating element mounting regions 13" unless otherwise specified) are formed in regions surrounded by the respective first load burring grooves 12, and the vibrating elements 20 are mounted on the respective vibrating element mounting regions 13.

Figure 5:
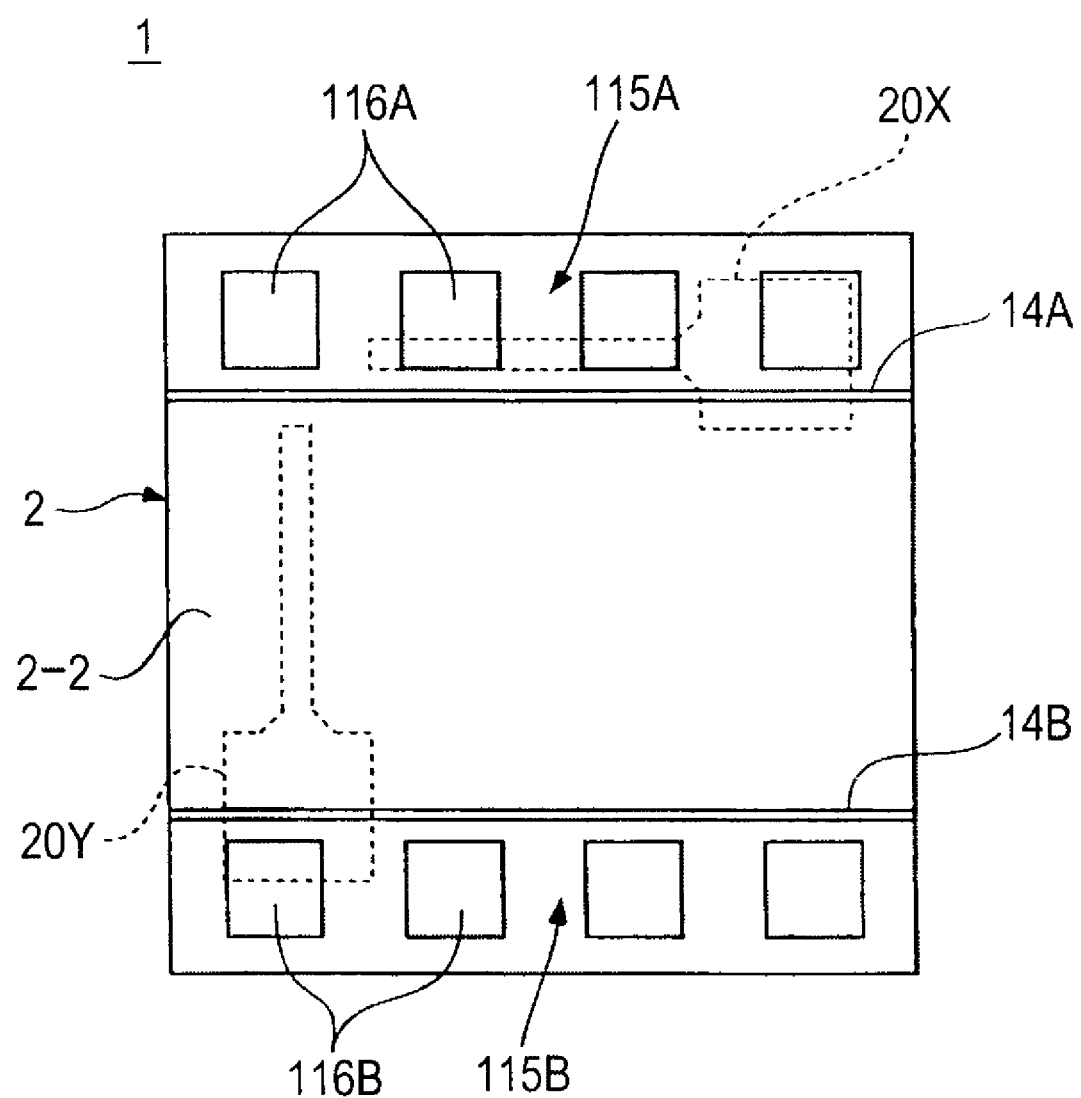
FIG. 5 is a bottom view of the vibrating gyrosensor.

As shown in FIG. 3, in the support substrate 2, second load buffering grooves 14 are formed in a second main surface 2-2 to be mounted on an external control substrate 100 of the main body device or the like. As shown in FIG. 5, the second load buffering grooves 14 include second load buffering grooves 14A and 14B (generically referred to as "buffering grooves 14" hereinafter unless otherwise specified). As shown in FIG. 5, regions surrounded by the second load buffering grooves 14 serve as terminal formation regions 115A and 115B (hereinafter generically referred to as the "terminal formation regions 115" unless otherwise specified).

Figure 4:
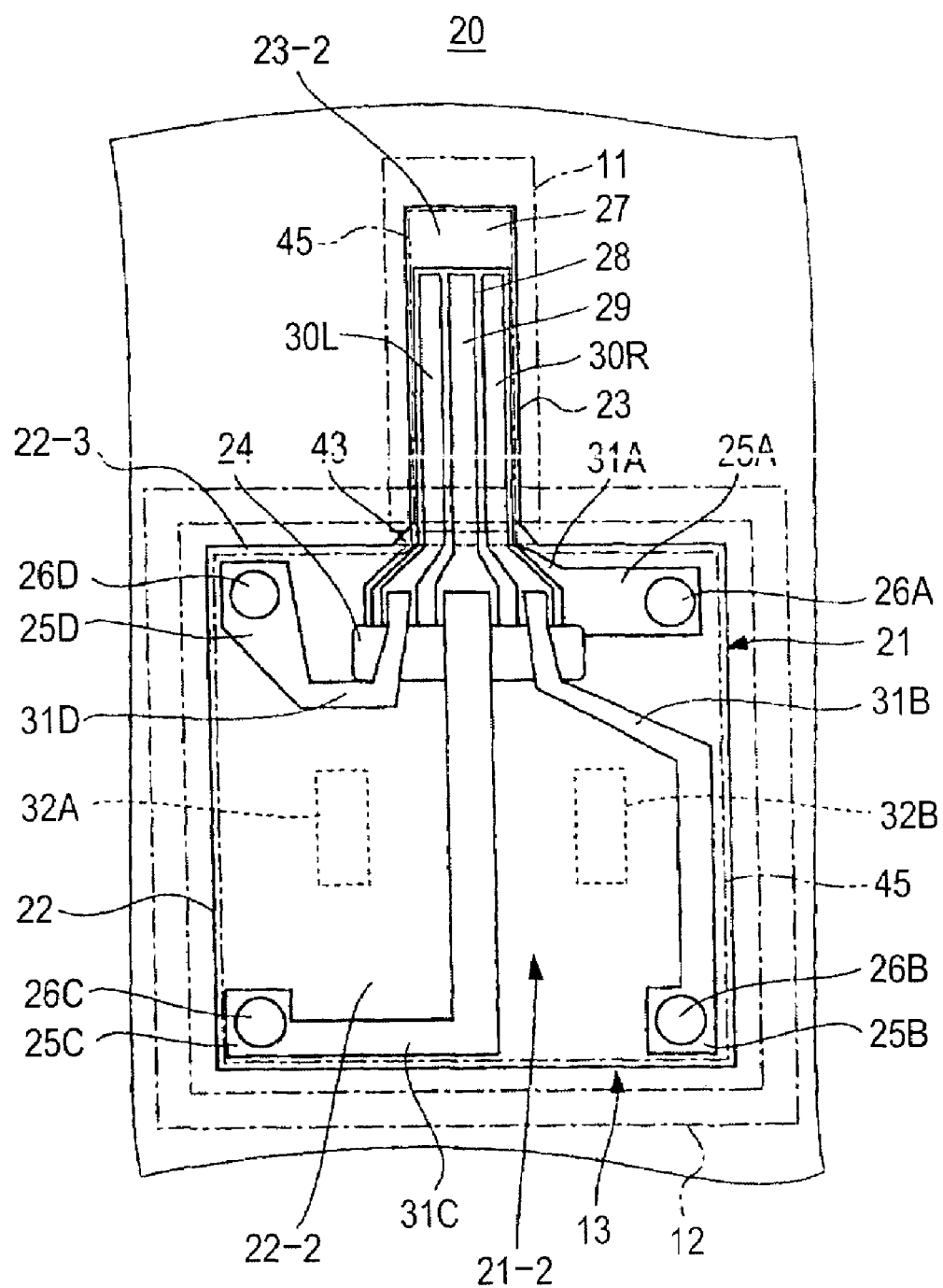
FIG. 4 is a bottom view of the vibrating element.

As shown in FIG. 4, each of the first load buffering grooves 12 is formed in a frame-like groove having a bottom, for forming the vibrating element mounting region 13 larger than the outer shape of the base part 22 of each vibrating element 20. The first load buffering grooves 12 are formed by, for example, mechanical grooving with a dicer, chemical grooving by wet etching, or dry etching with a laser. Each of the first load buffering grooves 12 is formed to a depth of 100 μm or more within a range in which the mechanical strength of the support substrate 2 is not impaired.

As shown in FIG. 5, the second load buffering grooves 14A and 14B are formed in parallel along the outer peripheral line of the support substrate 2. The regions between the outer peripheral line and the respective second load buffering grooves 14A and 14B serve as the terminal formation regions 115A and 115B, respectively, in each of which a plurality of mounting terminal parts 116A or 116B (hereinafter generically referred to as the "mounting terminal parts 116" unless otherwise specified) is appropriately arranged. The support substrate 2 is mounted on the control substrate 100 by connecting the mounting terminal parts (external connection terminals) 116 the respective lands on the control substrate 100 through bumps 117 provided on the respective mounting terminal parts 116.

Like the first load buffering grooves 12, each of the second load buffering grooves 14 is formed to a predetermined depth in the second main surface 2-2 of the support substrate 2 by mechanical grooving with a dicer, chemical grooving by wet etching, or dry etching with a laser or the like. The second load buffering grooves 14 form the floating island-like terminal formation regions 115 on the second main surface 2-2 of the support substrate 2, and a plurality of the mounting terminal parts 116 is arranged in each of the terminal formation regions 115 along the outer edge of the support substrate 2. The second load buffering grooves 14 are not limited to linear grooves along the outer edge, and the second load buffering grooves 14 may be formed in, for example, a frame shape surrounding each mounting terminal part 116 or a substantially U-shaped form with both ends being open to the outer edge.

In the support substrate 2, many via holes are formed to pass through the first and second main surfaces 2-1 and 2-2 so that the wiring pattern 5 on the first main surface 2-1 is appropriately connected to the mounting terminal parts 116 on the second main surface 2-2 through the via holes.

When an impact is applied to the main body device, strain or stress occurs in the support substrate 2 of the vibrating gyrosensor 1 through the control substrate 100. In this embodiment, as described above, each of the vibrating elements 20 is mounted on the floating island-like vibrating element mounting region 13 surrounded by the first load buffering groove 12. Consequently, the strain or stress occurring by an external load is absorbed by the first load buffering groove 12. Therefore, each of the first load buffering grooves 12 functions as a dumper for decreasing the influence of an external load on the vibrating element 20 mounted on the vibrating element mounting region 13, thereby permitting the vibrating element 20 to stably detect a motion.

On the other hand, in the vibrating gyrosensor 1, as described above, the second load buffering grooves 14 are provided so that the mounting terminal parts 116 provided on each of the floating island-like terminal formation regions 115 serve as portions fixed to the control substrate 100. In this embodiment, an external load transmitted through the control substrate 100 is absorbed by the second load buffering grooves 14. Therefore, each of the second load buffering grooves 14 functions as a dumper for decreasing the influence of an external load on the vibrating element 20 mounted on the vibrating element mounting region 13, thereby permitting the vibrating element 20 to stably detect a motion.

Each of the first load buffering grooves 12 is continuously formed along the entire periphery and has a U-shaped sectional shape, but not limited thereto. Each of the first load buffering grooves 12 may be formed by, for example, arranging many grooves to form a frame shape as a whole on condition that a predetermined characteristic is satisfied. Also, each of the second load buffering grooves 14 is not limited to a continuous groove, and each of the second load buffering grooves 14 may be formed by, for example, arranging many grooves. Furthermore, although the first load buffering grooves 12 and the second load buffering grooves 14 are formed in the first main surface 2-1 and the second main surface 2-2, respectively, of the support substrate 2, to form a load buffering structure including the front and back surfaces, only the first load buffering grooves 12 or the second load buffering grooves 14 may be provided to form a load buffering structure.

(Space Forming Recess)

In the support substrate 2, recesses 11A and 11B (hereinafter generically referred to as "space forming recesses 11" unless otherwise specified) are formed in the respective component mounting regions 6 corresponding to the vibrating elements 20X and 20Y, for forming spaces in which the respective vibrators 23 are freely vibrated in the thickness direction. Each of the space forming recesses 11 is formed into a rectangular groove with a bottom having a predetermined depth and an aperture dimension by, for example, etching or grooving the first main surface 2-1 of the support substrate 2.

In the vibrating gyrosensor 1, the vibrating elements 20 each including the base part 22 and the cantilever vibrator part 23, which are integrally formed, are mounted on the first main surface 2-1 of the support substrate 2 through the gold bumps 26. The space between the vibrator part of each of the vibrating elements 20 and the first main surface 2-1 of the support substrate 2 is determined by the thickness of the gold bumps 26, for decreasing the thickness of the whole structure. However, a sufficient space may not be maintained due to the processing limitation of the gold bumps 26.

Each vibrating element 20 produces an air flow between the first main surface 2-1 of the support substrate 2 and the vibrating element 20 with a vibration operation of the vibrator part 23. The air flow collides with the first main surface 2-1 of the support substrate 2 to cause the damping effect of pushing upward each vibrator part 23. In this embodiment, the space forming recesses 11 are formed in the first main surface 2-1 of the support substrate 2, and thus a sufficient space is maintained between the first main surface 2-1 and each vibrator part 23, as shown in FIG. 2, thereby decreasing the damping effect on the vibrating elements 20.

In the vibrating gyrosensor 1, the vibrating elements 20 are mounted on the first main surface 2-1 of the support substrate 2 so that the vibrator parts 23 extend opposite to the respective space forming recesses 11, and thus a sufficient space is maintained between each of the vibrator parts 23 and the support substrate 2 while maintaining the small thickness of the vibrating gyrosensor 1, as shown in FIG. 2. As a result, when the vibrator parts 23 vibrate in the thickness direction, the damping effect is decreased, thereby securing a stable detection operation of each vibrating element 20.

The space forming recesses 11 are optimized according to the dimensions of the vibrator parts 23 of the vibrating elements 20 and formed in the support substrate 2. In this embodiment, when each of the vibrating elements 20 is formed with dimension values, which will be described below, the aperture dimension of each of the space forming recesses 11 is 2.1 mm×0.32 mm and the depth dimension k (refer to FIG. 2) is k≧p/2+0.05 mm wherein p is the maximum amplitude of the vibrator parts 23. When the space forming recesses 11 having this structure are formed in the support substrate 2, the height dimension is suppressed to permit thinning, and the influence of the damping effect on the vibrating elements 20 is decreased to maintain a high Q factor and permit stable direction of a motion such as motion blurring or the like with high sensitivity.

Next, the structure of the vibrating elements 20 will be described in detail.

(Glad Bump)

Each of the vibrating elements 20 is mounted on the vibrating element mount region 13 so that the second main surface (22-2) of the base part 22, which includes the second main surface 21-2 of the silicon substrate 21 as described below, forms a fixed surface (mounting surface) to the support substrate 2. As shown in FIG. 4, first to fourth terminal parts 25A to 25D (hereinafter generically referred to as "terminal parts 25" unless otherwise specified) are formed on the mounting surface 22-2 of the base part 22, and first to fourth gold bumps 26A to 26D (hereinafter generically referred to as "gold bumps 26" unless otherwise specified) are formed as metal protrusions on the terminal parts 25, respectively.

The terminal parts 25 of each vibrating element 20 are formed corresponding to the respective lands 4 formed in the wiring pattern 5 on the support substrate 2. Therefore, each of the terminal parts 25 is aligned with the corresponding land 4 and combined with the support substrate 2. In this state, the vibrating elements 20 are pressed against the support substrate 2 under application of ultrasonic waves to weld the terminal parts 25 to the respective lands 4 through the gold bumps 26. As a result, the vibrating elements 20 are mounted on the support substrate 2. In this way, when the vibrating elements 20 are mounted with the gold bumps 26 having a predetermined height, each of the vibrator parts 23 performs a predetermined vibration motion while the second main surface (substrate-facing surface) 23-2 being maintained at a predetermined height from the first main surface 2-1 of the support substrate 2.

In this embodiment, the efficiency of the mounting step is improved by surface-mounting the vibrating elements 20 on the support substrate 2. The connectors used in the surface-mounting process is not limited to the above-descried gold bumps 26, and various other metal protrusions generally used in semiconductor processes, such as solder balls, copper bumps, or the like, may be used. In this embodiment, a process for manufacturing the main body device includes reflow soldering for connecting and fixing the mounting terminal parts 116 of the support substrate 2 to the respective lands of the control substrate 100 through bumps 117, and thus the gold bumps 26 having high heat resistance and high workability are used as the connectors.

In a vibrating gyrosensor, mechanical quality factor (Q factor) is determined by a structure for fixing a vibrating element to a support substrate. In this embodiment, the vibrating elements 20 are mounted on the support substrate 2 through the bumps 26 so that the base part 22 floats on the first main surface 2-1 of the support substrate 2. Therefore, the damping rate at the end of each vibrator part 23 is increased to achieve a satisfactory Q factor, as compared with a case in which a base part is entirely bonded to a support substrate, for example, through an adhesive layer. In addition, when the base part 22 is fixed at a plurality of positions of the first main surface 2-1 of the support substrate 2, a satisfactory Q factor is obtained as compared with a structure in which the base 22 is fixed at one position. Therefore, the base part 22 is fixed at the four corners on the support substrate 2, thereby achieving a satisfactory Q factor.

Each of the gold bumps 26 may be provided in such a manner that the center of gravity of the entity is positioned in the range of the width dimension t6 (refer to FIG. 7) with respect to the longitudinal center axis of each vibrator part 23. By disposing the gold bumps 26 in this manner, each vibrator part 23 may stably vibrate in the thickness direction without breaking a transverse balance.

Furthermore, each of the gold bumps 26 is formed outside a region having a radius of 2 times the width dimension t6 of the vibrator parts 23 from the base end (root part 43) (refer to FIG. 35) of each vibrator part 23 projected from the base part 22. Therefore, the operation of absorbing the vibration of the vibrator part 23 by the gold bumps 26 is decreased to maintain the high Q factor.

In addition, at least one gold bump 26 is formed within a region of 2 times the thickness dimension t1 (refer to FIG. 7) of the base part 22 from the base end of each vibrator part 23. Therefore, the vibration of each vibrator part 23 is transmitted to the base part 22, thereby preventing the occurrence of a shift of the resonance frequency.

Furthermore, each of the gold bumps 26 may include a two-stage bump, and a fifth gold bump may be formed as a dummy not involved in electric connection on the second main surface of each of the base parts 22. In this case, of course, dummy terminal parts to which the respective fifth gold bumps are welded are formed on the support substrate 2.

(Element Formation)

Figure 7:
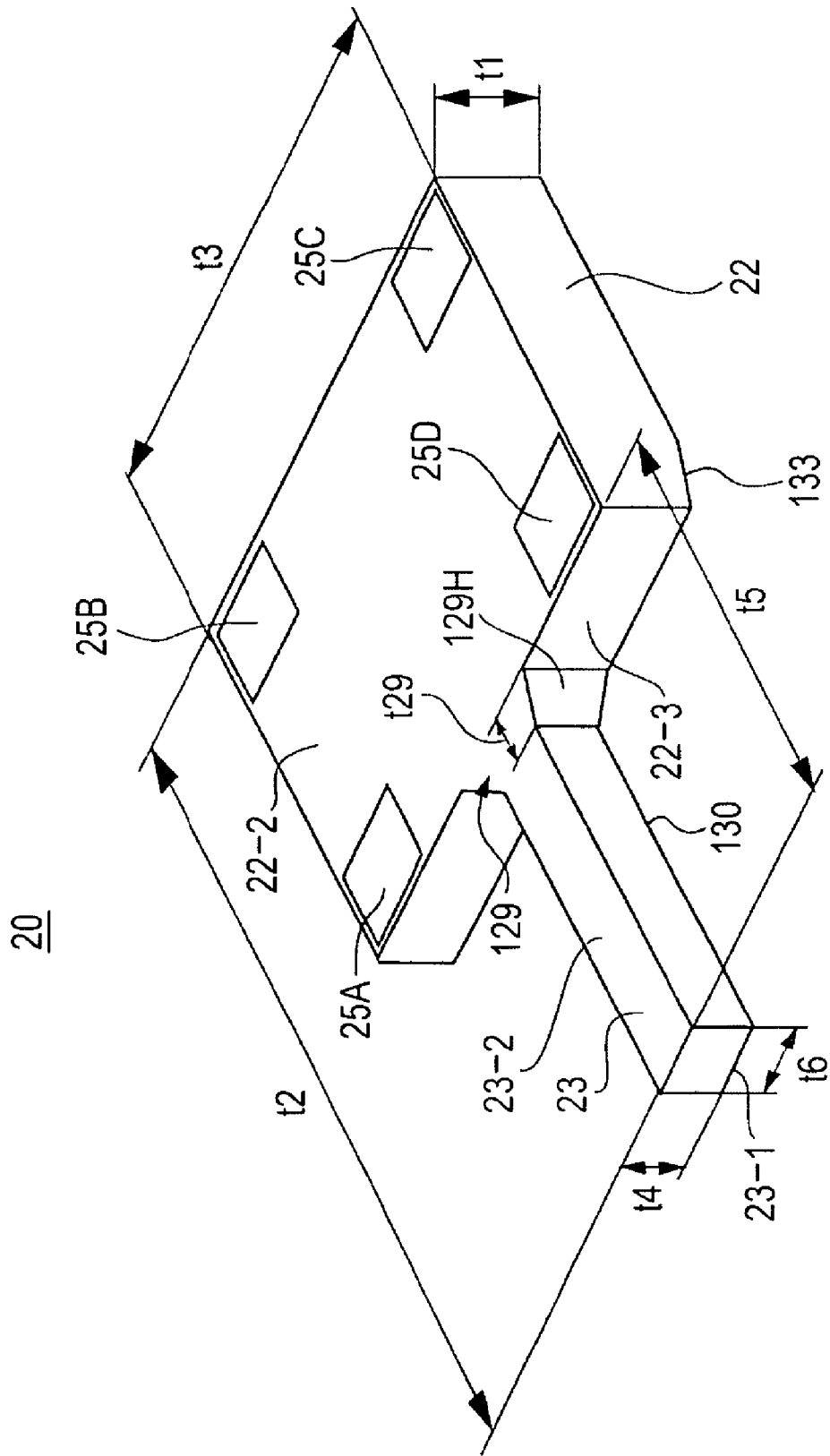
FIG. 7 is a perspective view of the whole of the vibrating element, as viewed from the bottom.
Figure 8:
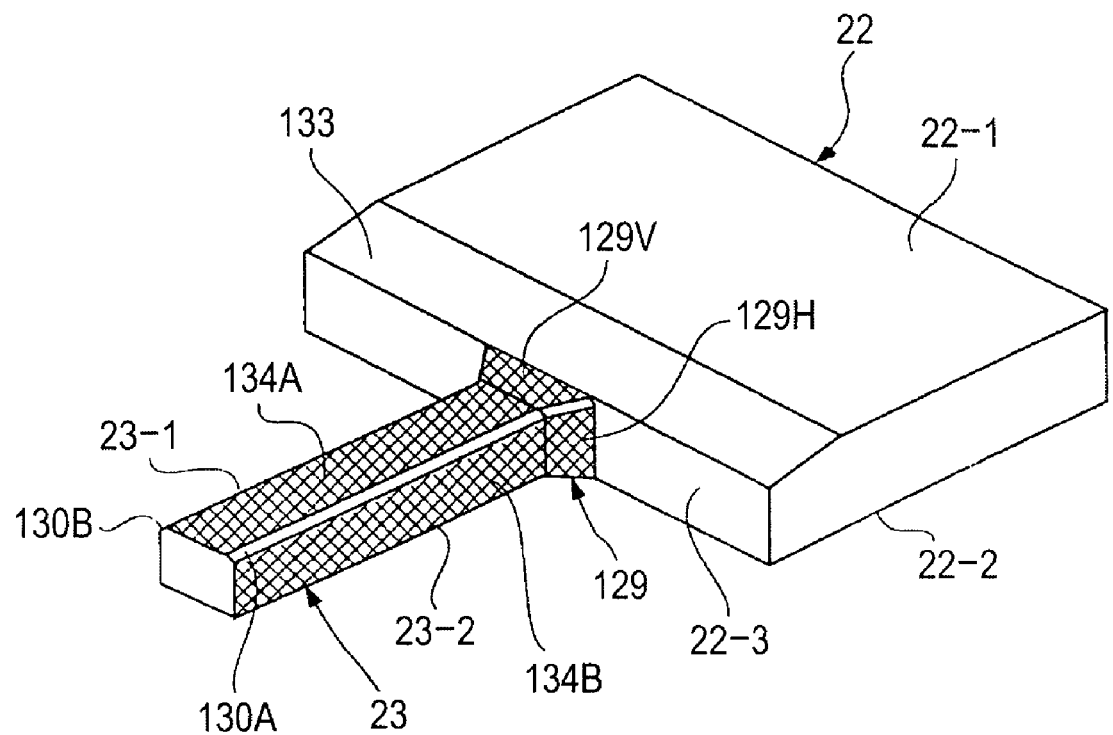
FIG. 8 is a perspective view of the whole of the vibrating element, as viewed from the top.

As shown in FIG. 7, in each of the vibrating elements 20 according to this embodiment, the vibrator part 23 has the second main surface (substrate-facing surface) 23-2 coplanar with the second main surface (mounting surface) 22-2 of the base part 2 and is projected in a cantilever manner in which one end is integrated with the base part 22. As shown in FIG. 8, the vibrator part 23 has an upper surface 23-1 stepwisely lowered from the first main surface (upper surface) 22-1 of the base part 22 so as to have a predetermined thickness. The vibrator part 23 has predetermined length and sectional area and includes a cantilever formed integrally with one side 22-3 of the base part 22 and having a rectangular cross-section.

Also, as shown in FIGS. 7 and 8, a reinforcing part 129, which will be described in detail below, is formed integrally with the base end projected from the side 22-3 of each of the base parts 22. In each of the vibrator parts 23, chamfered parts 130 are formed at all edges of the first main surface (upper surface) 23-1 and at the edges of the reinforcing part 129.

As shown in FIG. 7, the base part 22 of each vibrating element 20 has a thickness t1 of 300 μm, a length dimension t2 of 3 mm to the tip of the vibrator part 23, and a width dimension t3 of 1 mm. The vibrator part 23 of each vibrating element 20 has a thickness dimension t4 of 100 μm, a length dimension t5 of 2.5 mm, and a width dimension t6 of 100 μm. Each of the vibrator parts 23 includes the reinforcing part 129 formed in a region of the length dimension t29 of 50 μm from the side 22-3 of the base part 22. As described in detail below, each of the vibrating elements 20 vibrates with a driving voltage at a predetermined frequency applied form a driving detector circuit part 50, but vibrates at a resonance frequency of 40 kHz due to the above-descried shape. The structure of each vibrating element 20 is not limited to the above-described structure, and the structure may be variously determined according to the frequency used and the intended whole shape.

Furthermore, each of the vibrating elements 20 may be formed so as to satisfy the conditions below for each of the base parts 22 and the vibrator part 23. Namely, each base part 22 is formed with a width dimension t3 which is 2 times or more the width dimension t6 of the vibrator part 23, and the center of gravity is positioned within a region of 2 times the width dimension t6 of the vibrator part 23 with respect to the longitudinal center axis of the vibrator part 23. In this structure, each vibrator part 23 satisfactorily vibrates without breaking a transverse balance. In addition, when the thickness dimension t1 of each base part 22 is 1.5 times the thickness dimension of the vibrator part 23, the mechanical strength of the base part 22 is maintained to prevent the base part 22 from vibrating due to the vibration of the vibrator part 23, thereby preventing the occurrence of a shift of the resonance frequency.

(Reinforcing Part)

In each of the vibrating elements according to this embodiment, the reinforcing part 129 is formed on the vibrator part 23 to improve the mechanical strength at the base end or in the vicinity thereof. Consequently, even when a large external load is applied, the occurrence of breakage of the vibrator parts 23 is suppressed. As shown in FIG. 8, the reinforcing part 129 is formed so as to have the maximum sectional dimensions at the side 22-3 of the base part 22 from which the vibrator part 23 is projected, and have a sectional shape in which the thickness and width gradually decrease within the above-described region of the length dimension t29.

In the region of the length dimension t29 of the base end of each vibrator part 23, the reinforcing part 129 includes a vertical reinforcing part 129V in which the thickness dimension gradually increases toward the base part 22, and a horizontal reinforcing part 129H in which the width dimension gradually increases toward the side 22-3 of the base part 22. The upper limit of the length dimension t29 of the base end of each vibrator part 23 in which the reinforcing part 129 is formed is 60 μm from the side 22-3 of the base part 22 in the length direction of the vibrator part 23, as described below.

As described below, in each of the vibrating elements 20, an etched recess 37 constituting a diaphragm part 38 is formed by etching the silicon substrate 21 (FIG. 19), and then the diaphragm part 38 is cut into a predetermined shape, thereby forming the outer shape of the vibrator part 23. The reinforcing part 129 is formed by cutting the outer shape of the base part 22 at an intermediate position of the etched inclined surface 133 of the etched recess 37 formed by etching as described below.

Namely, each of the vibrating elements 20 is produced by a vibrating element production process, which will be described in detail below, using the silicon substrate 21 cut out so that a main surface is a (100) orientation plane, and a side is a (110) orientation plane and thus having the characteristic that the etching rate of the side surface is lower than that of the main surfaces. In the vibrating element production process, the silicon substrate 21 is etched from the first main surface 21-1 to form the etched recesses 37 each constituting the diaphragm part 38 which has a thickness corresponding to the thickness of the vibrator part 23, the thickness being the total thickness of the bottom of the etched recess 37 and the second main surface 21-2. According to the above-described characteristic, etching rate in the transverse direction is lower than that in the thickness direction, and thus the etched recesses 37 are formed so that the aperture dimension of each etched recess 37 gradually decreases toward the bottom from the first main surface 21-1. Each of the etched recesses 37 has the etched inclined surface 133 at an inclination angle of 55° which is formed on the inner wall from the first main surface 21-1 to the bottom.

Each of the vibrating elements 20 is formed by grooving the diaphragm part 38 in the etched recess 37 formed in the silicon substrate 21 to form a groove for cutting out the outer shape of the vibrator part 23, and then cutting out the base part 22 in the cutting step. Namely, each of the vibrating elements 20 is formed by cutting out the outer shape of the vibrator part 23 starting from an intermediate position of the etched inclined surface 133, and then cutting out the outer shape of the base part 22 so that the thickness of the base end of the vibrator part 23 gradually increases at 55° toward the side 22-3. As a result, as shown in FIG. 8, the above-described reinforcing part 129 is formed at the base end.

Since each of the vibrating elements 20 has the reinforcing part 129 formed at the base end of the vibrator part 23, the mechanical strength is improved. Therefore, even when the main body device on which the vibrating gyrosensor 1 according to this embodiment is mounted is mistakenly dropped to receive a great impact or the like, the occurrence of breakage, cracking, or the like in the vibrator parts 23 is prevented.

In each of the vibrating elements 20, the reinforcing part 129 is formed at the base end of the small vibrator part 23 skillfully using an etching technique for the silicon substrate during the vibrating element production process which will be described below. Therefore, the reinforcing parts 129 are easily formed without machining such as precise polishing or the like.

(Chamfered Part and Melted Part)

Figure 9A:
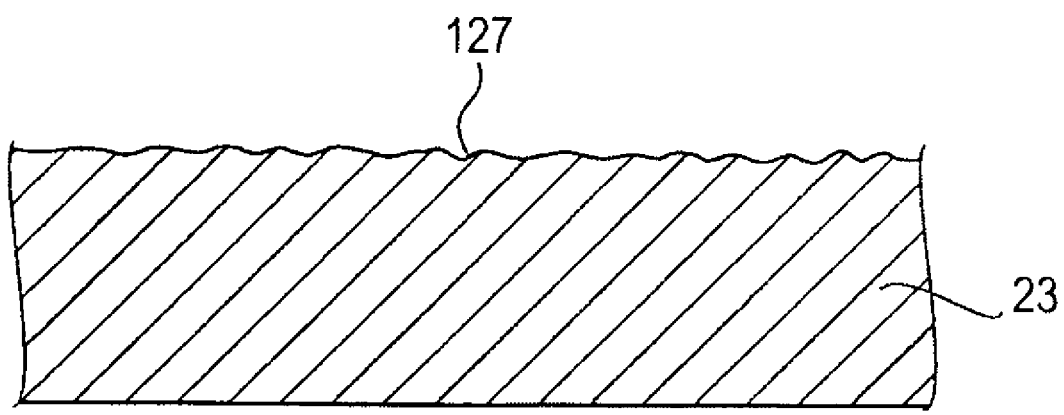
FIGS. 9A and 9B are drawings illustrating respective steps for forming chamfered parts and melted surfaces on a vibrator part of the vibrating element.

On the other hand, the silicon substrate 21 has a surface having micro irregularities, micro cracks, and the like. Also, the silicon substrate 21 is subjected to outer shape grooving of the diaphragm part 38 from the second main surface 21-2 by reactive ion etching, for cutting out the outer shape of each of the vibrator parts 23. In this processing, micro linear irregularities occur due to plasma flows at the edges between the sides of the vibrator parts 23 and the first main surface 23-1. These micro irregularities and cracks are generically generically referred to as "micro irregularities 127", as shown in FIG. 9A. In FIG. 9A, the irregularities 127 are slightly exaggerated.

For example, when a high impact or the like is applied to the vibrating elements 20 during a vibration motion, stress is concentrated in the micro irregularities 127 present at the surfaces and edges, and thus not only the base end but also an intermediate portion of each vibrator part 23 may be cracked or damaged. Therefore, according to this embodiment, the edges and the first main surface or the side surfaces of the vibrator parts 23 are irradiated with laser to melt the surfaces of the silicon substrate 21 and form the chamfered parts 130 and the melted surfaces 134A and 134B (hereinafter generically referred to as "melted surfaces 134"), thereby removing the micro irregularities 127.

In each of the vibrating elements 20, in order to decrease a frequency difference between the longitudinal and transverse resonance frequencies due to variation in the shape of the vibrator part 23 and meet the amplitudes and phases of the waveforms of right and left detection signals during resonance to each other, as described below, adjustment processing is performed for correcting a vibration state by processing a predetermined portion of the vibrator part 23 with laser. The above-described chamfered parts 130 and the melted surfaces 134 are formed using the same laser device before the laser processing for the adjustment processing. By using the same laser device, the chamfered parts 130 and the melted surfaces 134 are easily formed without machining such as precise polishing or the like.

The chamfered parts 130 are formed by irradiating the edges of each vibrator part 23 with a laser at a wavelength of, for example, 532 nm, and melting the irradiated portions, the laser being emitted from the laser device and controlled to an appropriate spot diameter. Similarly, the melted surfaces 134 are formed by irradiating the first main surface 23-1 and the sides of each vibrator part 23 with laser and melting the surfaces, as shown by a shaded region in FIG. 8, the laser being controlled to an appropriate spot diameter.

Figure 9B:
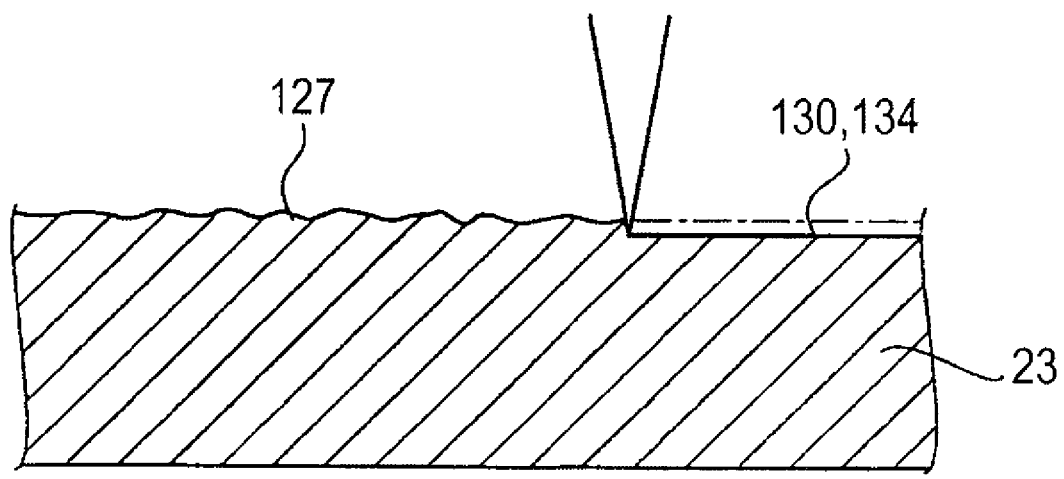

The chamfered parts 130 and the melted surfaces 134 are formed as smooth surfaces by melting the surfaces of the silicon substrate 21 so that the micro irregularities 127 present on the surfaces are removed as shown in FIG. 9B. Therefore, even when a large external load is applied to the vibrating elements 20, concentration of stress in the irregularities 127 is suppressed, thereby improving the mechanical strength of the vibrator parts 23. It may be unnecessary that each of the vibrating elements 20 includes all the above-described chamfered parts 130 and the melted surfaces 134.

(Piezoelectric Film and Various Electrode Layers)

In each of the vibrating elements 20, as shown in FIG. 4, a reference electrode layer (first electrode layer) 27, a piezoelectric thin film layer 28, and a driving electrode layer (second electrode layer 28) are laminated on the second main surface (substrate-facing substrate) 23-2 of the vibrator part 23 over the entire length in the length direction in the process for producing the vibrating elements, which will be described below. Also, a pair of detection electrodes 30R and 30L (hereinafter generically referred to as "detection electrodes 30" unless otherwise specified) is formed with the driving electrode layer 29 therebetween on the second main surface (substrate-facing surface) 23-2 of each vibrator part 23. The driving electrode layer 29 and the detection electrodes 30 constitute the second electrode layer.

The reference electrode layer 27 serving as the first layer is formed on the second main surface (substrate-facing surface) 23-2 of each vibrator part 23, and the piezoelectric thin film layer 28 having substantially the same length as that of the reference electrode layer 27 is formed thereon. The driving electrode layer 29 having substantially the same length as that of the piezoelectric thin film layer 28 and a smaller width than that thereof is formed at the central portion of the piezoelectric thin film layer 28 in the width direction. Furthermore, the pair of the detection electrodes 30R and 30L is laminated on the piezoelectric thin film layer 28 to hold the driving electrode layer 29 therebetween.

(Lead and Terminal Part)

As shown in FIG. 4, in each of the vibrating elements 20, a first lead 31A is formed on the second main surface (mounting surface) 22-2 of the base part 22, for connecting the reference electrode layer 27 to the first terminal part 25A, and a third lead 31C is formed for connecting the driving electrode layer 29 to the third terminal part 25C. Similarly, on the mounting surface 22-2 of the base part 22, a second lead 31B is formed for connecting the first detection electrode 30R to the second terminal part 25B, and a fourth lead 31D is formed for connecting the second detection electrode 30L to the fourth terminal part 25D. Hereinafter, the leads 31A to 31D are generically referred to as "leads 31" unless otherwise specified.

The first lead 31A is integrally extended from the base end of the reference electrode layer 27 formed on each vibrator part 23 to the base part 22 and connected to the first terminal part 25A formed at a corner of the second main surface (mounting surface) 22-2 of the base part 22 on the side to which the vibrator part 23 is integrally formed. The driving electrode layer 29 and the detection electrodes 30 each have a slightly wide base end extending from the vibrator part 23 to the base part 22, the slightly wide base ends being covered with a planarizing layer 24.

The second lead 31B is formed so that an end thereof crosses over the planarizing layer 24 and is extended to the rear corner opposite to the first terminal part 25A along one side of the base part 22 and is connected to the second terminal part 25B formed at this corner. The third lead 31C is formed so that an end crosses over the planarizing layer 24 and is extended rearward through a substantially central portion of the base part 22 and also extended to a corner opposite to the second terminal part 25B along the rear side end and is connected to the third terminal part 25C formed at this corner. The fourth lead 31D is also formed so that an end crosses over the planarizing layer 24, and is extended to the other corner opposite to the third terminal part 25C on the front side along the other side of the base part 22 and is connected to the fourth terminal part 25D formed at this corner.

In each of the vibrating elements, the terminal parts 25 are formed at proper optimum positions with a proper number on the second main surface (mounting surface) 22-2 of the base part 22 regardless of the above-descried structure. Also, in each of the vibrating elements 20, of course, the connection pattern between the leads of the electrode layers and the respective terminal parts 25 is not limited to the above, and the connection pattern is formed on the second surface of each base part 22 according to the positions and number of the terminal parts 25.

(Insulating Protective Layer)

In each of the vibrating elements 20, as shown in FIGS. 2 and 4, an insulating protective layer 45 is formed on the second main surface 21-2 to cover the base part 22 and the vibrator part 23. The insulating protective layer 45 has a three-layer structure including a first alumina (aluminum oxide: $Al_2O_3$) layer 46 as a first layer, a silicon oxide ($SiO_2$) layer 47 as a second layer, and a second alumina layer 48 as a third layer.

As shown in FIG. 2, the insulating protective layer 45 has a terminal aperture 49 corresponding to the formation region of each of the terminal parts 25 formed on the second main surface (mounting surface) 22-2 of the base part 22 so that each terminal part 25 is exposed to the outside through the terminal aperture 49. In each of the vibrating elements 20, as shown in FIG. 2, the gold bump 26 is formed on each terminal part 25 so as to project from the terminal aperture 49.

The insulating protective layer 45 is formed so as to expose in a frame form the second main surface 21-2 of the silicon substrate 21 between the outer peripheries of each base part 22 and each vibrator part 23 and the outer peripheries of the reference electrode layer 27 and the terminal parts 25. The insulating protective layer 45 is formed leaving the exposed portion of the second main surface 21-2 in the peripheral region, thereby preventing peeling of the insulating protective layer 45 from the peripheral region during the step of cutting out each vibrating element 20, which will be described below. The insulating protective layer 45 is formed with a width dimension of, for example, 98 μm, in each vibrator part 23 having a width dimension t6 of 100 μm.

The insulating protective layer 45 includes the first alumina layer 46 having a thickness dimension of, for example, 50 nm. The first alumina layer 46 functions as an under adhesive layer for improving the adhesion to the main surfaces of the base part 22 and the vibrator part 23. Therefore, the insulating protective layer 45 is strongly deposited on each vibrator part 23 performing vibration to prevent the occurrence of peeling or the like.

The silicon oxide layer 47 functions to cut off moisture and the like in air and prevent the adhesion thereof to each electrode layer, and also functions to suppress oxidation of each electrode layer, electrically insulate each electrode, or mechanically protect each electrode thin film layer and the piezoelectric thin film layer 28. The uppermost second alumina layer 48 functions to improve the adhesion to a resist layer formed for forming each vibrator part 23 on the silicon substrate 21 by the outer shape grooving step which will be described below, and prevent damage to the silicon oxide layer 47 with an etching agent.

The silicon oxide layer 47 is formed to a thickness of at least two times the thickness of the second electrode layer 42 and 1 μm or less. Also, the silicon oxide layer 47 is deposited on the first alumina layer by sputtering in an argon gas atmosphere at 0.4 Pa or less. Since the silicon oxide layer 47 has the above-described thickness, the insulating protective layer 45 exhibits a sufficient insulating protective function and prevents the occurrence of burr during deposition. The silicon oxide layer 47 is formed with a high film density by deposition under the above-described sputtering conditions.

(Alignment Mark)

In the vibrating gyrosensor 1, in order to precisely position and mount the first and second vibrating elements 20X and 20Y having the same shape on the support substrate 2, the position of each land 4 on the support substrate 2 is recognized with a mounting machine. Therefore, alignment marks 32A and 32B (hereinafter generically referred to as "alignment marks 32") are provided on the first main surface (upper surface) 22-1 of the base part 22 of each vibrating element 20, in order to position and mount each vibrating element 20 on the corresponding land 4 recognized by the mounting machine.

As shown in FIGS. 1 and 4, the alignment marks 32 include a pair of rectangular portions of a metal foil or the like formed with a space therebetween in the width direction on the first main surface (upper surface) 22-1 of each base part 22. After the alignment marks 32 are read by the mounting machine to produce mounting data about the position and attitude for the support substrate 2, each vibrating element 20 may be precisely positioned and mounted on the support substrate 2 on the basis of the mounting data and the data of the lands 4.

Although the alignment marks 32 are formed on the first main surface of the base part 22 of each vibrating element 20, the alignment marks are not limited to this. The alignment marks 32 composed of, for example, a conductor, may be formed at proper positions avoiding the terminal parts 25 and the leads 31 on the second main surface (mounting surface) 22-2 of each base part 22 by, for example, a wiring step. As described in detail below, the alignment marks 32 are preferably positioned and formed in conformity with reference markers used for reactive etching using an inductively coupled plasma apparatus which is used in the outer shape grooving step for forming the electrode layers and the vibrator part 23 of each vibrating element 20. The alignment marks 32 may be formed with a precision of 0.1 μm or less on each vibrator part 23 using a stepper exposure device.

The alignment marks 32 are formed by an appropriate method. For example, when the alignment marks 32 are formed on the second main surface (mounting surface) 22-2 of each base part 22 by patterning the first electrode layer 40 including a titanium layer and a platinum layer as described below, the marks are read in the mounting step to obtain a high contrast in image processing, thereby improving the mounting precision.

(Cover)

Next, the cover 15 for shielding the first main surface 2-1 of the support substrate 2 will be described in detail.

In the vibrating gyrosensor 1, displacement of each vibrating element 20 due to the Coriolis force produced by motion blurring is detected by the piezoelectric thin film layer 28 and the detection electrodes 30 formed on the vibrating element 20 to output a detection signal, as described in detail below. When light is applied to the piezoelectric thin film layer 28, a voltage occurs due to a pyroelectric effect, and the pyroelectric voltage affects a detection operation to decrease the detection properties.

In the vibrating gyrosensor 1, a component mounting space 3 formed by the support substrate 2 and the cover member 15 is shielded from light, and thereby a decrease in the characteristics due to the influence of external light is prevented. As shown in FIG. 1, a light-shielding step 9 including a vertical wall is formed to flange the component mounting region 6 so that the outer periphery thereof is stepped down from the first main surface 2-1 along the whole periphery, and consequently a cover fixing part 10 is formed. The cover member 15 including a metal thin plate is bonded to the cover fixing part 10 of the support substrate 2 over the whole periphery using resin bonding, thereby making the component mounting region 6 dustproof and moisture proof by closing and forming a light-shielding space.

As shown in FIG. 1, the cover member 15 is formed in a box-like whole shape including a main surface part 16 having outer dimensions sufficient to cover the component mounting region 6 of the support substrate 2 and a peripheral wall part 17 integrally formed by bending the main surface part 16 along the entire periphery thereof. The cover member 15 is formed with a height dimension sufficient to form the component mounting space 3 in which the vibrator part 23 of each vibrating element 20 vibrates when the peripheral wall part 17 is combined with the support substrate 2. The cover member 15 has a peripheral flange 18 integrally formed by bending the peripheral wall part 17 along the entire opening edge thereof, the peripheral flange 18 being slightly narrower than the cover fixing part 10 formed in the support substrate 2. Although not shown in the drawings, the peripheral flange 18 has a ground projection to be connected to a ground terminal on the control substrate 100 when the vibrating gyrosensor 1 is mounted on the control substrate 100.

The cover member 15 includes a metal thin plate and thus maintains the light weight of the vibrating gyrosensor 1. However, the cover member 15 may not exhibit the sufficient light shielding function due to a decrease in the light shielding property for external light at the infrared wavelength. Therefore, according to this embodiment, all surfaces of the main surface part 16 and the peripheral wall part 17 are coated with, for example, an infrared absorbing paint, which absorbs light at the infrared wavelength, to form a light shielding layer 19, so that radiation of external light at the infrared wavelength into the component mounting space 3 is cut off to permit a stable operation of each vibrating element 20. The light shielding layer 19 may be formed on both the front and back main surfaces by dipping in an infrared absorbing paint solution, or may be formed by black chromium plating, black dyeing, or black anodization.

As described above, in the vibrating gyrosensor 1, the cover member 15 is combined with the support substrate 2 by placing the peripheral flange 18 on the cover fixing part 10 and bonding them together with an adhesive, thereby forming the closed, light-shielded component mounting space 3. However, external light may pass through the adhesive disposed in the space between the cover fixing part 10 and the peripheral flange 18 which are bonded together, and enter the component mounting space 3. In this embodiment, therefore, the cover fixing part 10 is stepped drawn from the main surface 1-2 of the support substrate 2 through the light shielding step 9, as described above. As a result, external light transmitted through the adhesive layer is cut off by the light shielding step 9.

In this embodiment, like other component members, the cover member 15 is combined with the support substrate 2 by the surface mounting method, and thus the assembly step is rationalized. In the vibrating gyrosensor 1, since the cover member 15 is fixed to the stepped cover fixing part 10 of the support substrate 2, the thickness is decreased, and adhesive flowing into the component mounting region 6 is prevented. Also, the component mounting space 3 functions as a dust-proof and moisture-proof space as well as a light-shielding space, thereby preventing the occurrence of a pyroelectric effect in each vibrating element 10 and permitting the stable detection of a motion such as motion blurring or the like.

(Circuit Configuration)

Next, a circuit configuration for driving the vibrating gyrosensor 1 will be described with reference to FIG. 6.

The vibrating gyrosensor 1 includes a first driving detector circuit part 50X and a second driving detector circuit part 50Y which are connected to the first vibrating element 20X and the second vibrating element 20Y, respectively, and which each include the IC circuit elements 7, the electronic components 8, and the like. The first and second driving detector circuit parts 50X and 50Y have the same circuit configuration and are thus generically referred to as "driving detector circuit parts 50" hereinafter. Each of the driving detector circuit parts 50 include an impedance coveter circuit 51, an adding circuit 52, an oscillator circuit 53, a differential amplifier circuit 54, a synchronous detector circuit 55, and a DC amplifier circuit 56.

Figure 6:
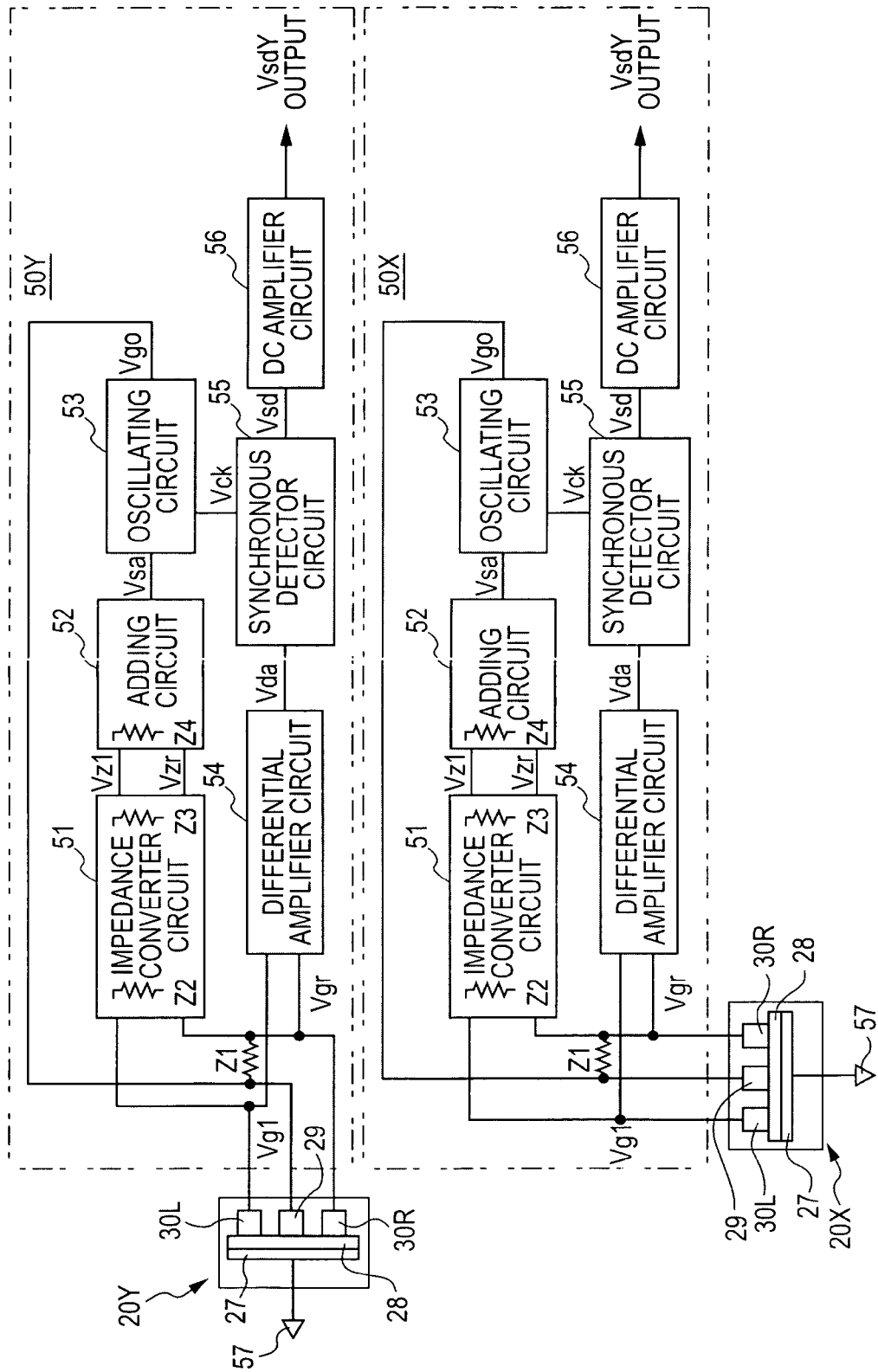
FIG. 6 is a block diagram of a circuit of the vibrating gyrosensor.

As shown in FIG. 6, in each of the driving detector circuit parts 50, the impedance converter circuit 51 and the differential amplifier circuit 54 are connected to each of the first and second detection electrodes 30L and 30R of each vibrating element 20. The adding circuit 52 is connected to the impedance converter circuit 51, and the oscillator circuit 53 connected to the adding circuit 52 is connected to the driving electrode layer 29. The synchronous detector circuit 55 is connected to the differential amplifier circuit 54 and the oscillator circuit 53, and the DC amplifier circuit 56 is connected to the synchronous detector circuit 55. Furthermore, the reference electrode layer 27 of each vibrating element 20 is connected to the reference potential 57 on the support substrate 2.

In each of the driving detector circuit parts 50, the vibrating element 20, the impedance converter circuit 51, the adding circuit 52, and the oscillator circuit 53 constitute a self-exited oscillator circuit. When oscillation voltage Vgo at a predetermined frequency is applied to the driving electrode layer 29 from the oscillator circuit 53, natural oscillation occurs in the vibrator part 23 of each vibrating element 20. The output Vgr from the first detection electrode 30R and the output Vgl from the second detection electrode 30L of each vibrating element 20 are supplied to the impedance converter circuit 51, and outputs Vzr and Vzl are output to the adding circuit 52 from the impedance converter circuit 51 on the basis of the inputs Vgr and Vgl, respectively. The adding circuit 52 outputs adding output Vsa to the oscillator circuit 53 on the basis of these inputs.

The outputs Vgr and Vrl from the first and second detection electrodes 30R and 30L, respectively, of each vibrating element 20 are supplied to the differential amplifier circuit 54. When each vibrating element 20 detects motion blurring, a difference occurs between the outputs Vgr and Vgl in the driving detector circuit part 50, and thus a predetermined output Vda is produced from the differential amplifier circuit 54. The output Vda from the differential amplifier circuit 54 is supplied to the synchronous detector circuit 55. The synchronous detector circuit 55 synchronously detects the output Vda, converts it to a DC signal Vsd, and supplies the DC signal Vsd to the DC amplifier circuit 56 to output the DC signal Vsd after predetermined DC amplification.

The synchronous detector circuit 55 integrates the output Vda of the differential amplifier circuit 54 after full-wave rectification with the timing based on a clock signal Vck which is output from the oscillator circuit 53 synchronously with the driving signal, thereby producing the DC signal Vsd. As described above, each of the driving detector circuit parts 50 amplifies the DC signal Vsd by the DC amplifier circuit 56 and then outputs it, and, as a result, an angular velocity signal produced by motion blurring is detected.

In each of the driving detector circuit parts 50, the impedance converter circuit 51 produces low impedance output Z3 in a high-impedance input Z2 state to exhibit the function to separate between the impedance Z1 between the first and second detection electrodes 30R and 30L and the impedance Z4 between the inputs of the adding circuit 52. By providing the impedance converter circuit 51, a large output difference is obtained from the first and second detection electrodes 30R and 30L.

In each of the driving detector circuit parts 50, the above-described impedance converter circuit 51 exhibits only the impedance converting function for the input and output without significantly affecting the magnitude of a signal. Therefore, the magnitude of the output Vgr from the first detection electrode 30R is same as that of the output Vzr on one of the sides of the impedance converter circuit 51, and the magnitude of the output Vgl from the second detection electrode 30L is the same as that of the output Vzl on the other side of the impedance converter circuit 51. In each of the driving detector circuit parts 50, even when the vibrating element 20 detects motion blurring to produce a difference between the output Vgr from the first detection electrode 30R and the output Vgl from the second detection electrode 30L, the difference is held in the output Vsa from the adding circuit 52.

In each of the driving detector circuit parts 50, for example, even when noise is superposed by a switching operation or the like, components other than a resonance frequency component are removed by a function similar to a band filter in the vibrating element 20 to remove the noise component superposed on the output Vgo from the oscillator circuit 53, thereby obtaining the high-precision output Vda not including the noise component from the differential amplifier circuit 54. In the vibrating gyrosensor 1, the driving detector circuit parts 50 are not limited to the above. The driving detector circuit parts may be formed so that displacement due to motion blurring of each vibrator part 23 performing natural vibration is detected by the piezoelectric thin film layer 28 and a pair of the detection electrodes 30, and detection output is obtained by appropriate processing.

As described above, the vibrating gyrosensor 1 includes the first vibrating element 20X for detecting an angular velocity in the X-axis direction and the second vibrating element 20Y for detecting an angular velocity in the Y-axis direction. The first driving detector circuit part 50X connected to the first vibrating element 20X produces the detection output VsdX in the X-axis direction, and the second driving detector circuit part 50Y connected to the second vibrating element 20Y produces the detection output VsdY in the Y-axis direction. In the vibrating gyrosensor 1, the operation frequency of each of the first and second vibrating elements 20X and 20Y may be set in a range of several kHz to several hundreds kHz. When a difference (fx−fy) between the operation frequency fx of the first vibrating element 20X and the operation frequency fy of the second vibrating element 20Y is 1 kHz or more, for example, 2 kHz to 3 kHz, a cross talk is decreased to permit the precision detection of vibration.

(Method for Producing Vibrating Gyrosensor)

Figure 10:
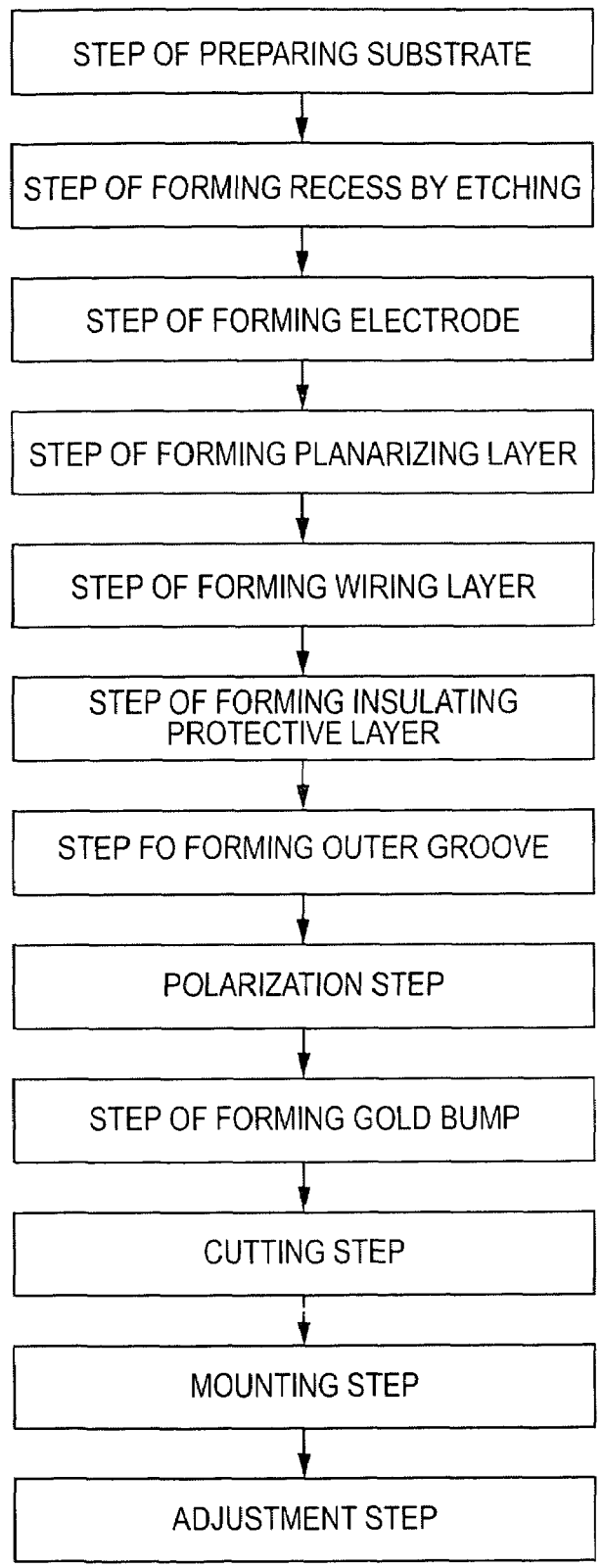
FIG. 10 is a flow chart of main steps of a method for manufacturing the vibrating gyrosensor.

The method for producing the vibrating gyrosensor according to this embodiment will be described below. FIG. 10 is a flow chart showing principal steps of the method for producing the vibrating gyrosensor 1.

Figure 11:
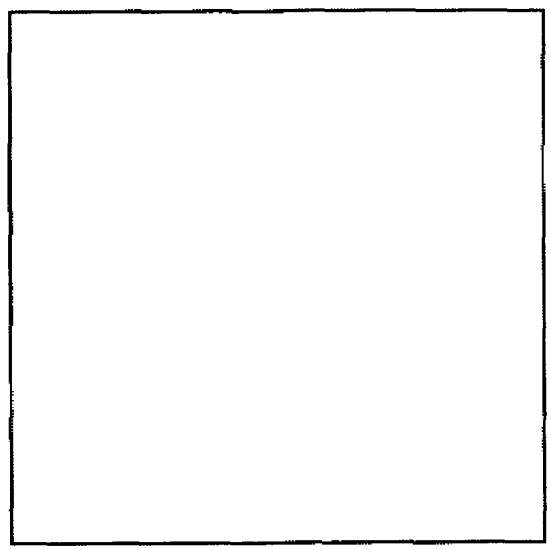
FIG. 11 is a plan view of a silicon substrate used in a process for manufacturing a vibrating element.
Figure 12:
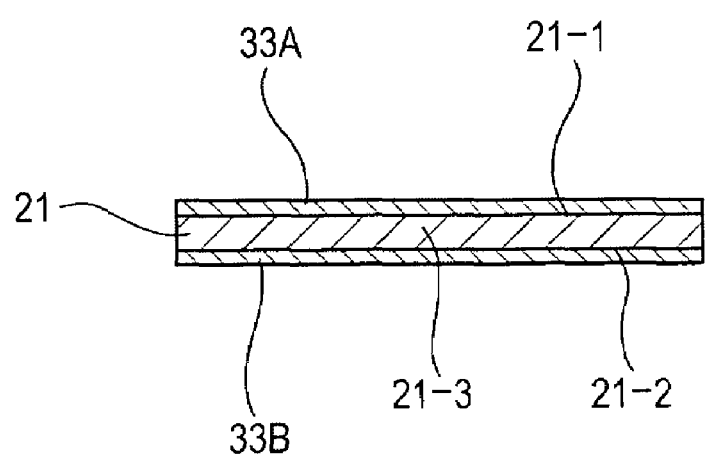
FIG. 12 is a sectional view of the silicon substrate shown in FIG. 11.

The vibrating gyrosensor 1 is produced by simultaneously forming many vibrating elements 20 using, as a base material, the silicon substrate 21 which is cut out so that the main surface 21-1 is a (100) orientation plane, and the side 21-3 is a (110) orientation plane, as shown in FIGS. 11 and 12, and then cutting into the substrate the respective vibrating elements 20 by a cutting step.

In this embodiment, as the silicon substrate 21, an undoped, substantially pure single crystal silicon substrate or a single crystal silicon substrate having a volume resistivity of 100 Ω·cm is used as described below. By using such a single crystal silicon substrate as the silicon substrate 21, a silicon layer has a high resistance value.

(Step of Preparing Substrate)

The outer dimensions of the silicon substrate 21 are determined according to the specifications of the equipment used in the process, for example, 300×300 mm. The silicon substrate 21 is not limited to a substrate having a rectangular planar shape as shown in FIG. 11, and a wafer-shaped substrate having a circular planar shape may be used. The thickness of the silicon substrate 21 is determined depending on the workability, cost, and the like, but the thickness may be larger than the thickness dimension of at least the base part 22 of each vibrating element 20. As described above, since the base part 22 has a thickness of 300 μm, and the vibrator part 23 has a thickness of 100 μm, a substrate 21 having a thickness of 300 μm or more is used.

As shown in FIG. 12, silicon oxide films (SiO$_2$ films) 33A and 33B (generically referred to as "silicon oxide films 33" hereinafter unless otherwise specified) are formed, by thermal oxidation, over the entire surfaces of the first main surface 21-1 and the second main surface 21-2, respectively, of the silicon substrate 21. The silicon oxide films 33 function as protective films in anisotropic etching of the crystal of the silicon substrate 21, as described below. The silicon oxide films 33 are formed to a proper thickness as long as a protective film function is exhibited, but the silicon oxide films 33 are formed to a thickness of, for example, about 0.3 μm.

(Step of Forming Etched Recess)

The process for producing each vibrating element includes a step similar to a thin film step of a semiconductor process. Namely, the process includes a step of etching the first main surface 21-1 of the silicon substrate 21 to form the etched recesses 37 with a predetermined depth dimension, for forming the vibrator parts 23 of the respective vibrating elements 20.

As shown in FIGS. 13 to 19, the etched recess forming step includes a step of forming a photoresist layer 34 on the first main surface 21-1 of the silicon substrate 21, a step of patterning the photoresist layer 34 to form photoresist layer apertures 35 in the photoresist layer 34 corresponding to the formation portions of the respective etched recesses 37, a first etching step of removing the silicon oxide film 33A exposed in the photoresist layer apertures 35 to form silicon oxide film apertures 36, and a second etching step of forming the etching recesses 37 in the respective silicon oxide film apertures 36.

In the step of forming the photoresist layer, a photoresist material is applied over the entire surface of the silicon oxide film 33A formed on the first main surface 21-1 of the silicon substrate 21 to form the photoresist layer 34. The step of forming the photoresist layer uses, for example, a photosensitive photoresist material, OFPR-8600 manufactured by Tokyo Ohka Kogyo Co., Ltd., as the photoresist material. The photoresist material is applied and then heated by pre-baking with microwaves to remove moisture, thereby forming the photoresist layer 34 on the silicon oxide film 33A.

Figure 13:
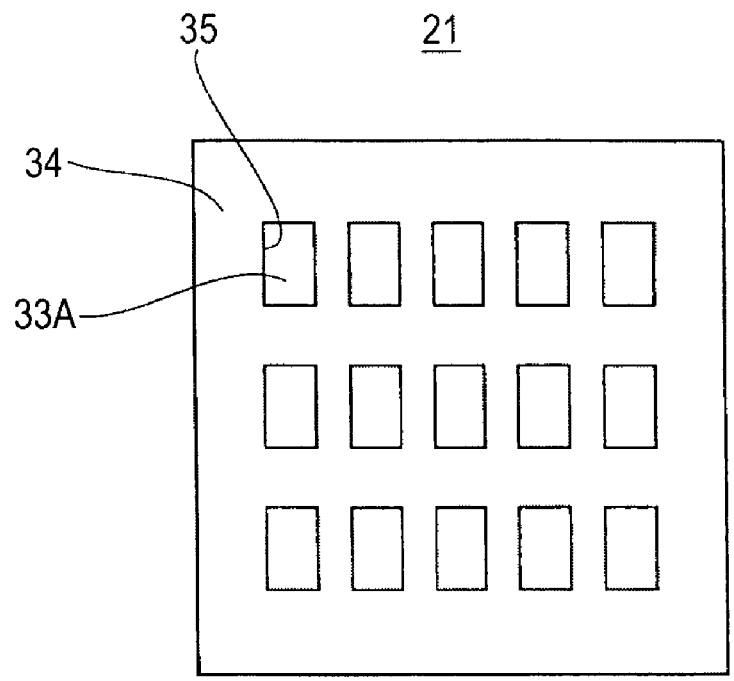
FIG. 13 is a plan view of the silicon substrate on which vibrating element formation portions are formed in a photoresist layer by patterning.
Figure 14:
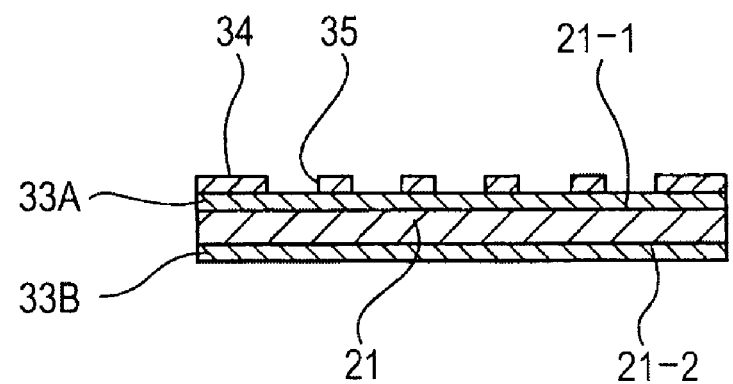
FIG. 14 is a sectional view of the silicon substrate shown in FIG. 13.

In the step of patterning the photoresist, the photoresist layer 34 is masked so that a portion for forming each silicon oxide film aperture 36 is opened, and then subjected to exposure and development. Then, the photoresist layer 34 is removed from a portion corresponding to each silicon oxide film aperture 36 to simultaneously form the many photoresist layer apertures 35 in each of which the silicon oxide film 33A is exposed, as shown in FIGS. 13 and 14. As shown in FIG. 13, 3×5 photoresist layer apertures 35 are formed on the silicon substrate 21 so that 15 vibrating elements 20 are simultaneously formed through the steps described below.

In the first etching step, the silicon oxide film 33A exposed from each photoresist layer aperture 35 is removed. In the first etching step, in order to maintain the smoothness of the interface of the silicon substrate 21, a wet etching method is used for removing only the silicon oxide film 33A. However, the etching method is not limited to this, and appropriate etching such as ion etching or the like may be used.

Figure 15:
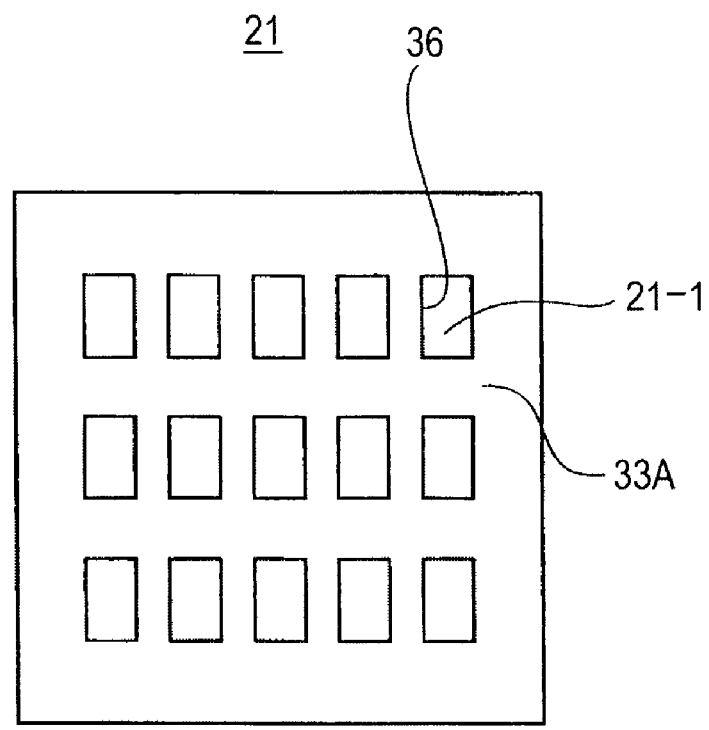
FIG. 15 is a plan view of the silicon substrate on which vibrating element formation portions are formed in a silicon oxide film by patterning.
Figure 16:
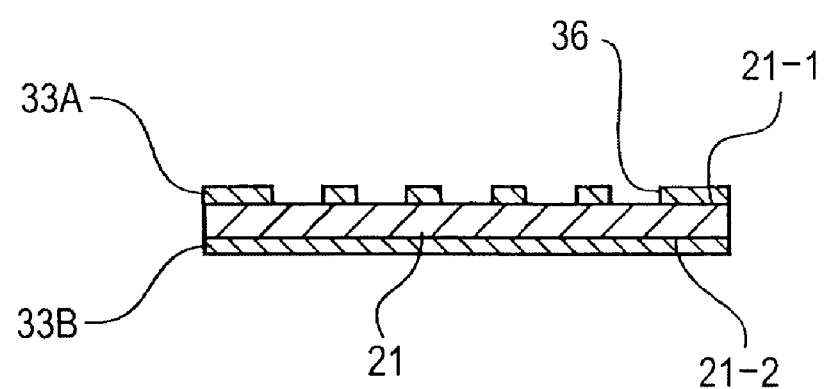
FIG. 16 is a sectional view of the silicon substrate shown in FIG. 15.

In the first etching step, for example, an ammonium fluoride solution is used as an etchant for removing the silicon oxide film 33A to form the silicon oxide film apertures 36. As shown in FIGS. 15 and 16, as a result, the first main surface 21-1 of the silicon substrate 21 is exposed to the outside. In the first etching step, when etching is performed over a long time, a side etching phenomena occurs, in which etching proceeds from the sides of the silicon oxide film apertures 36. Therefore, the etching time is preferably precisely controlled so that etching is stopped at the end of etching of the silicon oxide film 33A.

In the second etching step, the etched recesses 37 are formed in exposed portion of the first main surface 21-1 of the silicon substrate 21, the exposed portions being exposed to the outside through the respective silicon oxide film apertures 36. In the second etching step, the silicon substrate 21 is etched to leave a depth corresponding to the thickness of the vibrator parts 23 by crystal anisotropic wet etching using the property that the etching rate depends on the crystal orientation of the silicon substrate 21.

The second etching step uses, for example, a TMAH (tetramethylammonium hydroxide), KOH (potassium hydroxide), or EDP (ethylenediamine-pyrocatechol-water) solution, as the etchant. Specifically, the second etching step uses a 20% TMAH solution as the etchant, for increasing the etching ratio of the silicon oxide films 33A and 33B on the front and back surfaces. The etching is performed for 6 hours with the etchant kept at a temperature of 80° C. under stirring to form the etched recessed 37 shown in FIGS. 17 and 18.

In the second etching step, the etching is performed so that a (110) orientation plane at an angle of about 55° with respect to a (100) plane appears using the property of the silicon substrate 21 used as a base material that the etching rate of the side 21-3 is lower than that of the first and second main surfaces 21-1 and 21-2. As a result, the etched recesses 37 are formed so that the opening size of each recess 37 gradually decreases at an inclination angle of about 55° from the opening to the bottom, and an etched inclined surface 133 at an inclination angle of about 55° is formed at the inner wall of each etched recess 37.

Figure 17:
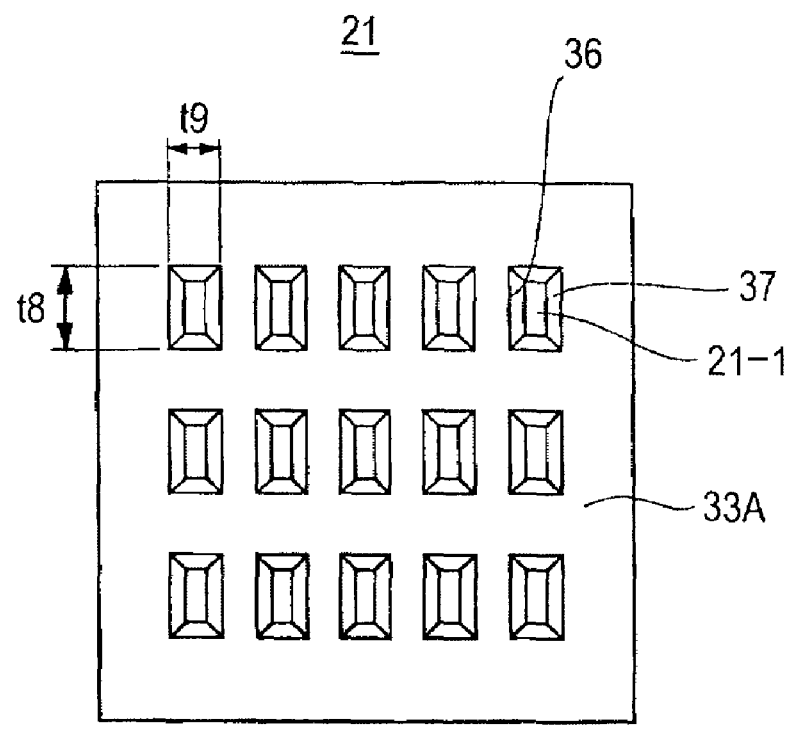
FIG. 17 is a plan view of the silicon substrate in which etched recesses are formed, the etched recesses constituting respective diaphragm parts which define the thicknesses of the respective vibrator parts.
Figure 18:
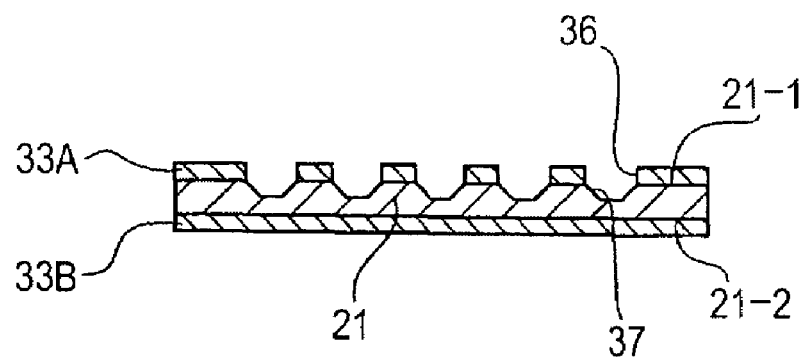
FIG. 18 is a sectional view of the silicon substrate shown in FIG. 17.
Figure 19:
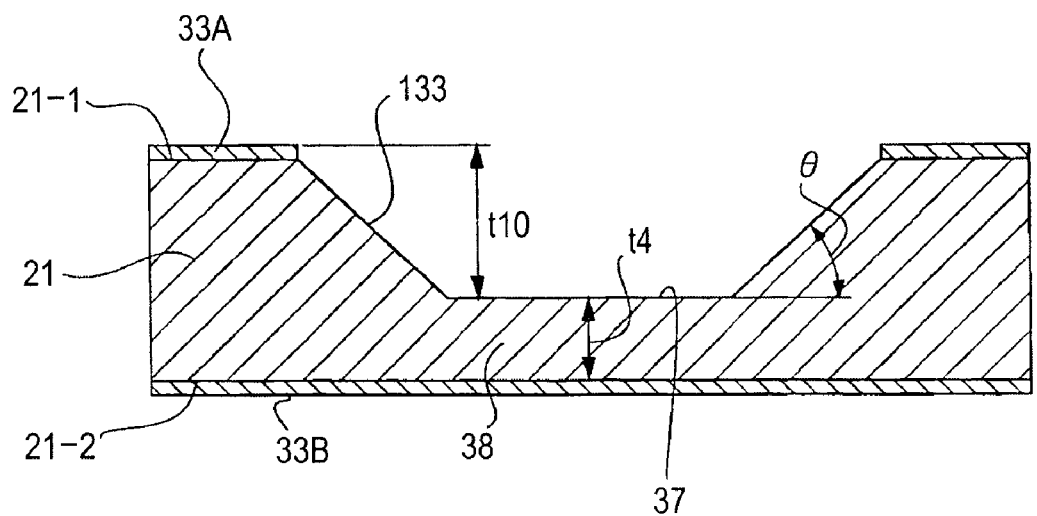
FIG. 19 is an enlarged sectional view of one etched recess.

Each of the etched recesses 37 constitutes the diaphragm part 38 for forming the vibrator part 23 by the outer shape cutting step which will be described below. As shown in FIG. 17, each of the etched recessed 37 has an aperture having a length dimension t8 and a width dimension t9. As shown in FIG. 19, each of the etched recesses 37 has a depth dimension t10 and forms a space having a trapezoidal sectional shape in which the opening size gradually decreases from the first main surface 21-1 to the second main surface 21-2.

Each of the etched recesses 37 is formed to have the inner peripheral wall inclined at an inclination angle θ of 55° toward the bottom thereof, as described above. Each of the diaphragm parts 38 is defined by the width dimension t6 and the length dimension t5 of the vibrator part 23 and the width dimension t7 (refer to FIGS. 36 and 37) of the outside groove 39 formed by cutting the silicon substrate 21 along the periphery of the vibrator part 23. The width dimension t7 of the outside groove 39 is determined by the equation, depth dimension t10×1/tan 55°.

Therefore, in each of the etched recessed 37, the opening width dimension t9 which defines the width of the diaphragm part 38 is determined by the equation, (depth dimension t10× 1/tan 55°)×2+t6 (width dimension of the vibrator part 23)+ 2×t7 (width dimension of the outside groove 39). In each of the etched recessed 37, when t10 is 200 μm, t6 is 100 μm, and t7 is 200 μm, the width dimension t9 of the opening is 780 μm.

like in the width direction, in the length direction, each of the etched recesses 37 is formed by the above-described second etching step to have an inclined surface at an inclination angle of 55° on the inner peripheral wall. Therefore, in each of the etched recessed 37, the length dimension t8 which defines the length of the diaphragm part 38 is determined by the equation, (depth dimension t10×1/tan 55°)×2+t5 (length dimension of the vibrator part 23)+t7 (width dimension of the outside groove 39). In each of the etched recessed 37, when t10 is 200 μm, t5 is 2.5 mm, and t7 is 200 μm, the length dimension t8 of the opening is 2980 μm.

(Electrode Forming Step (Deposition))

In the above-described step of forming the etched recesses, the rectangular diaphragm parts 38 each having a predetermined thickness are formed between the bottoms of the respective etched recesses 37 and the second main surface 21-2 of the silicon substrate 21. The diaphragm parts 38 constitute the vibrator parts 23 of the respective vibrating elements 20. After the etched recesses 37 are formed, the second main surface sides of the diaphragm parts 38 are used as processed surfaces in the electrode forming step.

Figure 20:
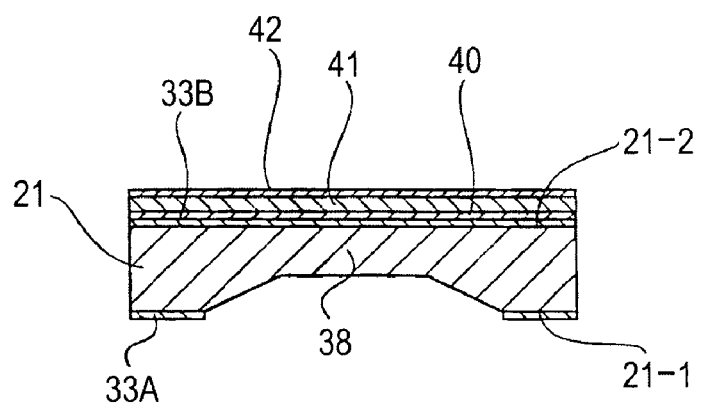
FIG. 20 is a sectional view of a principal portion in which a first electrode layer, a piezoelectric film layer, and a second electrode layer are laminated on each diaphragm part.

In the electrode forming step, the electrode layers are formed by, for example, a magnetron sputtering apparatus, on a portion of the second main surface 21-2, which corresponds to each etched recess 37, through the silicon oxide film 33B. The electrode forming step, as shown in FIG. 20, includes the steps of forming a first electrode layer 40 for forming the reference electrode layer 27 on the silicon oxide film 33B, forming a piezoelectric layer 41 for forming the piezoelectric thin film layer 28, and forming a second electrode layer 42 for forming the driving electrode layer 29 and the detection electrodes 30.

In the process for producing the vibrating elements, a step of forming a conductor layer for forming the leads 31 and the terminal parts 25 in a formation region of each base part 22 is performed in conformity with the step of forming the first electrode layer 40 and the step of forming the second electrode layer 42 on each vibrator part 23.

The step forming the first electrode layer includes a step of forming a titanium thin film layer by sputtering titanium over the entire surface of the silicon oxide film 33B in a region corresponding to each vibrator part 23, and a step of forming a platinum layer on the titanium thin film layer by sputtering platinum to form the first electrode layer 40 including the two layers. In the step of forming the titanium thin film layer, the titanium thin film layer is deposited to a thickness of 50 nm or less (for example, 5 nm to 20 nm) on the silicon oxide film 33B under the sputtering conditions including, for example, a gas pressure of 0.5 Pa and a RF (radio frequency) power of 1 kW. In the step of forming the platinum layer, the platinum thin film layer is deposited to a thickness of about 200 nm on the titanium thin film layer under the sputtering conditions including, for example, a gas pressure of 0.5 Pa and a RF power of 0.5 kW.

In the first electrode layer 40, the titanium thin film layer has the function to improve the adhesion to the silicon oxide film 33B, and the platinum layer functions as a satisfactory electrode. In the step of forming the first electrode layer, as described above, the conductor layer for forming the first lead 31A and the first terminal part 25A extending from each diaphragm part 38 to the formation region of the corresponding base part 22 is formed at the same time as the formation of the first electrode layer 40.

In the step of forming the piezoelectric film layer, the piezoelectric film layer 41 is deposited to a predetermined thickness by sputtering, for example, lead zirconate titanate (PZT) over the entire surface of the first electrode layer 40. In the step of forming the piezoelectric film layer, the piezoelectric film layer 41 including a PZT layer is deposited to a thickness of about 1 μm on the first electrode layer 40 using $Pb_{(1-x)}(Zr_{0.53}Ti_{0.47})_{3-y}$ oxide as a target under the sputtering conditions including, for example, a gas pressure of 0.7 Pa and a RF power of 0.5 kW. Also, the piezoelectric film layer 41 is crystallized by baking heat treatment in an electric oven. The baking treatment is performed at 700° C. in an oxygen atmosphere for 10 minutes. The piezoelectric film layer 41 is formed to cover a portion of the electrode layer extended from the first electrode layer 41 to the formation region of each base part 22.

In the step of forming the second electrode layer, a platinum layer is formed by sputtering platinum over the entire surface of the piezoelectric film layer 4 to form the second electrode layer 42. The platinum thin film layer is deposited to a thickness of about 200 nm on the piezoelectric film layer 41 under the sputtering conditions including, for example, a gas pressure of 0.5 Pa and a RF power of 0.5 kW.

(Electrode Forming Step (Patterning))

Next, the step of patterning the second electrode layer 42 formed as an uppermost layer is performed. In the step of patterning the second electrode layer, the driving electrode layer 29 and the pair of the detection electrodes 30R and 30L each having a predetermined shape are formed as shown in FIGS. 21 and 22.

As described above, the driving electrode layer 29 serves as an electrode for applying a predetermined drive voltage for driving each vibrator part 23 and is formed with a predetermined width in a central region of each vibrator part 23 in the width direction to extent over substantially the entire region in the length direction thereof. The detection electrodes 30 are electrodes for detecting the Coriolis' force produced in each vibrator part 23 and are formed in parallel on both sides of the driving electrode layer 29 to be insulated from each other over substantially the entire region in the length direction.

Figure 21:
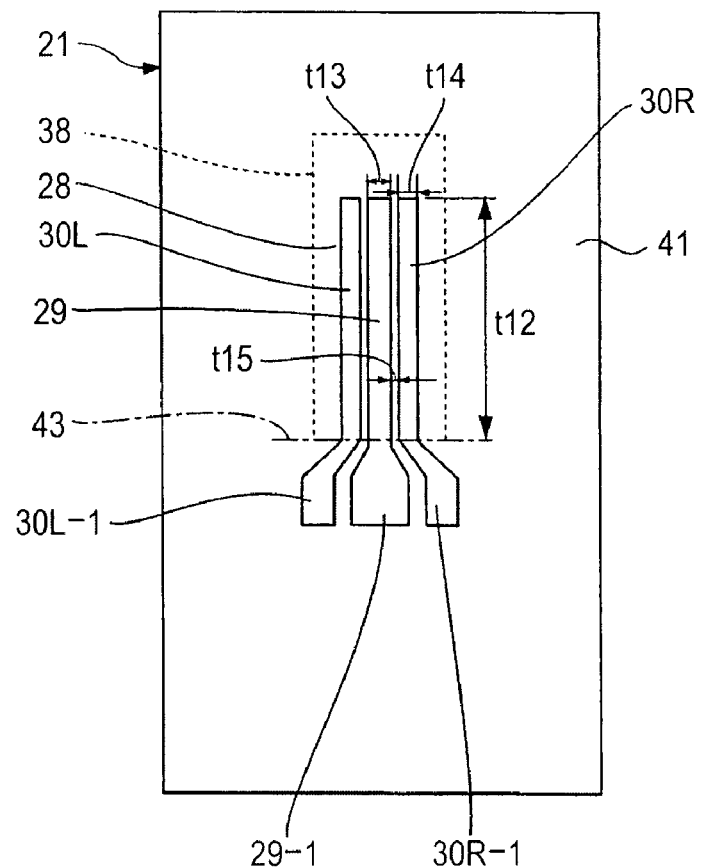
FIG. 21 is a plan view of a principal portion in which a driving electrode layer and detection electrodes are patterned in the second electrode layer shown in FIG. 20.
Figure 22:
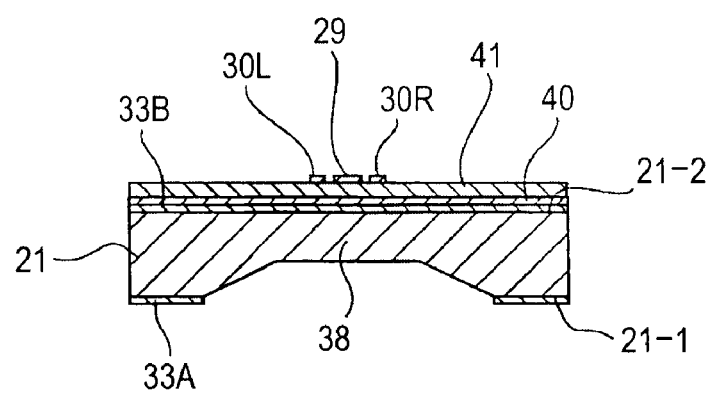
FIG. 22 is a sectional view of the principal portion shown in FIG. 21.

In the step of patterning the second electrode layer, the second electrode layer 42 is subjected to photolithographic treatment to form the driving electrode layer 29 and the detection electrodes 30 on the piezoelectric film layer 41, as shown in FIG. 21. In the step of pattering the second electrode layer, a resist layer is formed on portions corresponding to the driving electrode layer 29 and the detection electrodes 30, and unnecessary portions of the second electrode layer 42 are removed by, for example, ion etching or the like. Then, the resist layer is removed to pattern the driving electrode layer 29 and the detection electrodes 30. The step of patterning the second electrode layer is not limited to this, and the driving electrode layer 29 and the detection electrodes 30 may be formed using an appropriate conductor layer forming step used in a semiconductor process.

As shown in FIG. 21, the driving electrode layer 29 and the detection electrodes 30 are formed so that the tips thereof are disposed at the same position in the length direction, and also the root parts to be disposed at the root of each vibrator part 23 are disposed at the same position 43 in the length direction. In the step of pattering the second electrode layer, wider lead connection parts 29-1, 30R-1, and 30L-1 are formed by pattering integrally with the base ends of the driving electrode layer 29 and the detection electrodes 30R and 30L, respectively, which have the root parts disposed at the same position 43 in the length direction.

In the step of patterning the second electrode layer, the second electrode layer 42 is patterned to form the driving electrode layer 29, for example, having a length dimension t12 of 2 mm and a width dimension t13 of 50 μm. Furthermore, as shown in FIG. 21, the first and second detection electrodes 30R and 30L each having a width dimension t14 of 10 μm are formed by patterning so that the driving electrode layer 29 is held therebetween with a space t15 of 5 μm between the driving electrode layer 29 and each detection electrode 30. Also, the lead connection parts 29-1, 30R-1, and 30L-1 each having a length dimension of 50 μm and a width dimension of 50 μm are formed by pattering. The dimension values of the driving electrode layer 29 and the detection electrodes 30 are not limited to the above-described value, and these are appropriately formed within a range which permits the formation on the second main surface of each vibrator part 23.

Figure 23:
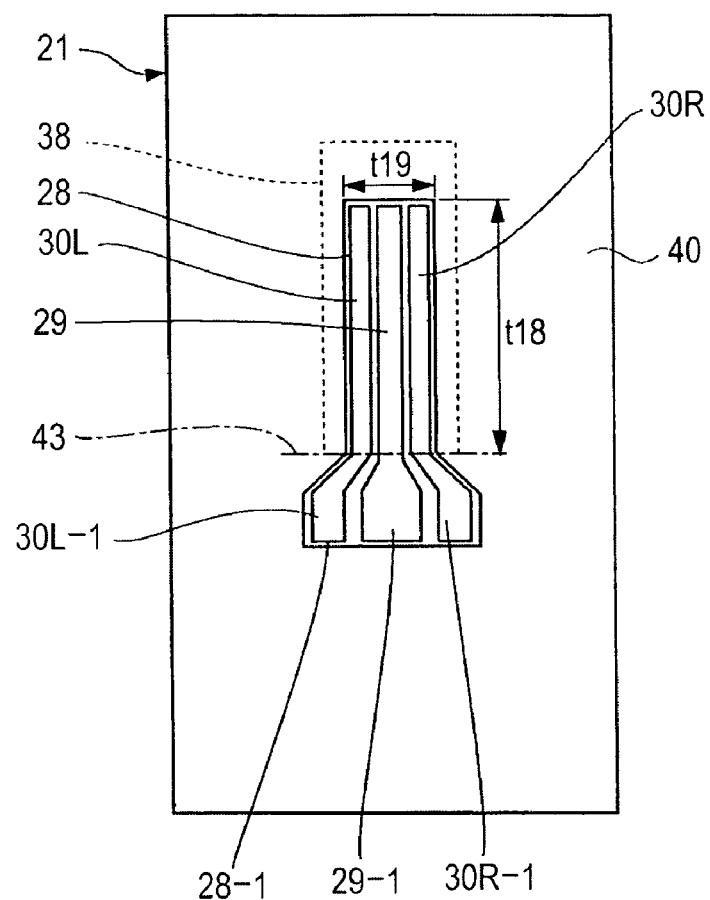
FIG. 23 is a plan view of a principal portion in which a piezoelectric thin film layer is patterned in the piezoelectric film layer shown in FIG. 20.
Figure 24:
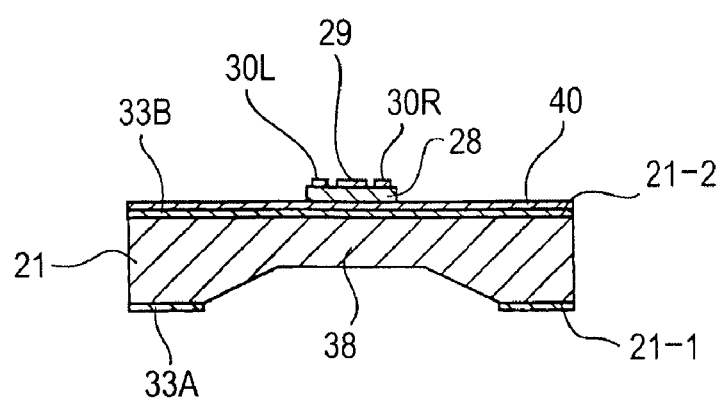
FIG. 24 is a sectional view of the principal portion shown in FIG. 23.

Then, in the step of pattering the piezoelectric film layer 41, the piezoelectric thin film layer 28 having a predetermined shape is formed as shown in FIGS. 23 and 24. The piezoelectric thin film layer 28 is formed by patterning the piezoelectric film layer 41, leaving an area larger than the driving electrode layer 29 and the detection electrodes 30. The piezoelectric thin film layer 28 is formed to have a width slightly smaller than that of each vibrator part 23 and extend from the base end to a vicinity of the tip thereof.

In the step of patterning the piezoelectric film layer, a resist layer is formed on a region of the piezoelectric film layer 41, which corresponds to the piezoelectric thin film layer 28, by photolithographic treatment. Then, unnecessary portions of the piezoelectric film layer 41 are removed by wet etching or the like, for example, using a fluoronitric solution, and the resist layer is removed to form the piezoelectric thin film layer 28, as shown in FIGS. 23 and 24. Although, in this embodiment, the piezoelectric film layer 41 is etched by wet etching, the etching method is not limited to this. For example, the piezoelectric thin film layer 28 may be formed by an appropriate method, for example, ion etching, reaction ion etching (RIE), or the like.

As shown in FIG. 23, in the step of pattering the piezoelectric film layer, the piezoelectric thin film layer 28 is formed to have substantially the same root part as those of the driving electrode layer 29 and the detection electrodes 39 at the root position 43 corresponding to the root of each vibrator part 23. Furthermore, a terminal receiving part 28-1 is integrally formed by patterning at the base end of the piezoelectric thin film layer 28 so as to have an area slightly lager than that of the leads connection parts 29-1, 30R-1, and 30L-1 of the driving electrode layer 29 and the detection electrodes 30.

In the step of patterning the piezoelectric film layer, the piezoelectric thin film layer 28 is formed by patterning to have a length dimension t18 of 2.2 mm which is slightly larger than that of the driving electrode layer 30 and the detection electrodes 30, and have a width dimension t19 of 90 μm. The terminal receiving part 28-1 formed by patterning at the base end of the piezoelectric thin film layer 28 has a peripheral portion having a width dimension of 5 μm around the lead connection parts 29-1, 30R-1, and 30L-1 of the driving electrode layer 29 and the detection electrodes 30. The dimension values of the piezoelectric thin film layer 28 are not limited to the above-described values, and the piezoelectric thin film layer 28 is formed to have an area larger than that of the driving electrode layer 29 and the detection electrodes 30 within a range permitting the formation of on the second main surface 23-2 of each vibrator part 23.

Figure 25:
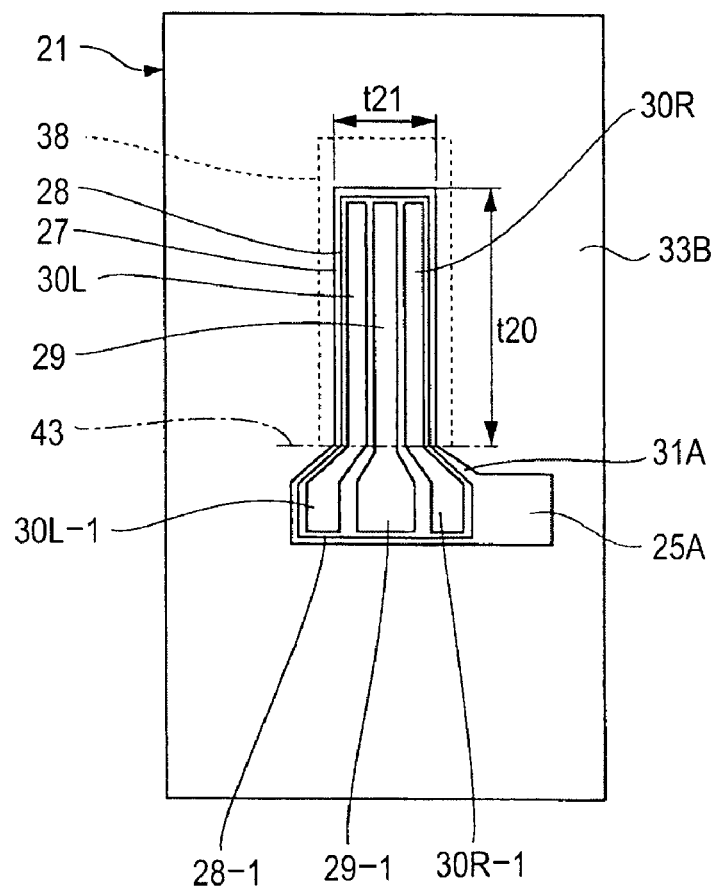
FIG. 25 is a plan view of a principal portion in which a reference electrode layer is patterned in the first electrode layer shown in FIG. 20.
Figure 26:
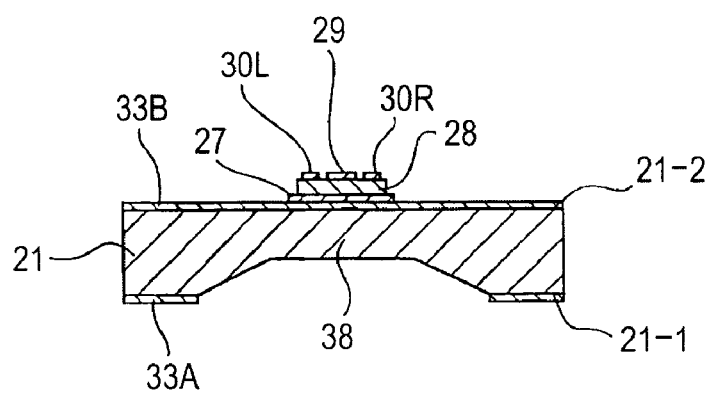
FIG. 26 is a sectional view of the principal portion shown in FIG. 25.

Furthermore, in the step of patterning the first electrode layer, the first electrode layer 40 is patterned b the same step as that for patterning the second electrode layer to form the reference electrode layer 27, as shown in FIGS. 25 and 26. In this step, a resist layer is formed on a region corresponding to the reference electrode layer 27, and unnecessary portions of the first electrode layer 40 are removed by, for example, ion etching or the like. Then, the resist layer is removed to form the reference electrode layer 27. The step of patterning the first electrode layer is not limited to this step, and the reference electrode layer 27 may be formed using an appropriate conductor layer forming step used in a semiconductor process.

In the step of patterning the first electrode layer, the reference electrode layer 27 is formed on the second main surface of each vibrator part 23 to have a width slightly smaller than that of the second main surface of each vibrator part 23 and larger than that of the piezoelectric thin film layer 28. As shown in FIG. 25, the base end of the reference electrode layer 27 is formed to have substantially the same shape as the driving electrode layer 29, the detection electrodes 30, and the piezoelectric thin film layer 28 at the root position 43 corresponding to the root of each vibrator part 23. In this step, the first lead 31A and the first terminal part 25A at the end of the first lead 31A are integrally formed by patterning on a formation region of the base part 22 so as to be extended sideward from the base end.

In the step of pattering the first electrode layer, the reference electrode layer 27 is formed to have a length dimension t20 of 2.3 mm and a width dimension t21 of 94 mm, a peripheral portion having a width dimension of 5 μm being formed around the piezoelectric thin film layer 28. In the step of patterning the first electrode layer, the dimension values of the reference electrode layer 27 are not limited to the above-described values, and the reference electrode layer may be formed within a range which permits the formation on the second main surface of each vibrator part 23.

(Step of Forming Planarizing Layer)

Figure 27:
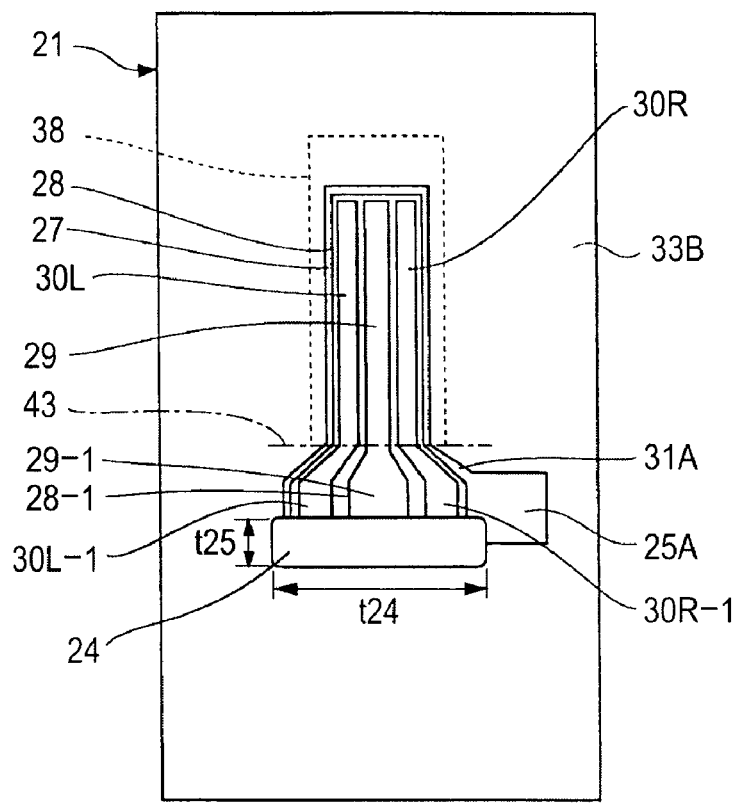
FIG. 27 is a plan view of a principal portion in which a planarizing layer is formed.
Figure 28:
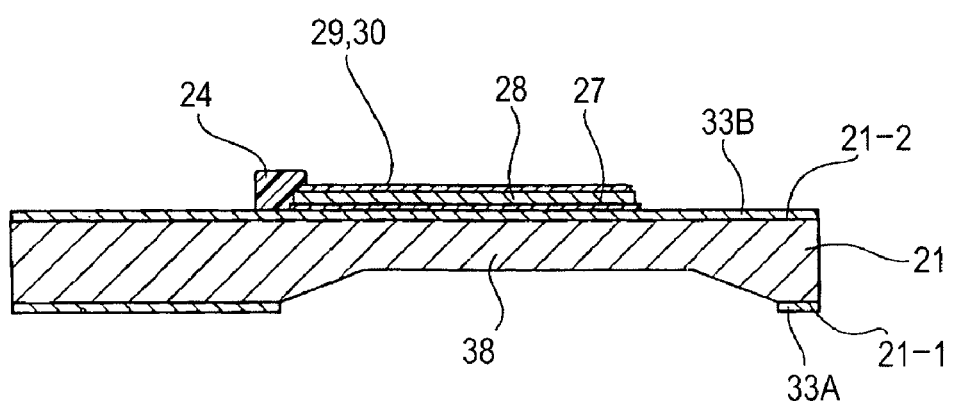
FIG. 28 is a sectional view of the principal portion shown in FIG. 27.

In the process for manufacturing the vibrating elements, the lead connection parts 29-1, 30R-1, and 30L-1 of the driving electrode layer 29 and the detection electrodes 30, and the terminals parts 25B to 25D are formed on the respective formation regions of each base part 22 through the above-described steps, and also leads 31B to 31D to be connected to the respective terminal parts 25 are formed. In order to smoothly connect the leads 31B to 31D to the lead connection parts 29-1, 30R-1, and 30L-1, the planarizing layer 24 is formed as shown in FIGS. 27 and 28.

The leads 31B to 31D for connecting the lead connection parts 29-1, 30R-1, and 30L-1 to the terminal parts 25B to 25D, respectively, are formed to cross over the ends of the terminal receiving part 28-1 of the piezoelectric thin film layer 28 and the reference electrode layer 27 and extend in the respective formation regions of each base part 22. As described above, the piezoelectric thin film layer 28 is formed by patterning the piezoelectric thin film layer 41 using wet etching, and thus the edge of an etched portion is inverse-tapered toward the second main surface 21-2 of the silicon substrate 21 or vertically stepped. Therefore, when the leads 31B to 31D are formed directly on the respective formation regions of each base part 22, disconnection may occur at the stepped portion. Also, it may be necessary to maintain insulation between the first lead 231A and the leads 31B to 31D extended on the respective formation regions of each base part 22.

In the step of forming the planarizing layer, a resist layer formed on a formation region of each base part 22 is patterned by photolithographic treatment to cover the lead connection parts 29-1, 30R-1, and 30L-1 and the first lead 31A. The resist layer pattern is cured by heat treatment at, for example, about 160° C. to 300° C., to form the planarizing layer 24. In this step, the planarizing layer 24 is formed to have a width dimension of t24 of 200 μm, a length dimension t25 of 50 μm, and a thickness dimension of 2 μm (exaggerated in FIG. 28). The step of forming the planarizing layer is not limited to this step, and the planarizing layer 24 may be formed using an appropriate insulating material in an appropriate resist layer forming step performed in a semiconductor process for the like.

(Step of Forming Wiring Layer)

Figure 29:
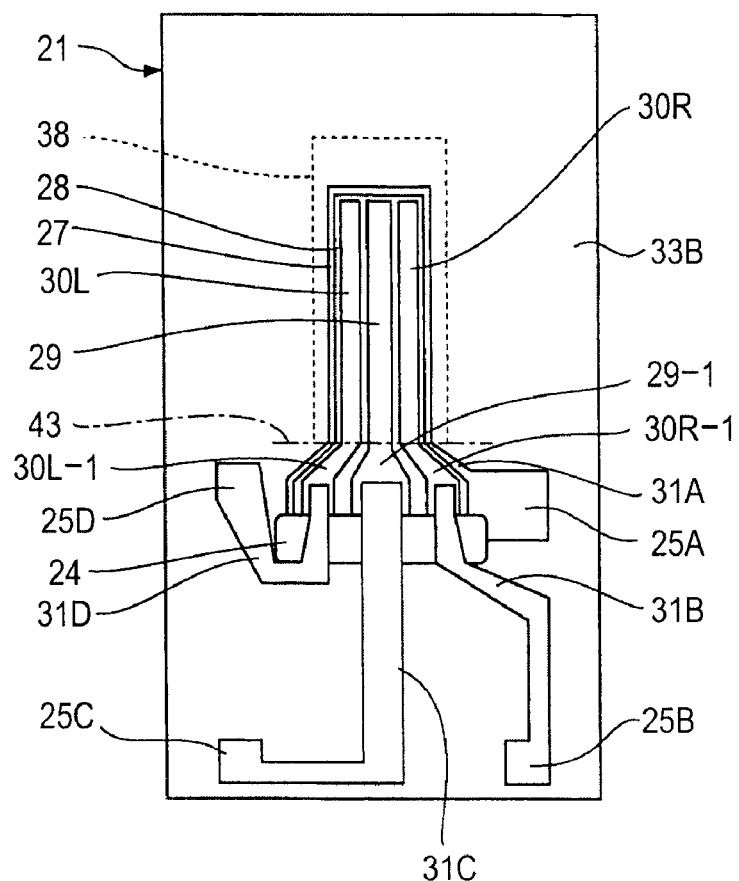
FIG. 29 is a plan view of a principal portion in which leads are formed on respective formation regions of a base part.
Figure 30:
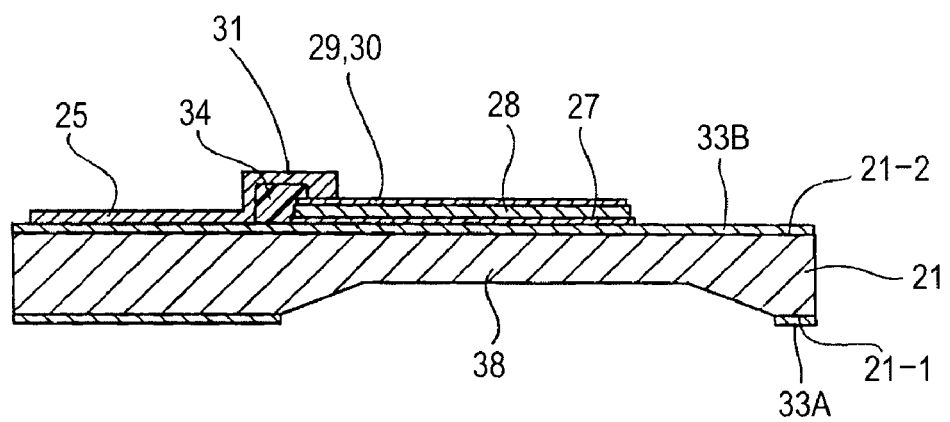
FIG. 30 is a sectional view of the principal portion shown in FIG. 29.

Next, the step of forming the wiring layer is performed for forming the second to fourth terminal parts 25B to 25D and the second to fourth leads 31B to 31D on the respective formation regions of each base part 22. In the step of forming the wiring layer, a photosensitive photoresist layer is formed over the entire region of a formation region of each base part 22, and then subjected to photolithographic treatment to form a pattern of apertures corresponding to the second to fourth terminal parts 25B to 25D and the second to fourth leads 31B to 31D. Furthermore, a conductor layer is formed in each of the apertures by sputtering to form the wiring layer. In this step, after predetermined conductor portions are formed, the photoresist layer is removed to form the second to fourth terminal parts 25B to 25D and the second to fourth leads 31B to 31D, as shown in FIGS. 29 and 30.

In the step of forming the wiring layer, a titanium layer or an alumina layer is formed as an underlying layer for improving the adhesion to the silicon oxide film 33B, and then a low-cost copper layer having low electric resistance is formed on the titanium layer. In this embodiment, for example, the titanium layer is formed to a thickness of 20 nm, and the copper layer is formed to a thickness of 300 nm. The step of forming the wiring layer is not limited to this step, and the wiring layer may be formed by, for example, any wiring patterning forming technique generally used in a semiconductor process.

(Step of Forming Insulating Protective Layer)

Then, the step of forming the insulating protective layer is performed for forming the insulating protective layer 45 including three layers over the main surface of each base part 22 on which the terminals 25 and the leads 31 have been formed by the above-described steps and each vibrator part 23 on which the electrode layers and the piezoelectric thin film layer 28 have been formed. The step of forming the insulating protective layer includes the steps of forming a resist layer, patterning the resist layer, forming a first alumina layer, forming a silicon oxide layer, forming a second alumina layer, and removing the resist layer.

Figure 31:
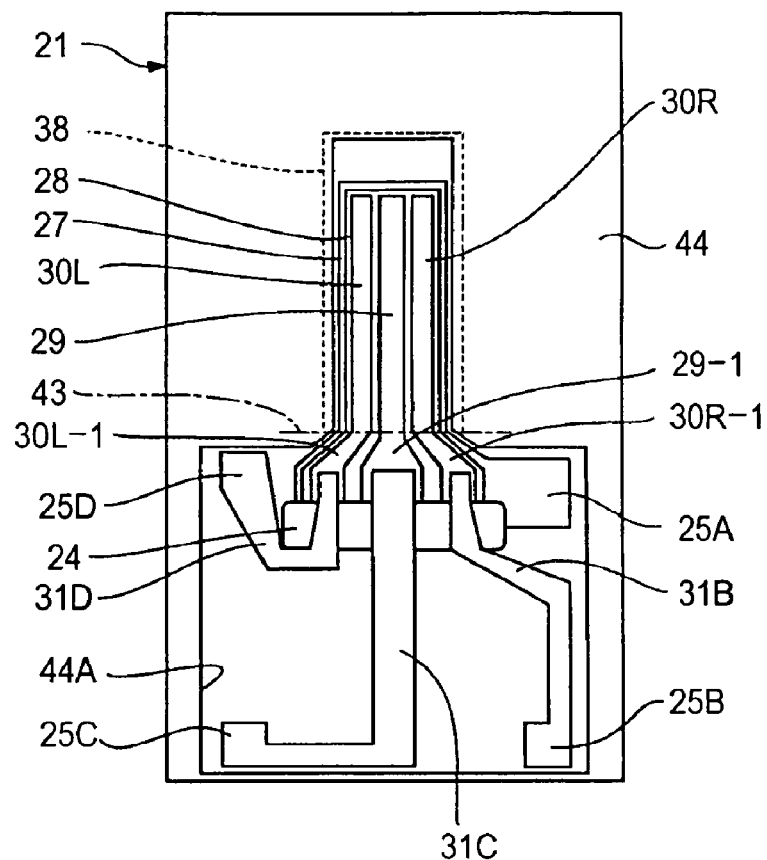
FIG. 31 is a plan view of a principal portion in which a photoresist layer is formed for forming an insulating protective layer.

In the step of forming the insulating protective layer, the steps of forming the resist layer and pattering the resist layer are performed to form a resist layer 44 having an aperture in a region corresponding to the insulating protective layer 45 on the second main surface of the silicon substrate 21, as shown in FIG. 31. In the step of forming the resist layer, a photosensitive resist agent is applied over the entire surface of the silicon substrate 21 to form the resist layer 44. In the step of patterning the resist layer, the resist layer 44 is subjected to photolithographic treatment to form an aperture corresponding to a formation region of the insulating protective layer 45, thereby forming an insulating protective forming aperture 44A. Although not shown in the drawing, the resist layer 44 is left in circular portions corresponding to the respective terminal parts 25.

Figure 32:
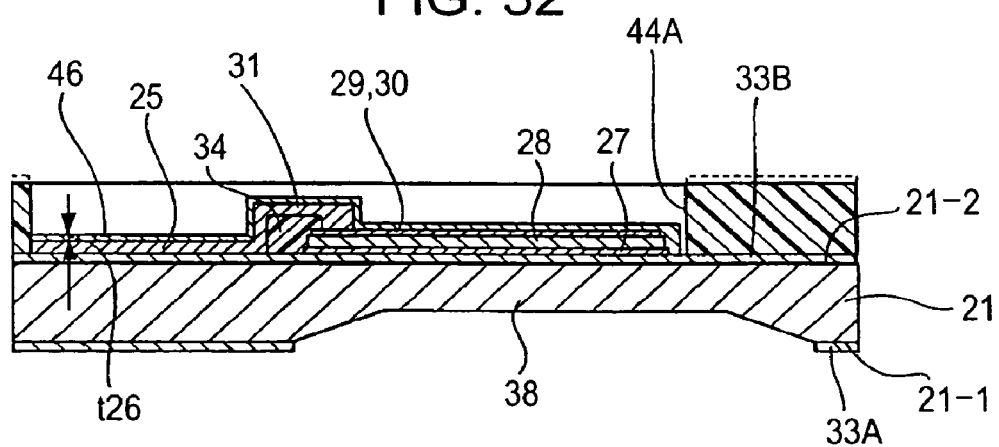
FIG. 32 is a sectional view of the principal portion shown in FIG. 31 in which a first alumina layer of the insulating protective layer is formed.
Figure 33:
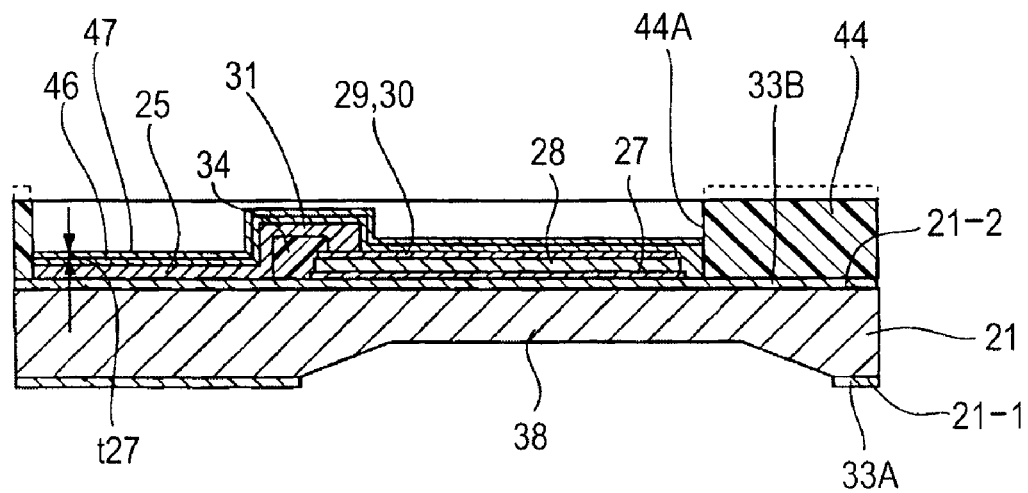
FIG. 33 is a sectional view of the principal portion shown in FIG. 31 in which a silicon oxide layer of the insulating protective layer is formed.
Figure 34:
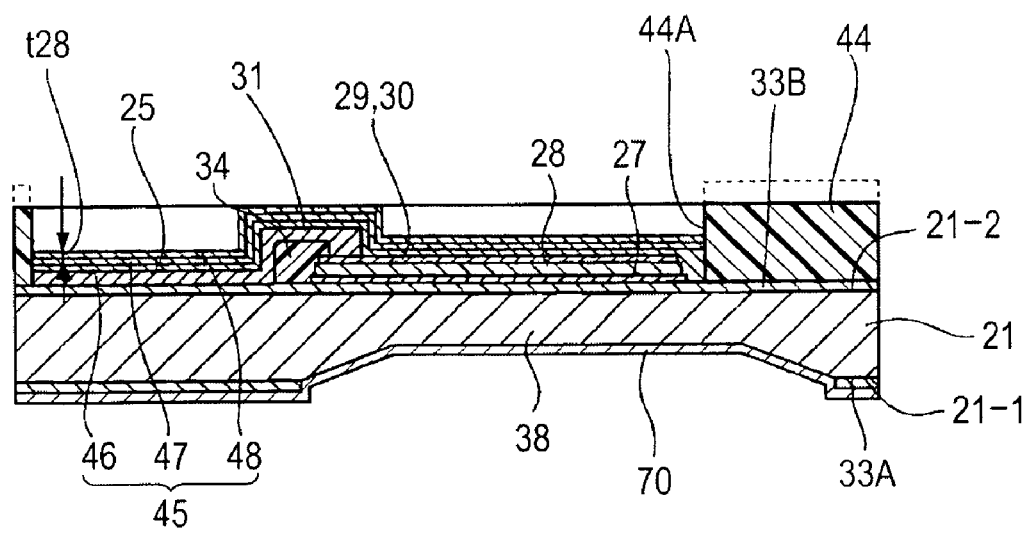
FIG. 34 is a sectional view of the principal portion shown in FIG. 31 in which a second alumina layer of the insulating protective layer and an etching stop layer are formed.

In the step of forming the insulating protective layer, a first alumina layer 46, a silicon oxide layer 47, and a second alumina layer 48 are laminated by sputtering, and unnecessary portions of the sputtering films are removed together with the resist layer 44 to leave a three layer-structure sputtered layer in the insulating protective layer formation aperture 44A of the resist layer 44. Namely, the desired insulating protective layer 45 is formed by a so-called liftoff method. FIGS. 32 to 34 show only the sputtered films formed in the simulating protective film formation aperture 44A. However, of course, the sputtered films are formed on the resist layer 44 having the insulating protective layer formation aperture 44A, and these sputtered films are simultaneously removed together with the resist layer 44 in the resist layer removing step.

In the step of forming the first alumina layer, the first alumina layer 46 is formed by sputtering alumina in the insulating protective layer formation aperture 44A, as shown in FIG. 32. The first alumina layer 46 is formed to have a thickness dimension t26 of about 50 nm and functions as an underlying metal layer for improving the adhesion to the silicon substrate 21 and the driving electrode layer 29 or the detection electrodes 30 within the insulating protective layer forming aperture 44A, as described above.

In the step of forming the silicon oxide layer, the silicon oxide layer 47 is formed on the first alumina layer 46 by sputtering silicon oxide, as shown in FIG. 33. In this step, since the lower limit of argon pressure for discharge in a sputtering vessel is 0.35 Pa, the silicon oxide layer 47 with a high density is formed by sputtering silicon oxide at an argon pressure set at 0.4 Pa slightly higher than the lower limit. The silicon oxide layer 47 formed in this step exhibits a sufficient insulating protective function because the thickness thereof is at least twice that of the driving electrode layer 29 and the detection electrodes 30, and has a thickness dimension t27 of 1 μm or less within a region in which burr occurs at a low rate in the liftoff method. Specifically, the silicon oxide layer 47 is formed with a thickness dimension t27 of 750 nm.

In the step of forming the second alumina layer, as shown in FIG. 34, the second alumina layer 48 is formed by sputtering alumina over the entire surface of the silicon oxide layer 47. The second alumina layer 48 is formed to have a thickness dimension t28 of about 50 nm, for improving the adhesion to the resist layer to be formed in the outer shape grooving step which will be described below, thereby preventing the silicon oxide layer 47 from being damaged by an etching agent.

(Outer Shape Grooving Step)

Next, as shown in FIG. 34, an etching stop layer 70 is formed on the fist main surface 21-1 of the silicon substrate 21. The etching stop layer 70 functions to suppress the occurrence of a defective shape in which plasma concentration occurs on the first main surface 21-1 to fail to form a predetermined edge shape in the step of forming an outside groove in the silicon substrate 21, which will be described below. In the step of forming the etching stop layer, for example, a silicon oxide layer is formed to a thickness of about 500 nm by sputtering over the entire surface of the first main surface 21-1 of the silicon substrate 21.

Figure 35:
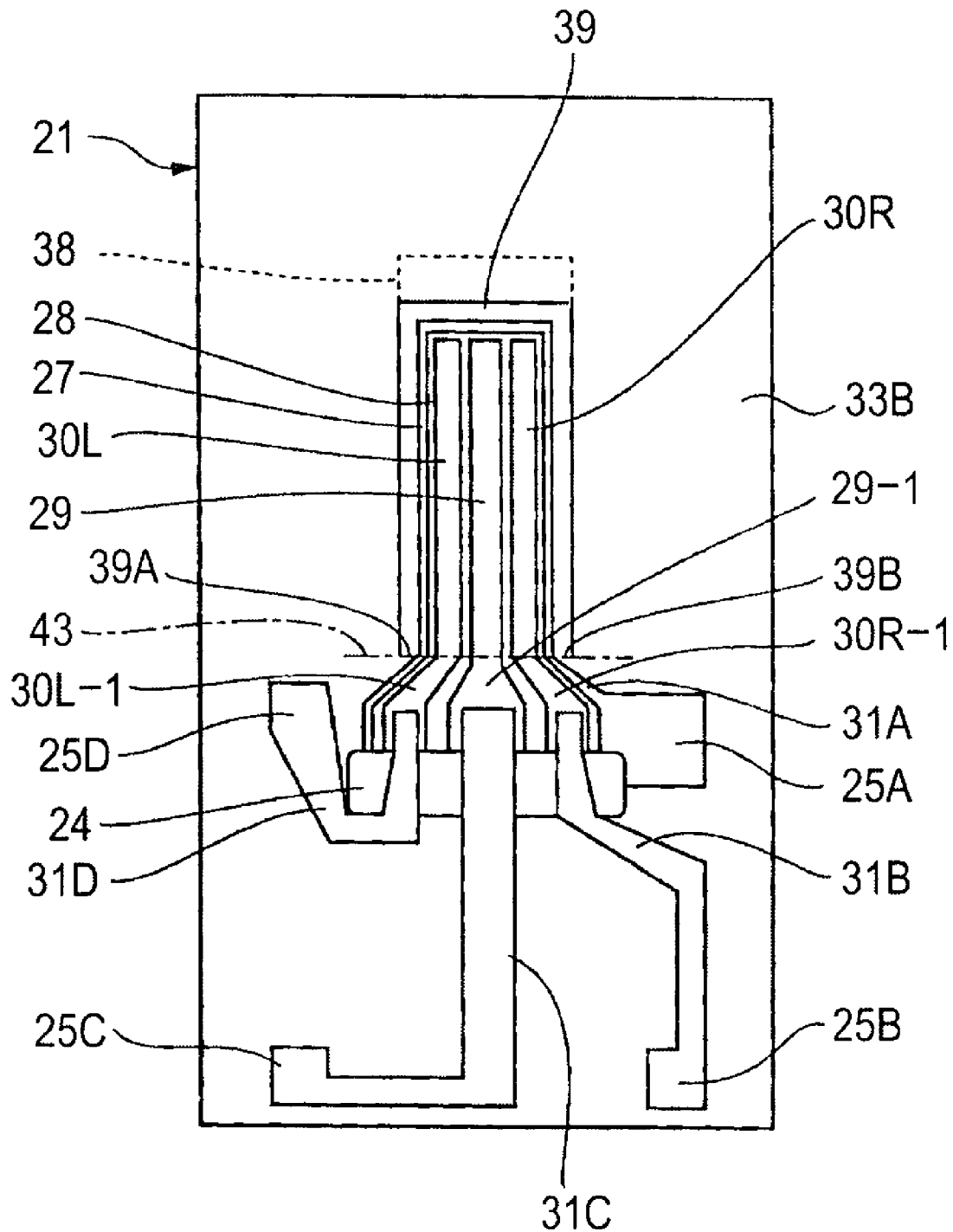
FIG. 35 is a plan view of a principal portion in which an outside groove is formed for forming a vibrator part.
Figure 36:
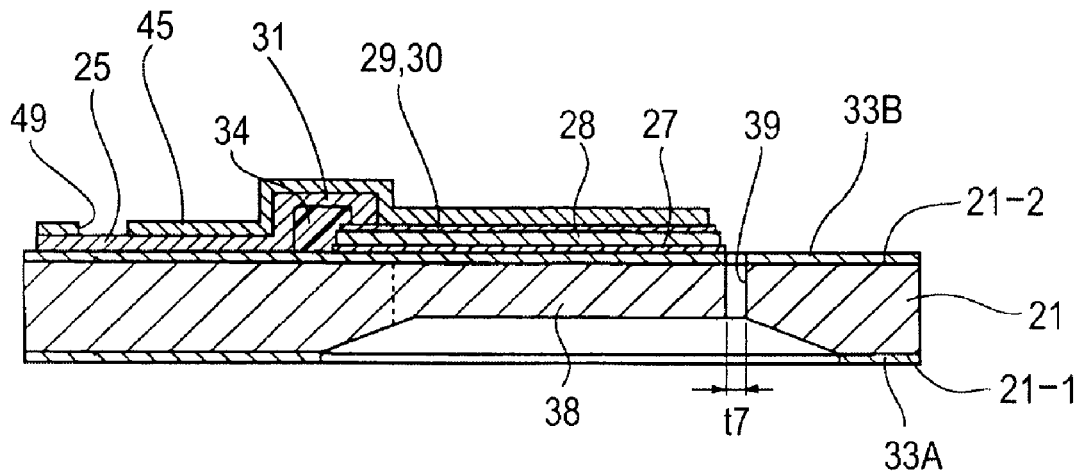
FIG. 36 is a sectional view of the principal portion shown in FIG. 35, as viewed from a direction perpendicular to the longitudinal direction of the vibrator part.
Figure 37:
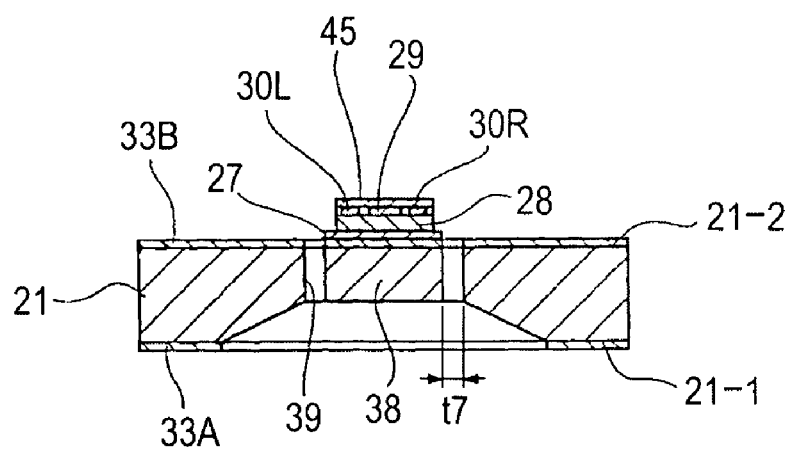
FIG. 37 is a sectional view of the principal portion shown in FIG. 35, as viewed from the longitudinal direction of the vibrator part.

In the outer shape grooving step, an outside groove 39 is formed around the periphery of each vibrator part 23 to pass through the diaphragm part 38. In this step, as shown in FIGS. 35 to 37, the outside groove 39 is formed as a U-shaped through groove from the second main surface 21-2 of the silicon substrate 21 which faces the diaphragm parts 38 so as to surround each vibrator part 23 and extend from the start end 39A at one of the sides of the root position 43 of each vibrator part 23 to the finish end 39B at the other aide of the root position 43. As described above, the outside groove 39 is formed to have the width dimension t7 of 200 μm.

Specifically, the step of forming the outside groove includes a first etching step of removing a U-shaped portion in a predetermined form of the silicon oxide film 33B to expose the second main surface 21-2 of the silicon substrate 21, and a second etching step of forming the outside groove 39 in the exposed portion of the silicon substrate 21.

In the first etching step, a photosensitive photoresist layer is formed over the entire surface of the silicon oxide film 33B and subjected to photolithographic treatment to form a U-shaped aperture pattern surrounding the formation region of the electrode layers, the aperture pattern having an opening size which is the same as the outer dimension of each vibrator 23. In this step, the silicon oxide film 33B exposed through the aperture pattern is removed by ion etching. Although, in the first etching step, the silicon oxide film 33B may be removed in a U-shaped form, for example, by wet etching, ion etching is preferred in view of the occurrence of dimensional error due to side etching.

In the second etching step, the remaining silicon oxide film 33B is used as a resist film (etching protective film). In this step, for example, the silicon substrate 21 is subjected to reactive ion etching, for achieving a proper etching ratio to the resist film (silicon oxide film 33B) and forming a high-precision vertical surface as the outer periphery of each vibrator part 23.

In the second etching step, a reactive ion etching (RIE) apparatus having the function to produce inductively coupled plasma (ICP) is used for producing a high-density plasma. This step uses a Bosch (Bosch Corp.) process in which an etching step of introducing SF6 gas to an etching portion and a step of introducing C4F8 gas to form a protective film for protecting the outer periphery of the etched portion are repeated. As a result, the outside groove 39 having a vertical inner wall is formed in the silicon substrate 21 at a rate of about 10 μm per minute.

After the second etching step, a step of removing the etching step layer 70 formed on the first main surface 21-2 of the silicon substrate 21 is preformed. In this step, the etching stop layer 70 composed of silicon oxide is removed by, for example, wet etching with ammonium fluoride. Since, in the step of removing the etching stop layer, the insulating protective layer 45 is also removed by removing the photoresist layer formed in the step of forming the outside groove, the photoresist layer is removed after removing the etching stop layer 70.

(Polarization Step)

Then, the polarization step is performed for simultaneously polarizing the piezoelectric thin films 28 formed on the respective vibrating elements 20 on the silicon oxide substrate 21. The polarization is performed using Cu wiring as polarization wiring. After the polarization, the c Cu wiring is easily dissolved by wet etching and removed without damage to the vibrating elements 20. The polarization wiring is not limited to the Cu wiring, and an appropriate conductor exhibiting the above-described function may be used for the wiring.

The Cu wiring is formed by a liftoff method in which a resist layer pattern having an aperture with a predetermined shape is formed on the second main surface 21-2 of the silicon substrate 21 by, for example, photolithographic treatment, a Cu layer is deposited by sputtering, and the Cu layer is removed from unnecessary portions together with the resist layer. For example, the Cu wiring has a width dimension of 30 μm or more and a thickness of about 400 nm, for securing conduction during the polarization.

The polarization step is effectively performed by simultaneously connecting the vibrating elements 20 to an external power supply through application-side pads formed in the Cu wiring and ground-side pads. In the polarization step, each pad is connected to the external power supply by, for example, were bonding, and polarization is performed by conduction at 20 V for 20 minutes. The polarization is not limited to this step, and the polarization may be performed by an appropriate connection method under proper polarization conditions.

(Step of Forming Gold Bumps)

Next, the step of forming the gold bumps is performed. As descried above, each of the vibrating elements 20 is mounted on the support substrate 2, and thus the gold bump 26 is formed on each terminal part 25. In the step of forming the gold bumps 26, a stud bump having a predetermined shape is formed by pressing a gold wiring bonding tool to each terminal part 25. In this step, if required, dummy bumps are also formed on each base part 22. The gold bumps 26 may be formed by another method, for example, a plating bump method which will be described below.

The plating bump method includes a step of forming a plating resist layer having a predetermined aperture on each terminal part 25, a step of plating gold to grow a gold plating layer to a predetermined height in each aperture, and a step of removing the resist layer. In the step of forming the gold bumps, the thickness (height) of the gold bumps 26 is limited by plating conditions, and the gold bumps 26 having a predetermined height may not be formed. In the step of forming the gold bumps, when the desired gold bumps 26 are not obtained by first plating, second plating may be performed again using the first plating layer as an electrode to form so-called stepped gold bumps 26.

The method for the step of forming the gold bumps 26 is not limited to the above-described methods, and bumps may be formed by, for example, vapor deposition, transfer, or the like which is carried out in a semiconductor process. Although not described in detail, in the process for manufacturing the vibrating elements, a so-called bump vibrating metal layer of TiW, TiN, or the like is formed for improving the adhesion between the gold bumps 26 and the terminal parts 25.

(Cutting Step)

Next, the cutting step is performed for cutting the silicon substrate 21 in to the respective vibrating elements 20. In the cutting step, a portion corresponding to each base part 22 is cut with, for example, a diamond cutter or the like to cut into the respective vibrating elements 20. In this step, cutting grooves are formed by a diamond cutter, and then silicon substrate 21 is cut by bending. The cutting step may be performed using a grindstone or polishing using plane orientations of the silicon substrate 21.

In the above-descried process for manufacturing the vibrating elements, for example, when vibrator parts are integrally formed on the adjacent sides of a common base part 22, the number of the vibrating elements obtained from the silicon substrate (wafer) 21 may be significantly increased, as compared with biaxial integrated vibrating elements for obtaining detection signals in two axis directions.

(Step of Forming Reinforcing Part)

The reinforcing part 129 formed at the base end of each vibrator part 22 is formed in the above-described process for manufacturing the vibrating elements. In forming the reinforcing parts 129, the both ends 39A and 39B (FIG. 35) of the outside groove 39 for cutting out the outline of each vibrator part 23 are formed at intermediate positions in the etched inclined surface 133 formed on the inner peripheral wall of each etched recess 37 in the step of forming the outside groove. In the cutting step, the silicon substrate 21 is cut corresponding to the outer side of each base part 22, as described above. However, the substrate 21 is cut at an intermediate position so that both ends 29A and 39B of the outside groove 39 are connected to the corresponding portions of the side 22-3 of each base part 22. In this manner, as shown in FIG. 8, the base end of each vibrator part 23 has a shape in which the thickness gradually increases toward the outer side 22-3 due to the inclination of the etched inclined surface 133. As a result, the vertical reinforcing part 129V of each reinforcing part 129 is formed.

On the other hand, in the step of forming the outside groove, when both ends 39A and 39B of the outside groove 39 disposed at the base end (root position 43) of each vibrator part 23 are cut by etching, both ends 39A and 39B of the outside groove 39 are formed in a covered shape without using a special operation. Therefore, according to this embodiment, the horizontal reinforcing part 129H of each reinforcing part 129 is formed using the curved shape of both ends 39A and 39B of the outside groove 39.

(Mounting Step)

Each of the vibrating elements 20 manufactured by the above-descried steps is mounted on the first main surface 2-1 of the support substrate 2 by the surface mounting method, the second main surface 21-2 of the silicon substrate 21 being used as the mounting surface. In the vibrating element 20, the gold bumps 26 provided on the respective terminal parts 25 are aligned with the corresponding lands 4 on the support substrate side. In this case, as described above, the alignment marks 32 of each vibrating element 20 are read, and then the vibrating element 20 is positioned by the mounting machine with high positional precision and directional precision.

Each vibrating element 20 is mounted on the first main surface 2-1 of the support substrate 2 by ultrasonically welding the gold bumps 26 with the corresponding lands 4 while the vibrating element 20 is pressed on the support substrate 2. The IC elements 7 and the electronic components 8 are mounted on the first main surface 2-1 of the support substrate 2, and each vibrating element 20 is subjected to the adjustment step which will be describe below. Then, the cover member 15 is attached to complete the vibrating element 20.

As described above, according to this embodiment, a plurality of vibrating elements 20 is simultaneously produced on the silicon substrate 21, the vibrating elements 20 each including the vibrato part 23 integrally formed with the base part 22, and then the silicon substrate 21 is cut into the respective vibrating elements. Then, the first and second vibrating elements 20X and 20Y having the same shape are mounted on two axes at an angle of 90° on the first main surface 2-1 of the support substrate 2 to produce the vibrating gyrosensor 1 for obtaining detection signals in the two axes.

(Step of Forming Chamfered Parts and Melted Surfaces)

In the process for manufacturing the vibrating elements, the chamfered parts 130 or the melted surfaces 134 are formed on each vibrator part 23 using a laser device for the adjustment step which will be described below. When the chamfered parts 130 or the melted surfaces 134 are formed on each vibrator part 23 with a laser after the adjustment step, a balance may be broken. Therefore, this forming step is performed before the adjustment step.

In the second etching step, micro liner irregularities 127 (refer to FIG. 9A) occur, by plasma flows, on the sides and the first main surface (upper surface) 23-1 of each vibrator part 23 and the edges therebetween. In the step of forming the chamfered parts 130 of the melted surfaces 134, as shown in FIG. 9B, predetermined portions of each vibrator part 23 are irradiated with laser to melt the surfaces, thereby removing the micro irregularities 127 and forming the vibrating element 20 having improved mechanical strength. This step may be continuously performed in a series of steps using the laser device used in the next adjustment step.

(Adjustment Step)

In the step for manufacturing the vibrating elements, as described above, the vibrator part 23 of each vibrating element 20 is precisely cut off from the silicon substrate 21 by etching using inductively coupled plasma. However, it may be difficult to form each vibrator part 23 symmetric with respect to the emission center line of the plasma depending on the conditions such as material yield and the like. Therefore, variations may occur in the shape of each vibrator part 23 due to a positional shift of each vibrating element 20, various step conditions, or the like. For example, when the vibrator part 23 of each vibrating element 20 is formed to have a trapezoidal or parallelogram sectional shape, the vibrator part 23 performs a vibration operation inclined toward a small-mass side from the center axis direction of vertical vibration, as compared with a vibrator part 23 having a normal rectangular sectional shape (refer to FIG. 48).

Therefore, the adjustment step is performed for correcting a vibration state by laser-polishing a large-mass side at a predetermined position of each vibrator part 23. In the adjustment step, since it may be difficult to directly observe the sectional shape of each vibrator part 23 having a small sectional shape, variations in the sectional shape of the vibrator part 23 are observed by a method in which the vibrator part 23 of each of the cut vibrating elements 20 is vibrated at a predetermined longitudinal resonance frequency to compare the magnitudes of right and left detection signals. In the adjustment step, when a difference occurs between the right and left detection signals, the vibrator part 23 is partially laser-cut on the side outputting a smaller detection signal.

Figure 38C:
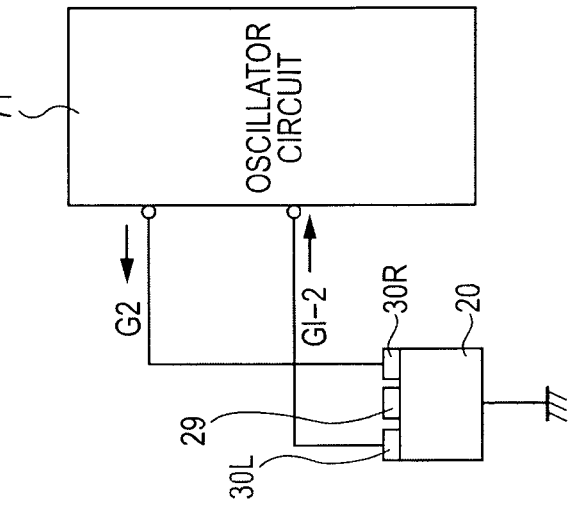
FIGS. 38A, 38B, and 38C are drawings illustrating a step for controlling a vibrator part.
Figure 38B:
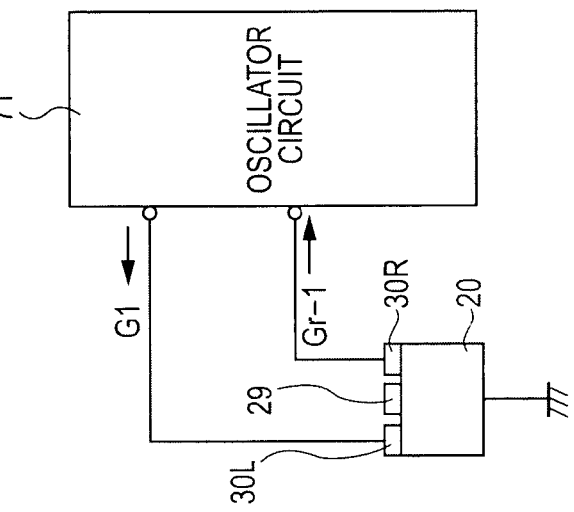
Figure 38A:
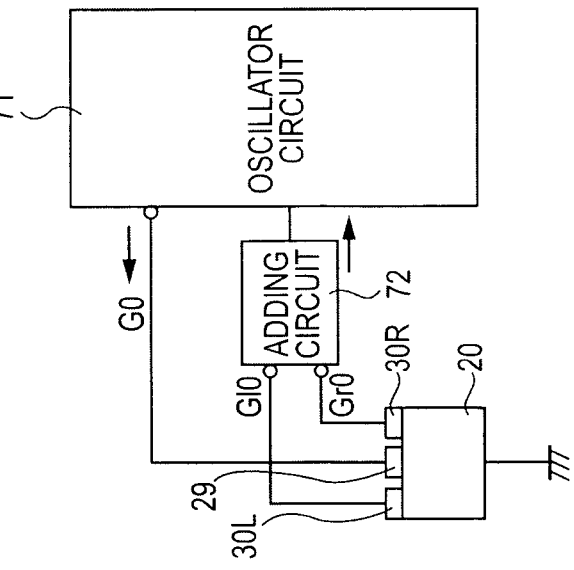

For example, before adjustment, oscillation output G0 of the oscillator circuit 71 is applied to the driving electrode layer 29 to vibrate the vibrating element 20 in a longitudinal resonance state, as shown in FIG. 38A. In the adjustment step, the detection signals Gl0 and Gr0 output from the pair of the detection electrodes 30R and 30L are combined by the adding circuit 72, and the addition signal is returned to the oscillator circuit 71. Then, on the basis of the detection signals Gl0 and Gr0 obtained from the detection electrodes 30L and 30R, the oscillation frequency of the oscillator circuit 71 is measured as a longitudinal resonance frequency f0, and a difference between the detection signals Gl0 and Gr0 is measured as a differential signal.

In the adjustment step, as shown in FIG. 38B, the oscillation output G1 of the oscillator circuit 71 is applied to the detection electrode 30L to drive the vibrating element 20 in a transverse resonance state. In this step, the detection signal Gr-1 output from the detection electrode 30R is returned to the oscillator circuit 71, and on the basis of the detection signals Gr-1, the oscillation frequency of the oscillator circuit 71 is measured as a transverse resonance frequency f1. Since the transverse resonance frequency f1 obtained from the detection signal Gr-1 is equal to the transverse resonance frequency f2 obtained from the detection signal Gl-1, the transverse resonance frequency is measured by connecting to any one of the detection electrodes 30L and 30R.

Furthermore, as shown in FIG. 38C, the oscillation output G2 of the oscillator circuit 71 is applied to the detection electrode 30R to drive the vibrating element 20 in a transverse resonance state. In this step, the detection signal Gl-2 output from the detection electrode 30L is returned to the oscillator circuit 71, and on the basis of the detection signals Gl-2, the oscillation frequency of the oscillator circuit 71 is measured as a transverse resonance frequency f2. In the adjustment step, differences between the longitudinal resonance frequency f0 and the transverse resonance frequencies f1 and f2 obtained by the measurement are used as degrees of detuning, and decision is made as to whether or not the degrees of detuning are within a predetermined range. Also, in the adjustment step, decision is made as to whether or not the differential signal detected by the detection electrodes 30L and 30R is within a predetermined range.

In the adjustment step, on the basis of the decision results of the degrees of detuning and the differential signal, an adjustment position of the vibrator part 23 is determined from the magnitudes thereof, and a portion of the vibrator part 23 is polished by laser irradiation. The adjustment step is performed by the same measurement and leaser processing as described above until the decision results of the degrees of detuning and the differential signal reach the target values.

The adjustment step uses a laser device having a controllable spot diameter and emitting a laser at a wavelength of 532 nm. In the adjustment step, for example, an edge between a side and the first main surface 23-1 is adjusted by irradiating an proper portion in the length direction with the laser. Since, in each of the vibrating elements 20, changes in both a frequency difference and a detection signal balance by laser irradiation adjustment decrease from the base end to the tip end of the vibrator part 23, the base end side may be roughly adjusted, and the tip end may be finely adjusted.

Since the adjustment step performed for the vibrating element 20 mounted on the support substrate 2, re-adjustment after mounting, which is preformed when the adjustment is performed before mounting, may not be performed, thereby increasing the productivity of the vibrating gyrosensor 1. In this case, a region irradiated by the adjustment laser is on the upper surface 23-2 side of the vibrator part 23, and thus excellent adjustment workability is exhibited after mounting. Since the piezoelectric layer and the electrode layers are not formed on the upper surface 23-2 of each vibrator part 23, the influences of the adjustment, such as a change in the characteristics of the piezoelectric thin film layer 28 due to the heat generated by laser processing, a change in the polarization state, and the like, may be prevented as much as possible.

In the vibrating gyrosensor 1, when an AC voltage at a predetermined frequency is applied to the driving electrode layer 29 in each vibrating element 20 from the corresponding driving detection circuit part 50, the vibrator part 23 vibrates at a natural frequency. The vibrator part 23 resonates at a longitudinal resonance frequency in the longitudinal direction, which is the thickness direction, and also resonates at a transverse resonance frequency in the transverse direction, which is the width direction. The sensitivity of the vibrating element 20 increases as a difference between the longitudinal resonance frequency and the transverse resonance frequency, which refers to the degree of detuning, decreases. In the vibrating gyrosensor 1, as described above, when the outer periphery of each vibrator part 23 is formed with high precision by crystal anisotropic etching and reactive ion etching, a satisfactory degree of detuning is obtained.

In each of the vibrating elements 20, the characteristics of the longitudinal resonance frequency are significantly affected by the precision of the length dimension t5 of the vibrator part 23. As described above, at the root position 43 in each vibrating element 20, which defines the length dimension t5 of the vibrator part 23, when deviation occurs between the (100) surface of the diaphragm part 38 formed by crystal anisotropic etching, the (111) surface which corresponds to each etched inclined surface 133 at an angle of 55°, and the boundary line corresponding to a flat surface, the degree of detuning increases according to the amount of deviation.

Namely, in each of the vibrating elements 20, the amount of deviation is caused by a positional shift between the resist pattern formed on the silicon oxide film 33B in crystal anisotropic etching and the resist film pattern formed in reactive ion etching. Therefore, for example, each of the vibrating elements 20 may be positioned using a both side aligner capable of simultaneously observing the first and second main surfaces 21-1 and 21-2 of the silicon substrate 21. Alternatively, appropriately positioning patterns or marks may be formed on the first and second main surfaces 21-1 and 21-2 of the silicon substrate 21 so that each vibrating element 20 is positioned by an alignment device performing one-side alignment on the basis of these patterns or marks. This positioning method may be applied to the step of mounting each vibrating element 20 on the support substrate 2.

When the amount of deviation in each vibrating element 20 is in a range smaller than about 30 μm, the longitudinal resonance frequency substantially the same as the transverse resonance frequency. Therefore, in each vibrating element 20, a decrease in the degree of detuning due to the amount of deviation is substantially suppressed by an etching step with slightly higher precision, and the vibrating element is manufactured without the above-descried positioning method using the alignment device.

(Effect of Reinforcing Part)

As described above, in the vibrating gyrosensor 1 according to this embodiment, each of the vibrating elements 20 includes the vibrator part 23 having the reinforcing parts 129 (129V and 129H) formed at the base end and having a shape in which the sectional shape gradually increases toward the base part 22. Therefore, even when a large load is applied by mistaken drop of the main body device or the like, the breakage of each vibrator part 23 is prevented. It is confirmed by the analysis experiment below that the reinforcing parts 129 improve the mechanical strength of the vibrating part 23.

Figure 39:
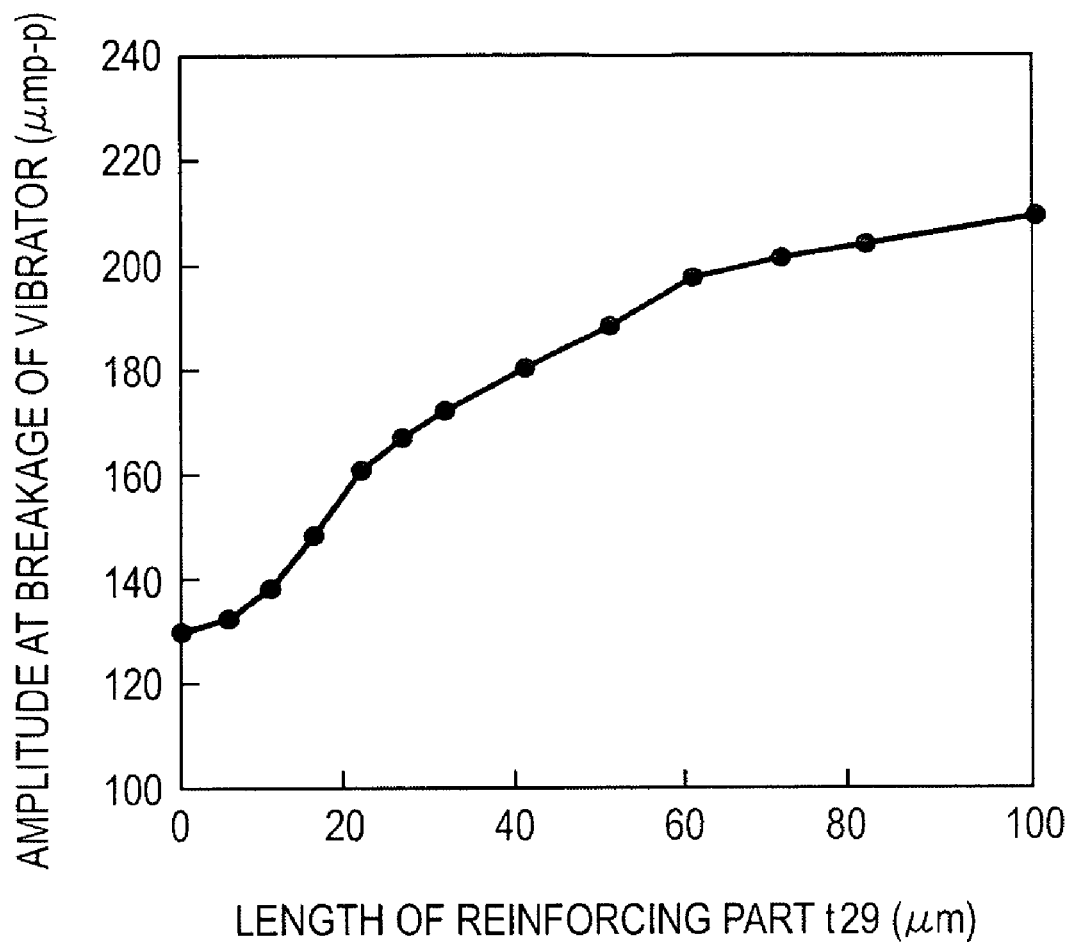
FIG. 39 is a graph showing the relation between the length dimension of a reinforcing part and the amplitude of a vibrator part.

Namely, in the analysis experiment, the vibrating elements 20 including reinforcing parts 129 having different length dimensions t29 are prepared, and increasing driving voltages are applied to the driving electrode layer 29 of each vibrating element 20 to forcedly vibrate the vibrator parts 23 at a high amplitude. The analysis experiment produced the results shown in FIG. 39 showing the relation between the amplitude at breakage of the vibrator part 23 and the length dimension of the reinforcing part 129 in each vibrating element 20. A computer simulation shows that a stress of about 0.5 GPa is produced at the base end of the vibrator part 23 at an amplitude of 100 μm in each vibrating element 20.

FIG. 39 shows the amplitude (μmp-p) at breakage of the vibrator part 23 on the ordinate and the length dimension t29 of the reinforcing part 129 (μm, the first and second vibrating elements 20X and 20Y having the same shape) on the abscissa. When the length dimension t29 of the reinforcing part 129 is zero, the vibrator part 23 is formed directly on the side 22-3 of the base part 22 without using the etched inclined surface 133 of the etched recess 37, and the reinforcing part 129 having a large sectional shape is not particularly formed in the vibrating element. The length dimension t29 of the reinforcing part 129 gradually increases by moving the base ends of the outside groove 39 toward the opening side along the etched inclined surface 133.

As seen from FIG. 39, it is confirmed that as the length dimension t29 of the reinforcing part 129 increases, the vibration (amplitude) at breakage of the vibrator part 23 increases, and thus the mechanical strength of each vibrating element 20 is increased. When the length dimension t29 of the reinforcing part 129 exceeds 60 μm, the mechanical strength of the vibrating element 20 is gently improved. Since, in each vibrating element 20, the vibrator part 23 is formed by cutting along the outside groove 39 passing through the silicon substrate 21 and formed in the silicon substrate 21 by etching, the efficiency of etching is decreased when the reinforcing part 129 having a large length dimension t29 is formed. Therefore, in each vibrating element 20, as described above, the length dimension t29 of the reinforcing part 129 is about 50 μm from the viewpoint of maintenance of a predetermined mechanical strength and the etching efficiency.

Figure 40A:
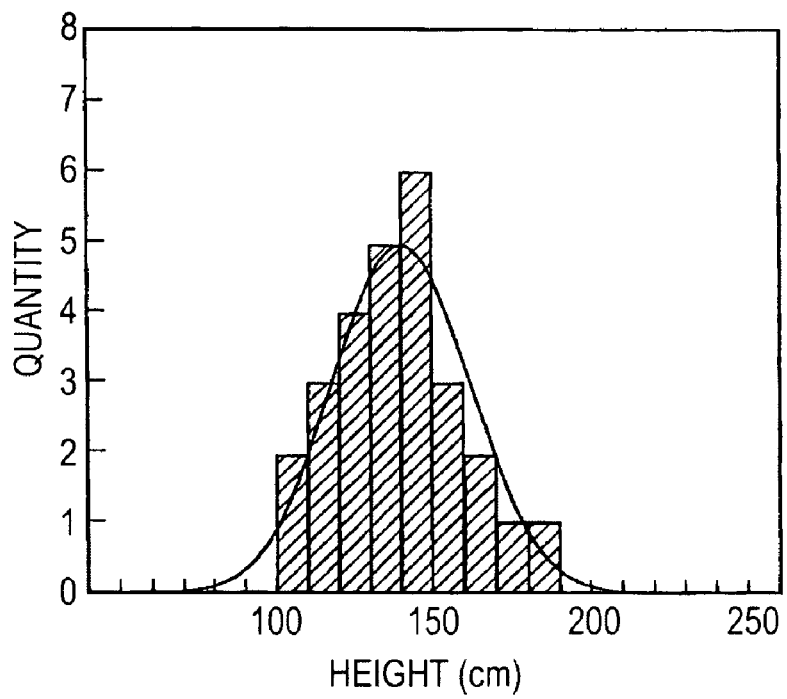
FIGS. 40A and 40B are graphs showing the results of a drop test.
Figure 40B:
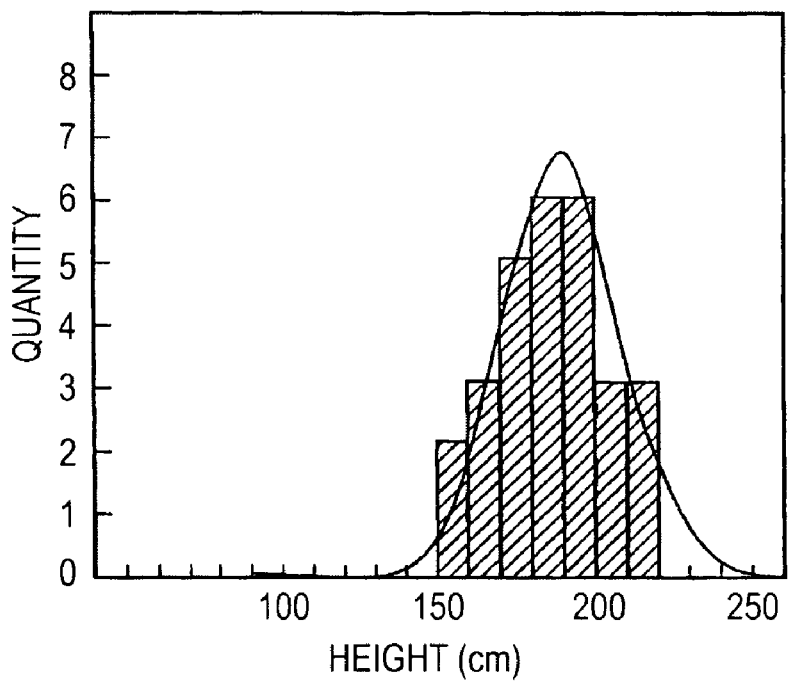

Next, the vibrating gyrosensor 1 provided with the above-described vibrating elements 20 and a vibrating gyrosensor provided with vibrating elements not having the reinforcing parts 129 were subjected to a drop test. The test results are shown in FIGS. 40A and 40B. In the drop test, assuming that the vibrating gyrosensor 1 was mounted on a Sony video camera "Handycam" used as the main body device for mounting the vibrating gyrosensor 1 thereon, a rigid body of 200 g was attached as a substrate to the vibrating gyrosensor 1, and the gyrosensor 1 was dropped at different heights using an appropriate guide mechanism for dropping in a constant attitude. In the drop test, a breakage state of each vibrator part 23 was observed.

FIG. 40A shows the results of the vibrating gyrosensor not having the reinforcing parts 129, the quantity being shown on the ordinate, and the drop height (cm) being shown on the abscissa. FIG. 40B shows the results of the vibrating gyrosensor 1 having the reinforcing parts 129. These figures indicate that the vibrating gyrosensor 1 is improved in strength to dropping from a height up to about 50 cm.

Figure 41:
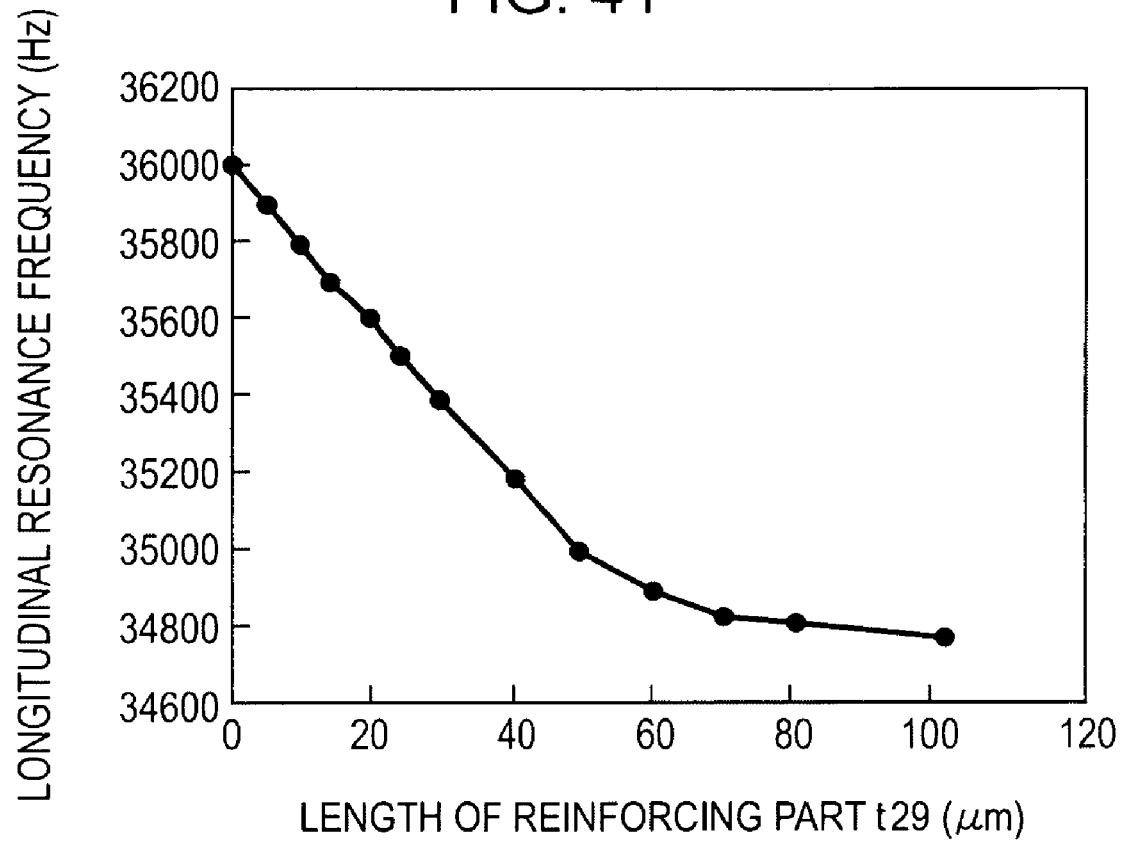
FIG. 41 is a graph showing the relation between the length dimension of a reinforcing part and longitudinal resonance frequency.

FIG. 41 is a graph showing the relation between the length dimension t29 of the reinforcing part 129 in the vibrating element 20 and the longitudinal resonance frequency. Since the whole length dimension t5 of each vibrator part 23 increases as the length dimension t29 of the reinforcing part 129, the longitudinal resonance frequency proportionally decreases. FIG. 40 also indicates that when the length dimension t29 of the reinforcing part 129 in each vibrating element 20 exceeds about 60 μm, changes in the longitudinal resonance frequency decrease. In each vibrating element 20, the thickness dimension increases as the length dimension t29 of the reinforcing part 129 increases, and also the rigidity also increases to decrease changes at the substantial start point of vibration and fix the start point, thereby decreasing changes in the longitudinal resonance frequency. Therefore, in each vibrating element 20, the maximum length dimension t29 of the reinforcing part 129 is preferably 60 μm or less from the viewpoint of the characteristics of the longitudinal resonance frequency.

In each vibrating element 20, only the reinforcing parts 129 are formed in the vibrator part 23, but the chamfered parts 130 or the melted surfaces 134 are not formed. When the chamfered parts 130 or the melted surfaces 134 are formed in each vibrating element 20, the mechanical strength of the vibrator part 23 is further improved, and the occurrence of breakage due to the micro irregularities 127 is also decreased to improve mechanical strength over the whole length of the vibrator part 23. In the vibrating element 20, it is also effective to form the chamfered parts 130 or melted surfaces 134 at the edges of the reinforcing parts 129.

(Effect of Insulating Protective Film)

Figure 42:
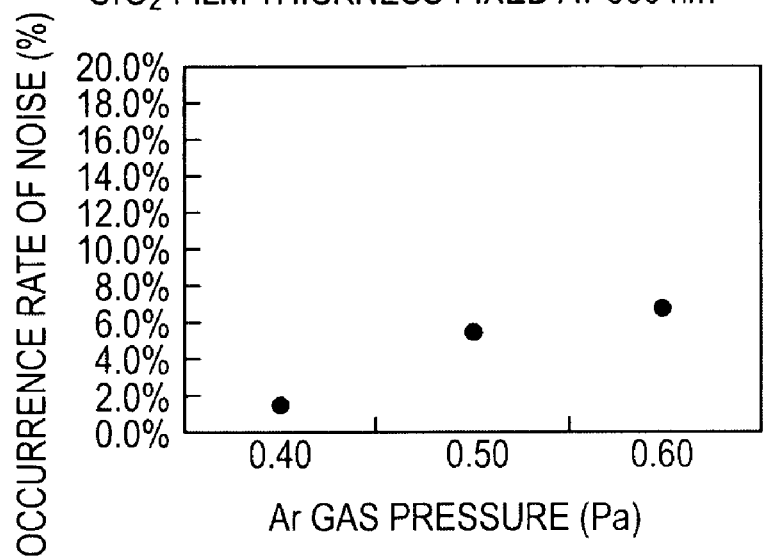
FIG. 42 is a graph showing the relation between the occurrence rate of noise and the gas pressure condition in a sputtering vessel for forming a silicon oxide layer of an insulating protective layer.

In the vibrating gyrosensor 1, as descried above, the vibrating elements 20 each having the insulating protective film for sealing the electrode layers and the like are provided. In the vibrating gyrosensor 1, the vibrating elements 20 having different characteristics are produced according to the argon pressure specifications of the sputtering vessel used in the step of forming the silicon oxide layer 47 of the insulating protective layer 45. FIG. 42 is a graph showing the occurrence rate of noise with changes in the output voltage of the vibrating gyrosensor 1 provided with the vibrating elements 20 each having the insulating protective layer 45, the insulating protective layer 45 being formed with the thickness dimension t27 fixed at 500 nm and the argon pressure changing from 0.4 Pa to 0.6 Pa.

FIG. 42 indicates that in the vibrating gyrosensor 1, the occurrence rate of noise increases as the argon pressure increases. In the vibrating gyrosensor 1, the density of the silicon oxide layer 47 decreases as the argon pressure increases, and thus the silicon oxide layer 47 does not sufficiently exhibit the insulating protective function. Therefore, as described above, the vibrating gyrosensor 1 includes the vibrating elements 20 each having the insulating protective layer 45 including the silicon oxide layer 47 formed at an argon pressure of 0.35 Pa, which is the discharge limit, to 0.4 Pa in the sputtering vessel.

Figure 43:
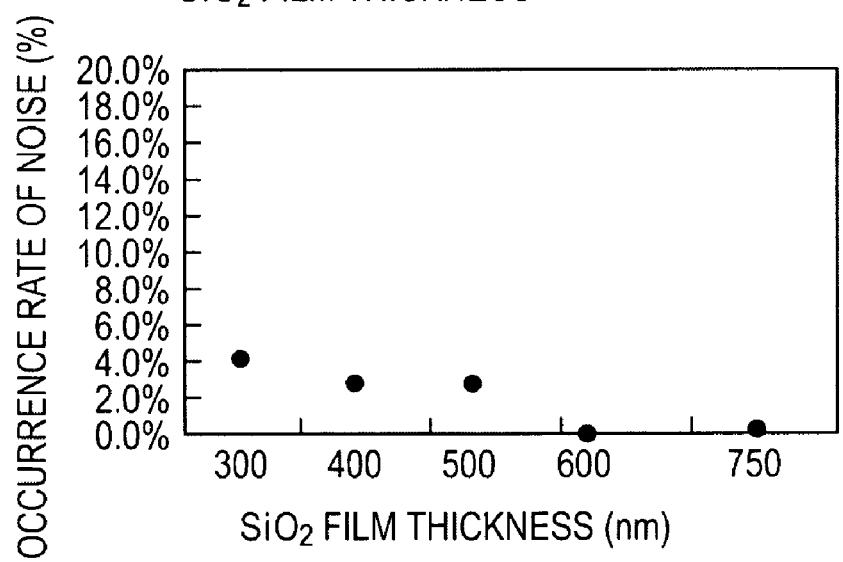
FIG. 43 is a graph showing the relation between the thickness of a silicon oxide layer and the occurrence rate of noise.

In the vibrating gyrosensor 1, the occurrence rate of noise at the output voltage also changes with the thickness dimension of the silicon oxide layer 47. FIG. 43 is a graph showing the occurrence rate of noise at the output voltage of the vibrating gyrosensor 1 with changes in the thickness of the silicon oxide layer 47 of the insulating protective layer 45, the silicon oxide layer 47 being formed on the second electrode layer 42 having a thickness of 300 nm at a constant argon pressure of 0.4 Pa in the sputtering vessel.

FIG. 43 indicates that in the vibrating gyrosensor 1, when the thickness of the silicon oxide layer 47 is less than 600 nm which is twice the thickness of the second electrode layer 42, the insulating protective function may not be sufficiently exhibited, thereby increasing the occurrence rate of noise. Therefore, the vibrating gyrosensor 1 includes the vibrating elements 20 each having the silicon oxide layer 47 formed to a thickness of 1 μm or less, which suppresses the occurrence of burr, and twice or more the thickness of the second electrode layer 42.

(Effect of Undoped Single Crystal Silicon Substrate)

In the process for manufacturing the vibrating elements, the first electrode layer 40, the piezoelectric film layer 41, and the second electrode layer 42 are formed on the second main surface 21-2 of the single crystal silicon substrate 21 by the semiconductor process. Then, these layers are subjected to predetermined patterning to produce the vibrating elements 20. A general semiconductor process uses a N-type or P-type silicon substrate doped with a doping element such as boron, phosphorus, or the like. Therefore, a general silicon substrate has a volume resistivity of several tens Ω·cm and a certain degree of conductivity to exhibit a ground function, the function as a lower electrode during thin film forming, and the like.

On the other hand, in this embodiment, a single crystal silicon substrate composed of undoped pure silicon, or a single crystal silicon substrate having a volume resistivity of 100 Ω·cm or more is used as the silicon substrate 21 in the process for producing the vibrating elements. The silicon substrate 21 has a very high resistance value and thus has low conductivity.

As described above, the silicon oxide film 33 is formed on each of the first and second main surfaces 21-1 and 21-2 of the silicon substrate 21 and functions as a protective film during etching or the like. In the process for producing the vibrating elements, in order to form each vibrator part 23 having a predetermined thickness, the silicon oxide films 33 are removed to form the etched recess 37 in the silicon substrate 21. When the photoresist material applied for etching contains foreign materials or the like, the silicon oxide films 33 on the silicon substrate 21 may be damaged. The silicon substrate 21 has stripes and cracks produced in the silicon oxide films 33, or damages produced in the process, and these defects are difficult to detect by examining the appearance.

When a general silicon substrate is used, the first electrode layer 40 formed as a thin film on the silicon oxide film 33B as descried above is caused to conduct with the silicon substrate through the above-described damages, and further conduct with the second electrode layer 42 through the silicon substrate 21 having high conductivity. In the process for producing the vibrating elements, when a conductive silicon substrate is used, the yield rate of short-circuit defect is about 20% as shown in FIG. 44B. In the process for producing the vibrating elements, when a general silicon substrate is used, preferably, the silicon oxide films 33 having a sufficient thickness are formed, and thus a high-precision test and sufficient process control are performed, thereby decreasing the efficiency.

Figure 44A:
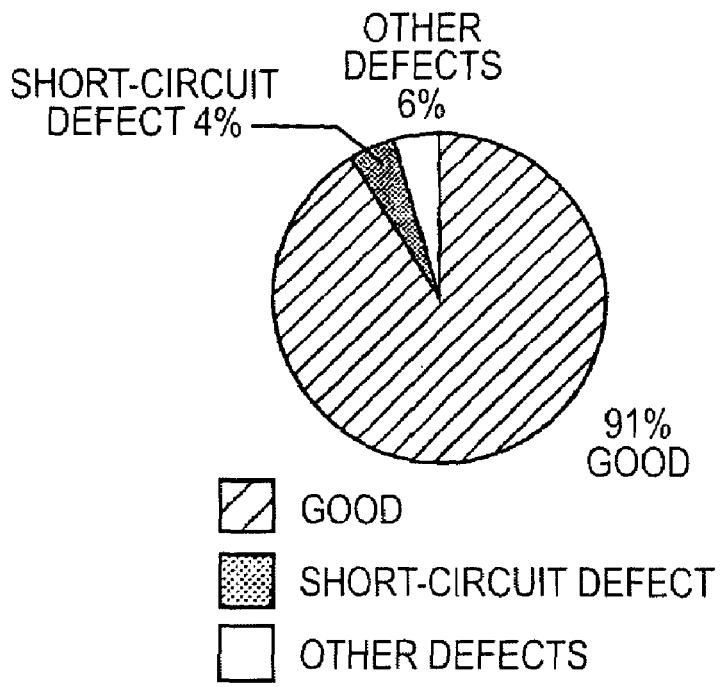
Figure 44B:
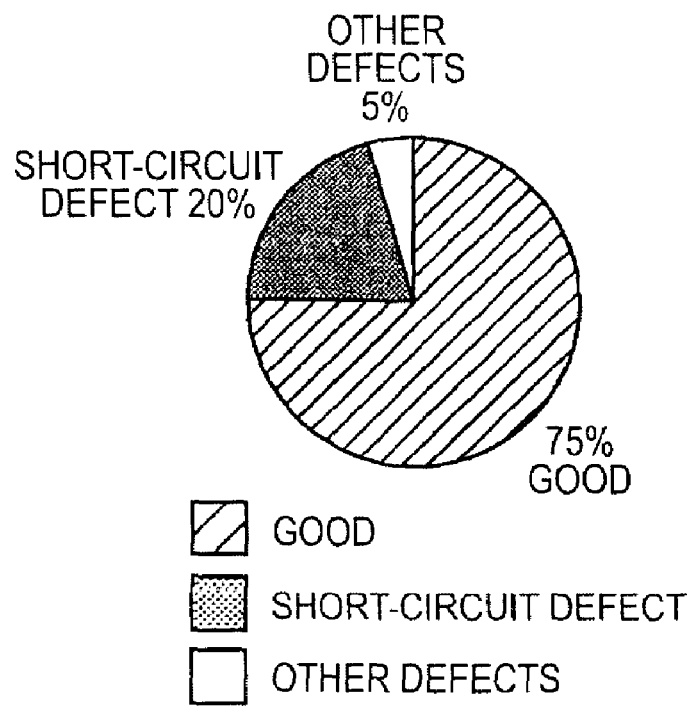

On the other hand, as described above, when the low-conductivity silicon substrate 21 is used for producing the vibrating elements 20, the rate of short-circuit defect is decreased to about 4%, as shown in FIG. 44A. In the process for producing the vibrating elements, the temperature control and gas control may be effectively performed in each step, and the high-precision film formation may be performed, thereby significantly improving the efficiency of the process.

Figure 45:
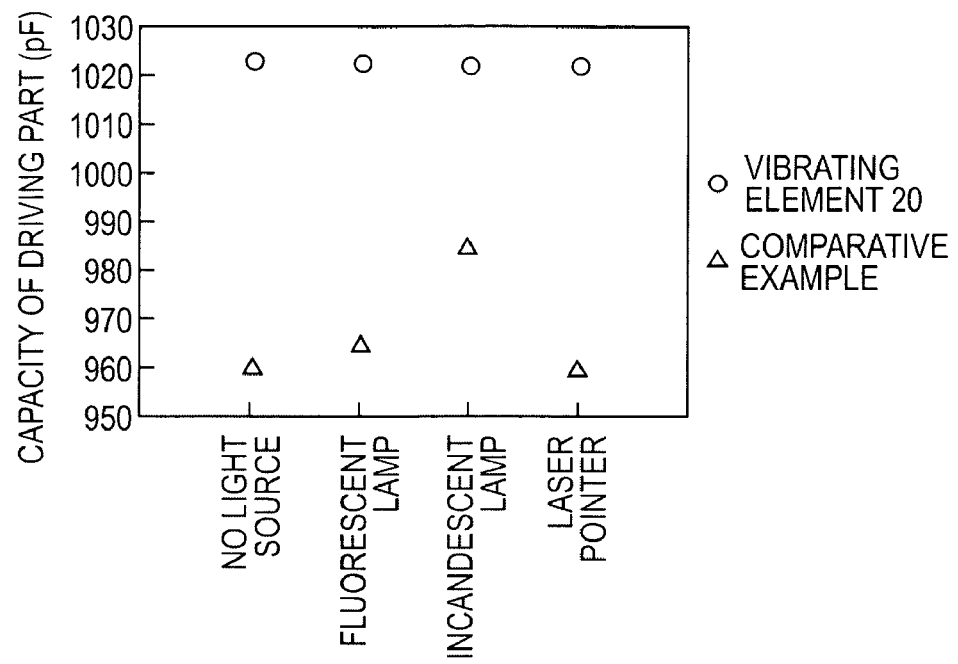
FIG. 45 is a graph showing changes in capacity due to external disturbance.

The vibrating gyrosensor 1 includes the vibrating elements 20 each produced using the low-conductivity silicon substrate 21 as a base material, and thus the operation is stable against external disturbances such as external light, heat load, and the like. FIG. 45 is a graph showing changes in the capacity of the piezoelectric thin film 28 in irradiation of the vibrating element 20 using the low-conductivity silicon substrate and a vibrating element of a comparative example using a general N- or P-type silicon substrate, the irradiation being performed with a fluorescent lamp, an incandescent light, and a laser pointer (red).

FIG. 45 indicates that in the vibrating element 20, the capacity of the piezoelectric thin film layer 28 is less changed by all light sources, and the operation is stable. On the other hand, in the vibrating element of the comparative example, the capacity is greatly changed by the incandescent lamp. Therefore, the vibrating element of the comparative example is easily affected by external light, thereby causing difficulty in a stable detection operation with high precision.

Figure 46:
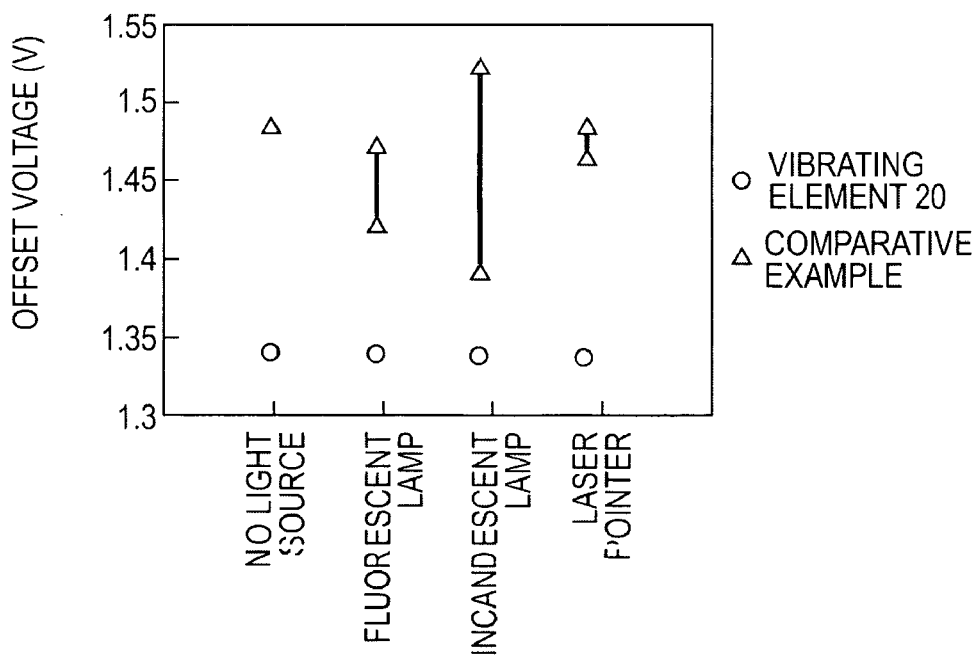
FIG. 46 is a graph showing changes in the offset voltage due to external disturbance.

FIG. 46 is a graph showing changes in the offset value of the output signal in external light irradiation of the vibrating element 20 and the vibrating element of the comparative example. In the vibrating gyrosensor 1, the offset voltage is previously applied to offset the output, in order to detect an angular velocity of the output value which varies with the rotation direction. FIG. 46 indicates that in the vibrating element 20, the offset voltage is little changed by all light sources, and the operation is stable. On the other hand, in the vibrating element of the comparative example, the offset voltage is greatly changed by all light sources, particularly the incandescent lamp. The operation of the vibrating element of the comparative example becomes unstable by the influence of external disturbance.

As described above, when the vibrating element 20 is produced using the low-conductivity single crystal silicon substrate 21 as a base material, a flow of a micro current produced by external light or heat load is suppressed due to the low conductivity, thereby possibly suppressing the influence on the piezoelectric thin film layer 28 and the electrode layers.

Figure 47:
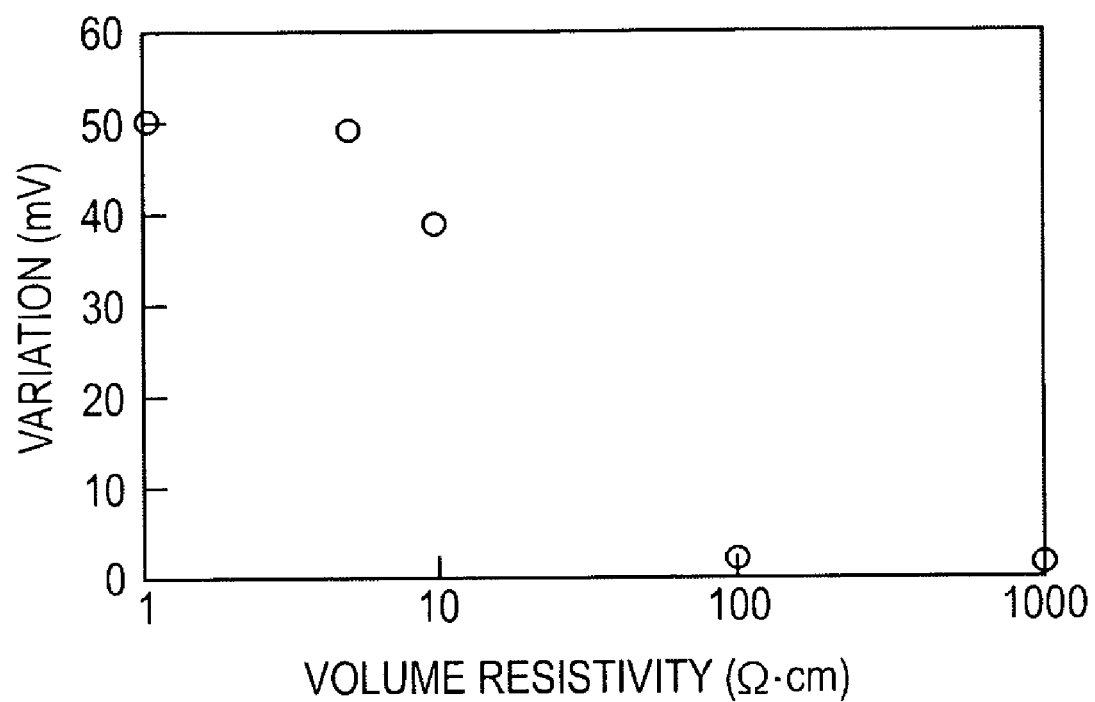
FIG. 47 is a graph showing variations in the offset voltage with changes in the volume resistivity of a silicon substrate.

FIG. 47 is a graph showing changes in the offset voltage values, under an incandescent lamp, of vibrating gyrosensors including vibrator elements produced using silicon substrates having different volume resistivities. FIG. 47 indicates that in the vibrating element produced using a general N- or P-type silicon substrate having a volume resistivity of several tens Ω·cm as the base material, the offset voltage value is greatly changed. On the other hand, in the vibrating gyrosensor including the vibrating element produced using the silicon substrate having a volume resistivity of 100 Ω·cm as the base material, the offset voltage value is little changed under the incandescent lamp, and the operation is stable.

Second Embodiment

In the above-described first embodiment, the ICP-RIE (inductively coupled plasma reactive ion etching) method is used in the step of forming the outside groove 39 for cutting off the outer shape of each vibrator part 23 from the silicon substrate 21. This method is excellent in that a vertical groove is formed in the silicon substrate 21 at a high aspect ratio.

Figure 48A:
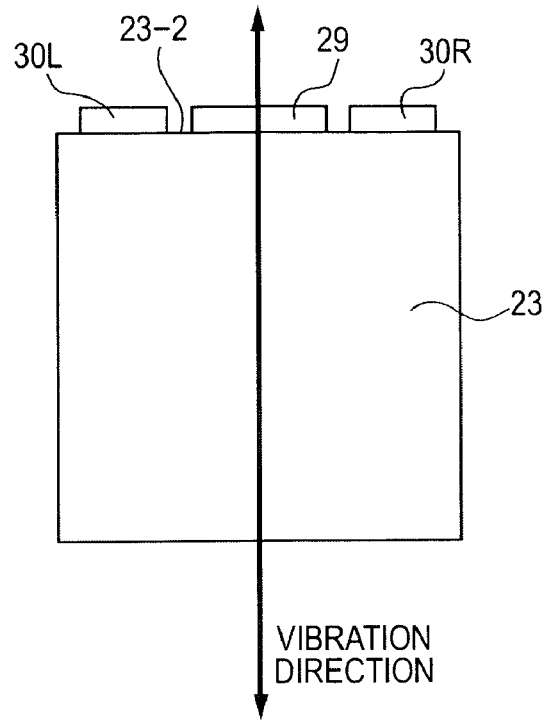
Figure 48B:
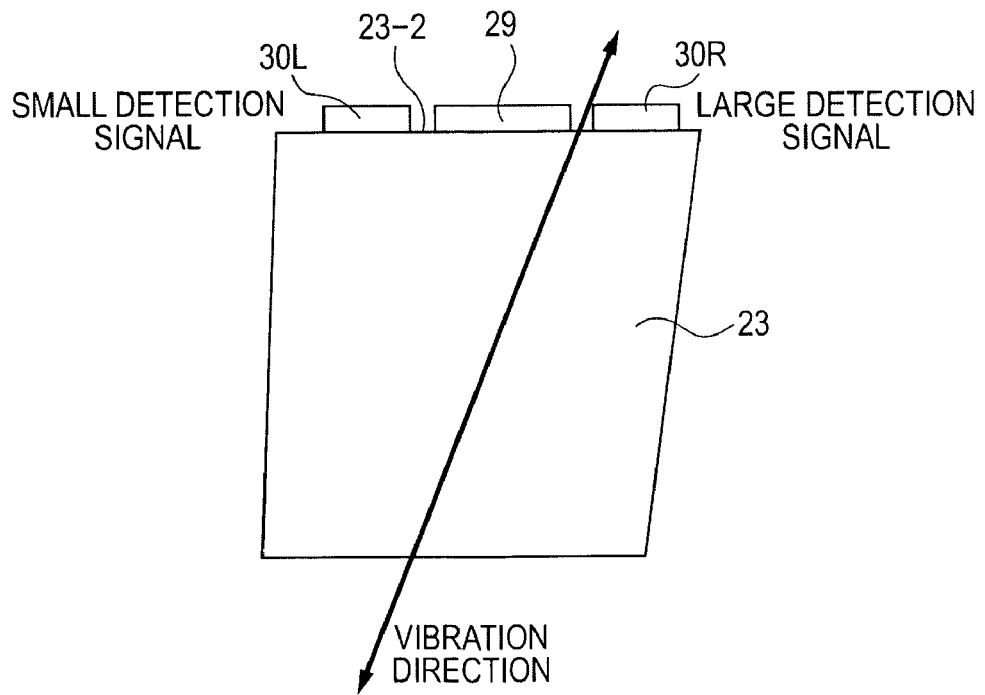

However, in use of the large silicon substrate 21 (large wafer diameter), as schematically shown in FIG. 48A, it may be difficult to form all vibrating parts 23 each having ideal vertical walls on both sides in the substrate. Namely, as schematically shown in FIG. 48B, the vibrator parts 23 having asymmetric shapes are formed in the peripheral region of the substrate due to a gas flow distribution, a plasma distribution, or the like in a plasma processing chamber.

When the vibrator part 23 has a symmetric shape, an ideal vibration mode in a vertical vibration direction occurs (FIG. 48A), and the detection signals output from the right and left detection electrodes 30R and 30L formed on the surface of the vibrator part 23 are balanced without a difference therebetween. However, when the vibrator part 23 has an asymmetric shape, the detection signals output from the right and left detection electrodes 30R and 30L are different and are not balanced (FIG. 48B). If the right and left detection signals are different, the detection amount of an angular velocity in the direction of rotation applied to the vibrator part 23 varies, or the sensitivity of the angular velocity of clockwise rotation is different from that of the angular velocity of counterclockwise rotation, thereby causing error.

On the other hand, in order to adjust the balance between the right and left detection signals, a predetermined region of the vibrator part 23 is polished by laser irradiation after the formation of the vibrating element. However, if the detection signals are balanced only by this method, the adjustment takes a long time. Also, only a difference of about 30% between the right and left signals may be adjusted by laser irradiation. Therefore, when the difference between the detection signals is larger than this value before the adjustment, the product may not be used to decrease the productivity.

In this embodiment, therefore, in order to the shorten the work time of the adjustment step and increase the rate of good products, the edges of the vibrator part 23, which are exposed from the outside groove 39, are overetched to an curved shape in the etching step of forming the outer shape of the vibrator part 23, as descried below.

Figure 49A:
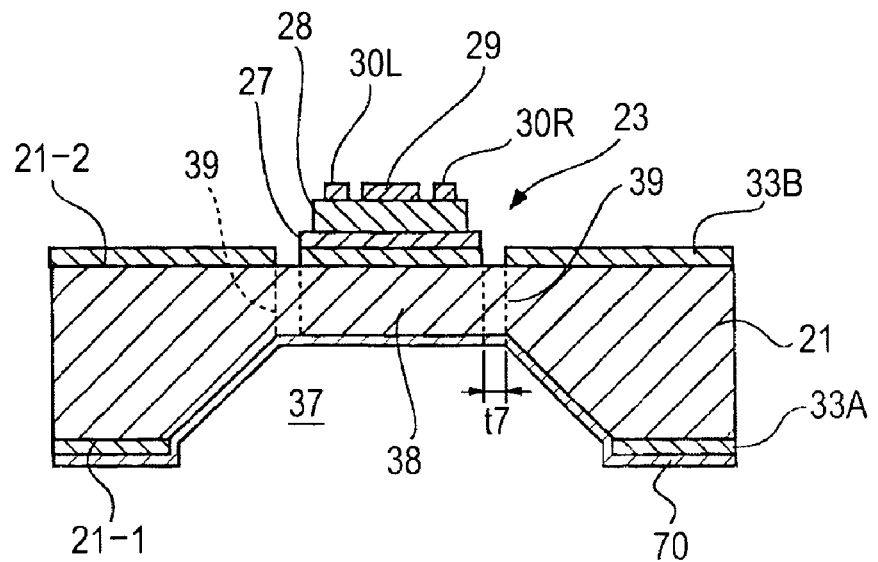

As shown in FIG. 49A, the U-shaped outside groove 39 formed for cutting out the outer shape of the vibrator part 23 is formed in the silicon substrate 21 by etching using, as a mask, the silicon oxide film 33B formed on the second main surface 21-2 of the silicon substrate 21. The etching is generally stopped when the processing depth in the etched recess 37 formed in the first main surface 21-1 of the silicon substrate 21 reaches a value for leaving the thickness of the diaphragm part 38. In this case, the amount of processing is limited by the etching stop layer 70 formed on the etched recess 37.

Figure 49B:
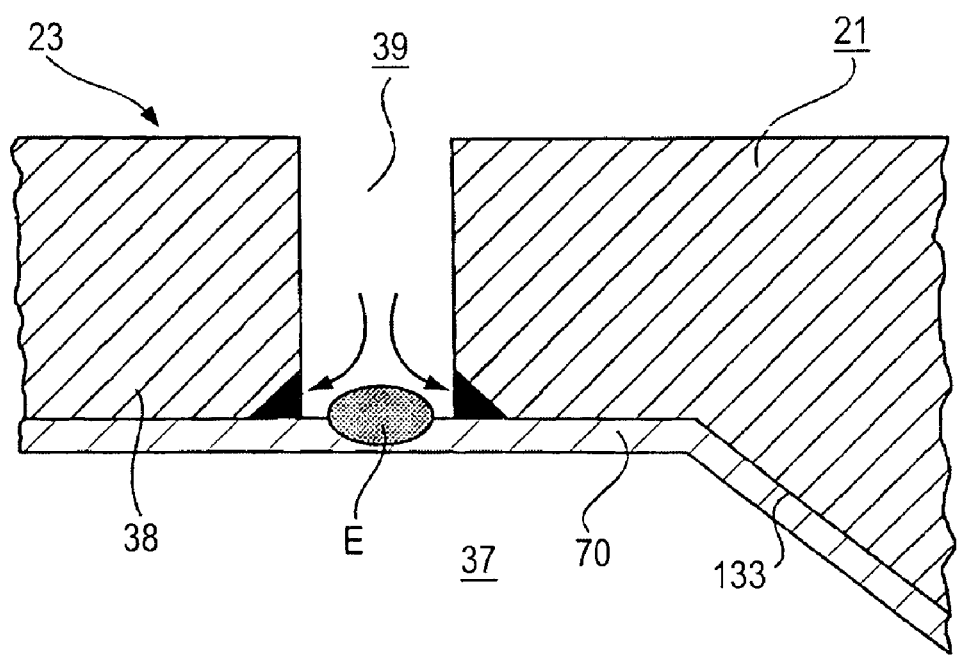

In the step of forming the outside groove 39, the etching is further continued after the bottom of the etched groove reaches the etching stop layer 70 (referred to as "overetching" hereinafter). As schematically shown in FIG. 49B, etching proceeds in the direction to the sides of the outside groove 39 at the bottom thereof by the influence of a charge and the etchant remaining on the etching stop layer 70 (denoted by "E" in FIG. 49B). As a result, as shown in FIG. 49B, the lower edges of the diaphragm part 38 (vibrator part 23) are polished to be formed in a tapered or curved shape.

This phenomenon is referred to as "notch" which is prevented by controlling etching conditions in a usual process. As the inclination of the outside groove 39 increases, the notch phenomenon significantly occurs at the edges at an acute angle with the etching stop layer 70. FIG. 49A is a sectional view of the vibrator part 23 as viewed in the longitudinal direction, and FIG. 49B is a sectional view of a principal portion of the vibrator part 23 as viewed in the direction vertical to the longitudinal direction.

In this embodiment, the deviation of the vibration mode due to asymmetry of the shape of each vibrator part 23 is decreased using the notch phenomenon caused by the overetching in the formation of the outside groove 39.

Figure 50A:
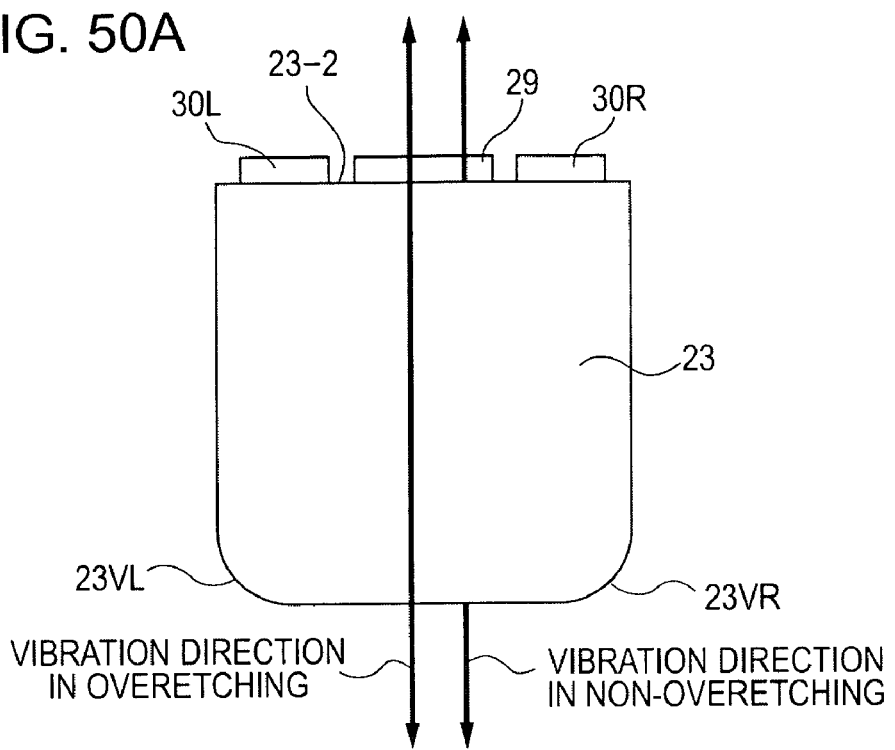
Figure 50B:
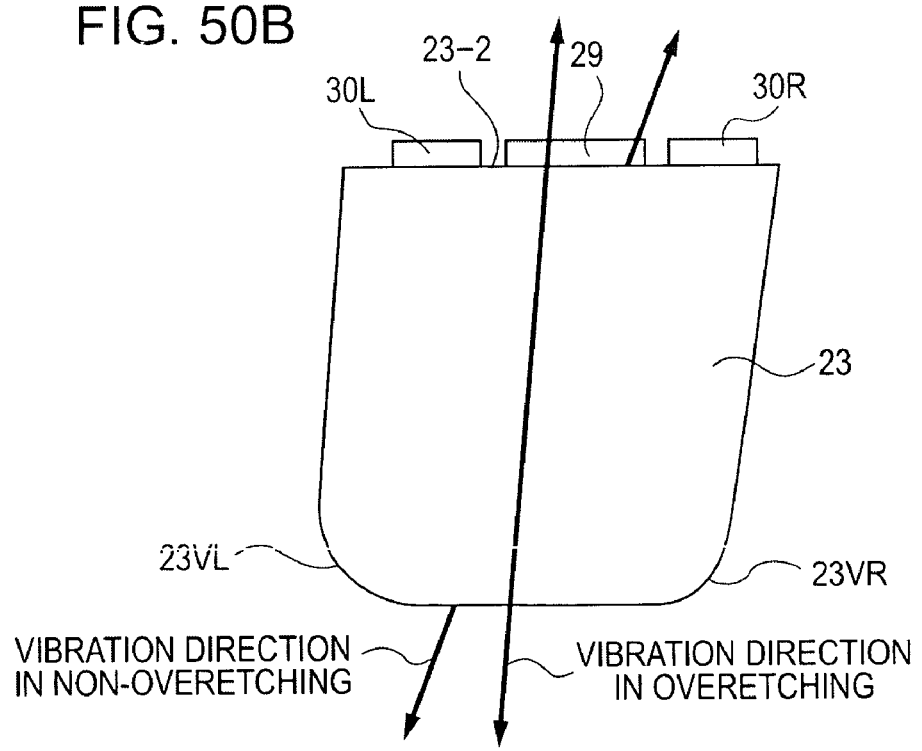

In the vibrator part 23 having an asymmetric shape shown in FIG. 48B, overetching of the vibrator part 23 as shown in FIG. 50B causes a vibration mode closer to a vertical vibration mode, as compared with the vibration mode of the vibrator part 23 produced by normal etching (non-overetching). This is because the more acute edge 23VL among the right and left edges 23VR and 23VL of the vibrator part 23 is processed in a larger amount to a curved shape by the notch phenomenon, and thus the asymmetry is reduced to improve the balance between the right and left weights of the vibrator part 23, thereby correcting the vibration mode to be closer to a vertical mode.

On the other hand, even in the vibrator part 23 having a symmetric shape shown in FIG. 48A, when the outside groove 39 is formed by overetching, the right and left edges 23VR and 23VL of the vibrator part 23 are formed in curved shapes by the notch phenomenon, as shown in FIG. 50A. However, in this case, the amounts of processing of the edges 23VR and 23VL are substantially the same, and thus the symmetry of the shape is not impaired, and the vertical mode is maintained like in the vibration mode in non-overetching.

In order to facilitate the understanding of description, FIGS. 40 and 50 each show the vibrator part 23 upside down. An actual vibrator part vibrates in a state in which the substrate-facing surface 23-2 faces downward, the detection electrodes 30 and the driving electrode 29 being formed on the substrate-facing surface 23-2.

The overetching may be controlled by, for example, the etching time, and the etching time may be set to be longer than that of the non-overetching. The amounts of processing of the edges 23VL and 23VR of the vibrator part 23 using the notch phenomenon may be appropriately controlled according to the specifications such as the size and shape of the vibrator part, the drive frequency, and the like. In the element shape according to the first embodiment, the amount of processing is 5 μm or more. However, if the amount of processing is excessively large, the strength of the vibrator part itself is decreased. Therefore, the amount of processing is preferably 20 μm or less.

As described above, according to this embodiment, in a vibrating element having a symmetric shape and an ideal vibration mode, the ideal vibration mode is maintained even when tapered or curved notches are produced at the lower edges of the vibrator part 23. Also, even in a vibrating element having an asymmetric initial shape and thus having an oblique vibration mode, the vibration mode becomes close to the vertical vibration mode by forming notches at the lower edges of the vibrator part 23. Therefore, even in a vibrating element which vibrates in an unbalanced vibration mode, which has been not sufficiently adjusted, the vibration mode may be adjusted by laser irradiation in the adjustment step, thereby improving the production yield.

As a result of confirmation by the inventors, the defective rate (yield rate) of vibrating elements produced from a single silicon substrate and causing a difference of less than 30% between right and left detection signals before the adjustment step is usually about 43%. However, according to this embodiment, the yield is increased to 87% which is twice the usual yield.

Third Embodiment

In the above-described first embodiment, the ICP-RIE method is used in the step of forming the outside groove 39 for cutting off the outer shape of each vibrator part 23 from the silicon substrate 21. This method is excellent in that a vertical groove is formed in the silicon substrate 21 at a high aspect ratio.

Figure 51:
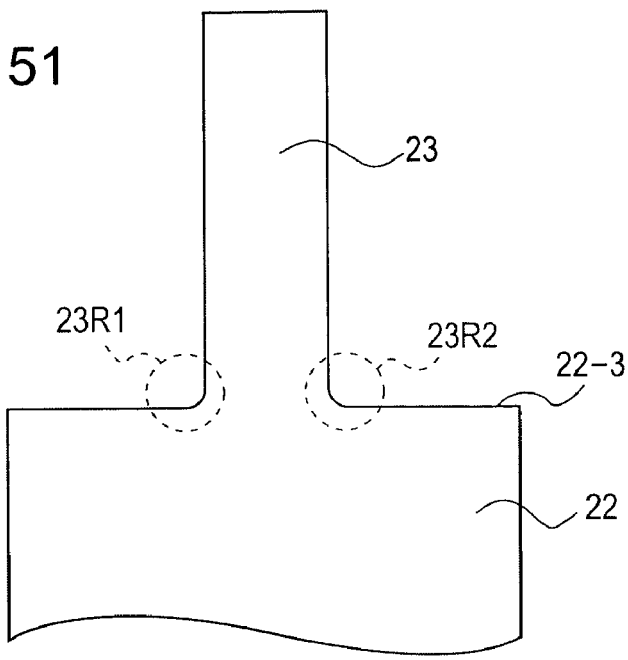
FIG. 51 is a plan view schematically showing the shape of the base end (root) of a vibrator part in a principal portion of a vibrating element.

When a linear groove is formed by general etching, an edge at a right angle (between the side in the groove width direction and the side in the groove length direction) is not precisely formed in the groove, and a curved edge is often formed. Therefore, in forming the outside groove 39, as shown in FIG. 51, the root parts 23R1 and 23R2 of the vibrator part, which correspond to the respective boundaries between the both sides of the vibrator part 23 and the side 22-3 of the base part 22, are formed in curved planar shapes. By using this etching property, the horizontal reinforcing part 129H is formed at the base end of the vibrator part 23 according to the first embodiment.

Figure 52A:
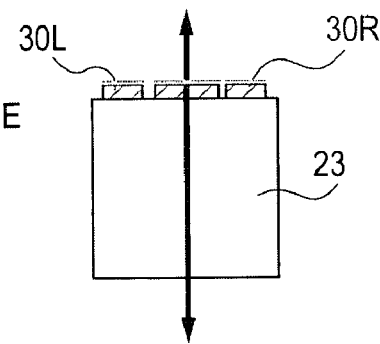
Figure 52B:
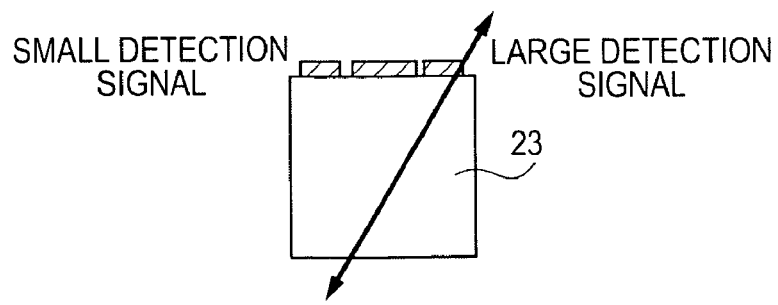

However, the root parts 23R1 and 23R2 of the vibrator part 23 are easily made asymmetric. As shown in FIG. 52A, when the vibrator part 23 has a symmetric shape, the vibration mode is an ideal vertical vibration mode, and the detection signals output from the detection electrodes 30L and 30R formed on the surface of the vibrator part 23 are also balanced without a difference therebetween. On the other hand, as described above, when the root parts 23R1 and 23R2 are asymmetric, the vibration mode of the vibrator part 23 becomes an oblique vibration mode, as shown in FIG. 52B.

In the vibrator part having such an oblique vibration mode, the detection signals from the right and left detection electrodes 3OR and 30L are not balanced. When the right and left diction signals are different, the detection amount of an angular velocity in the direction of rotation applied to the vibrator part varies, or the sensitivity of the angular velocity of clockwise rotation is different form that of the angular velocity of counterclockwise rotation.

On the other hand, as described above, in order to control the balance between the right and left detection signals, a predetermined region of the vibrator part 23 is polished by laser irradiation after the formation of the vibrator part 23. However, if the detection signals are balanced only by this method, the adjustment takes a long time. Also, only a difference of about 30% between the right and left signals may be adjusted by laser irradiation. Therefore, when the difference between the detection signals is larger than this value before the adjustment, the product may not be used to decrease the productivity.

In this embodiment, therefore, in order to the shorten the work time of the adjustment step and increase the rate of good products, the both ends 39A and 39B (refer to FIG. 53) of the outside groove 39 are tapered or curved outward in the etching step of forming the outer shape of the vibrator part 23, as descried below.

Figure 53:
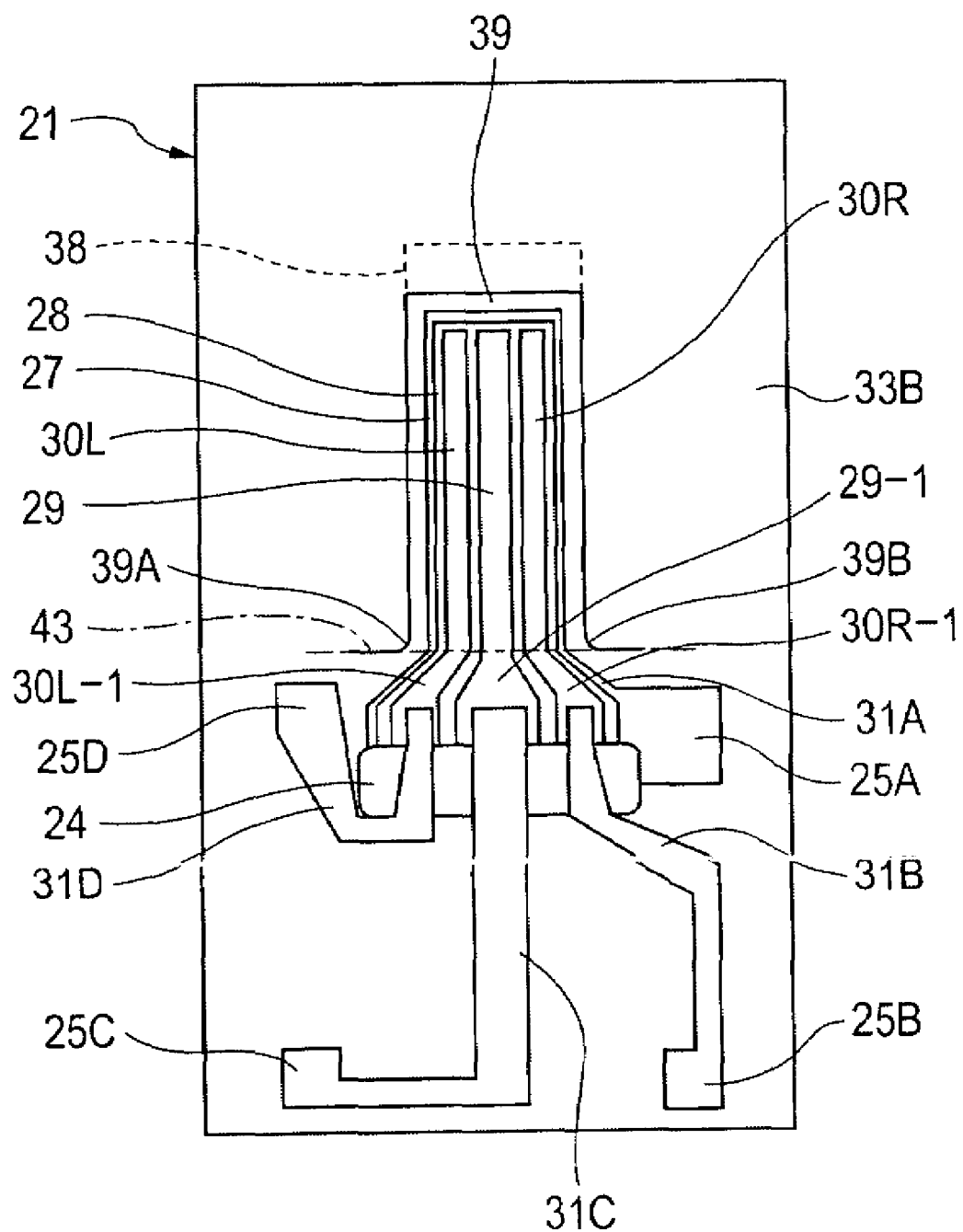
FIG. 53 is a plan view of a principal portion in a step of forming an outside groove according to a third embodiment of the invention.

FIG. 53 is a schematic plan view of the silicon substrate 21 in the step of forming the outside groove, in which the outside groove 39 is formed in a U shape surrounding the outer shape of the vibrator part 23, and both ends 39A and 39B of the outside groove 39 are curved outward. The shape of the outside groove 39 is formed by etching using the silicon oxide film 33b formed on the silicon substrate 21 as a mask. In this formation, the piezoelectric thin film layer 28, the electrode layers 27 and 29, the terminals 25, and the wiring pattern are covered with the protective film. In patterning the silicon oxide film 33B, both ends of a U-shaped opening corresponding to the formation region of the outside groove 39 are formed to be curved as shown in FIG. 53.

Figure 54:
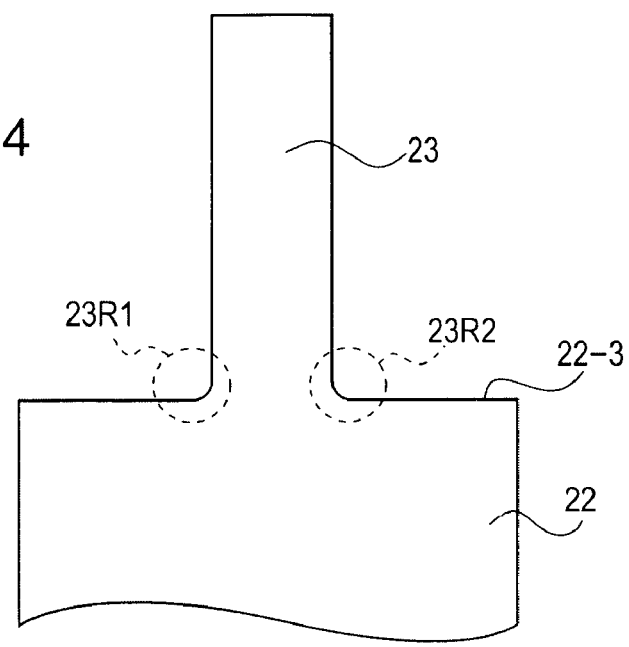
FIG. 54 is a plan view of a principal portion of a vibrator, for illustrating the operation of the third embodiment of the invention.

As a result, both ends 39A and 39B of the outside groove 39 are formed in a curved shape corresponding to the opening shape of the silicon oxide film 33B. As shown in FIG. 54, the symmetry of the root parts 23R1 and 23R2 of the vibrator part 23 is improved, and the root parts are formed in substantially the same shape. Consequently, a vertical vibration mode is maintained in the vibrator part 23, thereby improving the balance between the detection signals.

Figure 55A:
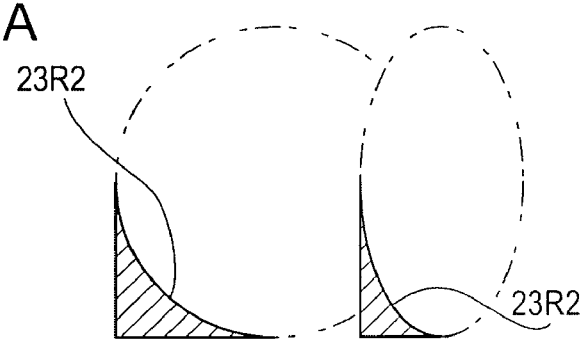
FIGS. 55A, 55B, and 55C are drawings illustrating respective examples of the root shape of a vibrator part.
Figure 55B:
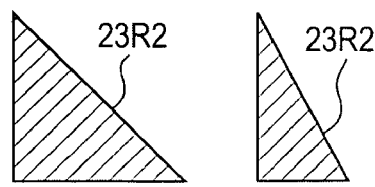
Figure 55C:
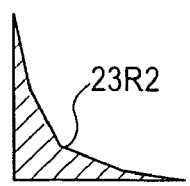

FIGS. 55A to 55C show examples of the planar shape of the root part 23R2 (23R1) of the vibrator part. FIG. 55A shows an example in which the vibrator root part 23R2 is formed in a circuit or elliptical shape having a constant curvature, FIG. 55B shows examples in which the vibrator part root parts 23R2 are formed in tapers having different inclination angles, and FIG. 55C shows an example in which the vibrator part root part 23R2 is formed a shape including a plurality of inclined surfaces, the inclination angle with the side 22-3 of the base part 22 gradually decreasing.

The shapes of the vibrator part root parts 23R1 and 23R2 are not limited to the above-described examples as long as the vibrator part root parts 23R1 and 23R2 are tapered or curved so that the width of the vibrator part 23 gradually decreases toward the outside. The curvature of the vibrator part root parts 23R1 and 23R2 may be set to any value, for example, 5 µm. Also, the shape of the horizontal reinforcing parts 129H may be formed according to the shape of the vibrator part root parts 23R1 and 23R2.

As described above, according to this embodiment, both ends 39A and 39B of the outside groove 39 are initially patterned in curved shapes so that the vibrator part root parts 23R1 and 23R2 are also curved. Therefore, the vibrator part 23 may be formed in a substantially symmetric shape and the ideal vertical vibration mode may be maintained. As a result, even in a vibrating element which vibrates in an unbalanced vibration mode, which has been not sufficiently adjusted, the vibration mode may be satisfactorily adjusted by laser irradiation in the adjustment step, thereby improving the production yield.

As a result of confirmation by the inventors, the defective rate (yield rate) of vibrating elements produced from a single silicon substrate and causing a difference of less than 30% between right and left detection signals before the adjustment step is usually about 38%. However, according to this embodiment, the yield is significantly increased to about 82%. In this embodiment, the radius curvature of the vibrator part root parts is 20 µm.

Fourth Embodiment

As described above with reference to the first embodiment, the reference electrode layer 27, the piezoelectric thin film layer 28, and the driving electrode layer 29 are laminated on the surface (substrate-facing surface 23-2) of the vibrator part 23 of each vibrating element 20. Furthermore, the piezoelectric layer and the electrode layers are covered with the insulating protective layer 45 for protecting from adhesion of atmospheric moisture and dust. Since the piezoelectric thin film layer 28, the electrode layers, and the protective layer are formed on the surface of the vibrator part 23 having a thickness of as small as about 100 μm, the vibrator part 23 itself may be curved by the stress of the materials of these films according to the materials selected.

Figure 56:
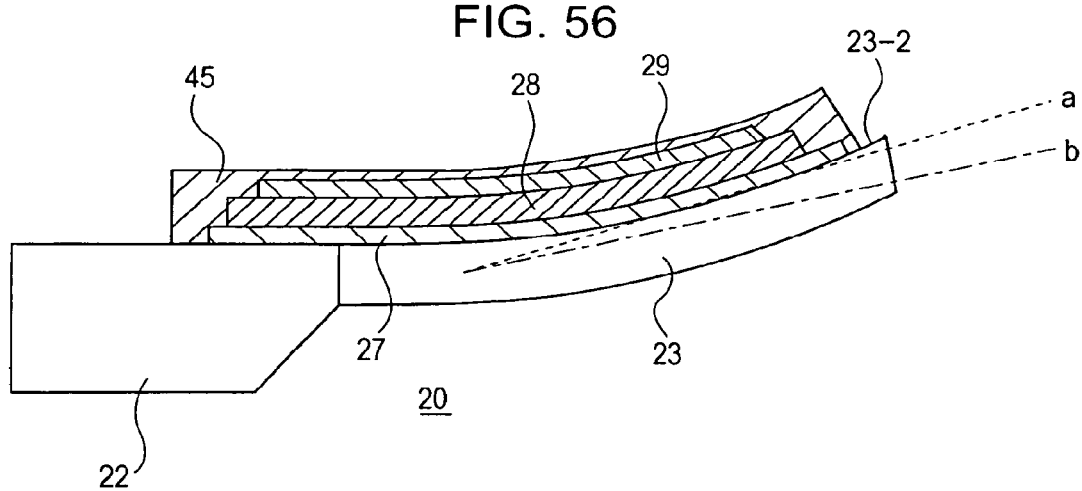
FIG. 56 is a sectional side view schematically illustrating the curvature states of a vibrator part having electrode layers formed on the surface thereof.

As shown in FIG. 56, the piezoelectric thin film layer 28 formed by sputtering is oxidized by annealing at a high temperature after the deposition, and thus stress is applied in a compression direction. Furthermore, the piezoelectric thin film layer 28 is polarized for stabilizing the characteristics thereof. When the polarization is performed in the direction from the upper electrode side to the lower electrode side, compressive internal stress occurs in the piezoelectric thin film layer, as shown in FIG. 56.

On the other hand, the reference electrode layer 27 formed as a lower electrode film is formed using Ti/Pt in order to improving the characteristics of the film. However, the reference electrode layer 27 is formed by sputtering at a low gas pressure in order to improve the crystal structure, and thus compressive stress is applied to the lower electrode film, as shown in FIG. 56. In addition, the driving electrode layer 29 (detection electrodes 30R ad 30L) formed as an upper electrode film preferably includes a metal film which is not oxidized by heat treatment in the process, and thus Pt used for the lower electrode film is also used. Therefore, compressive stress is applied to the upper electrode film, as shown in FIG. 56. Similarly, the insulating protective layer 45 is also formed by sputtering deposition of a silicon oxide layer and alumina layers above and below the silicon oxide layer at a low pressure, and thus compressive stress is applied to the resulting film.

Therefore, the surface (substrate-facing surface) 23-2 of the vibrator part 23 on which these films are formed is easily curved to project in the downward direction in FIG. 56. When the curved vibrator 23 is vibrated, the amount of vibration in the direction in which the vibrator 23 is curved is small, and the amount of vibration on the side opposite to the curvature direction is increased. Therefore, as shown in FIG. 56, the direction of extension a of the vibrator 23 does not coincide with the vibration center b thereof, and thus a high resonance amplitude is not obtained, thereby decreasing the detection sensitivity. In FIG. 56, in order to make an explanation comprehensible, the vibrating element 20 is shown upside down, and thus the substrate-facing surface 23-2 of the vibrator part 23 faces upward.

Figure 57:
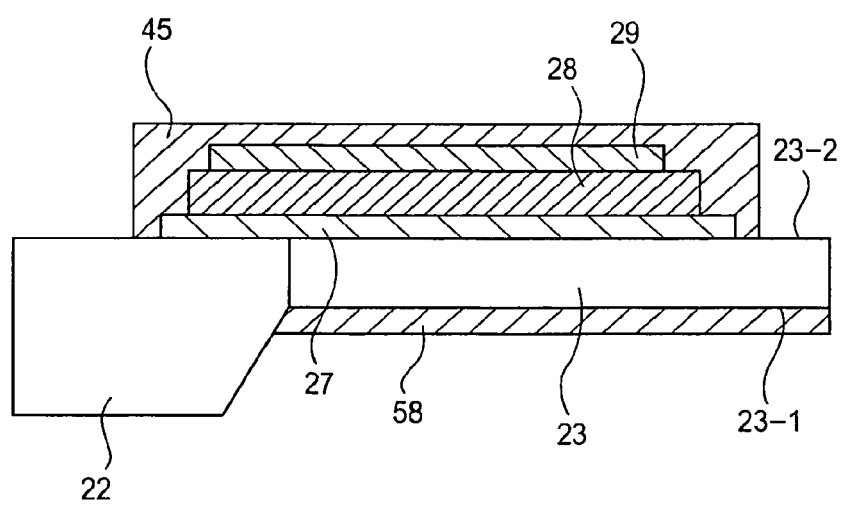
FIG. 57 is a sectional side view of a vibrating element according to a fourth embodiment of the invention.

In this embodiment, therefore, as shown in FIG. 57, a curvature control film 58 is formed on the main surface (the upper surface 23-1 of the vibrator part 23) opposite to the electrode formation surface of the vibrator part 23, for suppressing the curvature of the vibrator part 23 and obtaining stable output. The compressive stress produced in each surface of the vibrator part 23 is canceled by the compressive stress possessed by the curvature control film 58, thereby suppressing the curvature.

The material of the curvature control film 58 is not particularly limited as long as the material may impart compressive stress to the vibrator part 23 during deposition. For example, a Pt film which is the same as the electrode material used for the upper electrode film and the lower electrode film, or the same material as that for the insulating protective film 45 may be used. Since the magnitude of compressive stress depends on the thickness and deposition conditions of the film, the amount of curvature of the vibrator part 23 may be appropriately controlled by, for example, controlling the thickness of the curvature control film 58.

In the step of forming the curvature control film 58, the curvature control film 58 may be formed by sputtering after the formation of each vibrating element 20 or may be introduced in the course of the process for forming each vibrating element 20. The material used is not particularly limited, and any material and formation method may be used.

Figure 58:
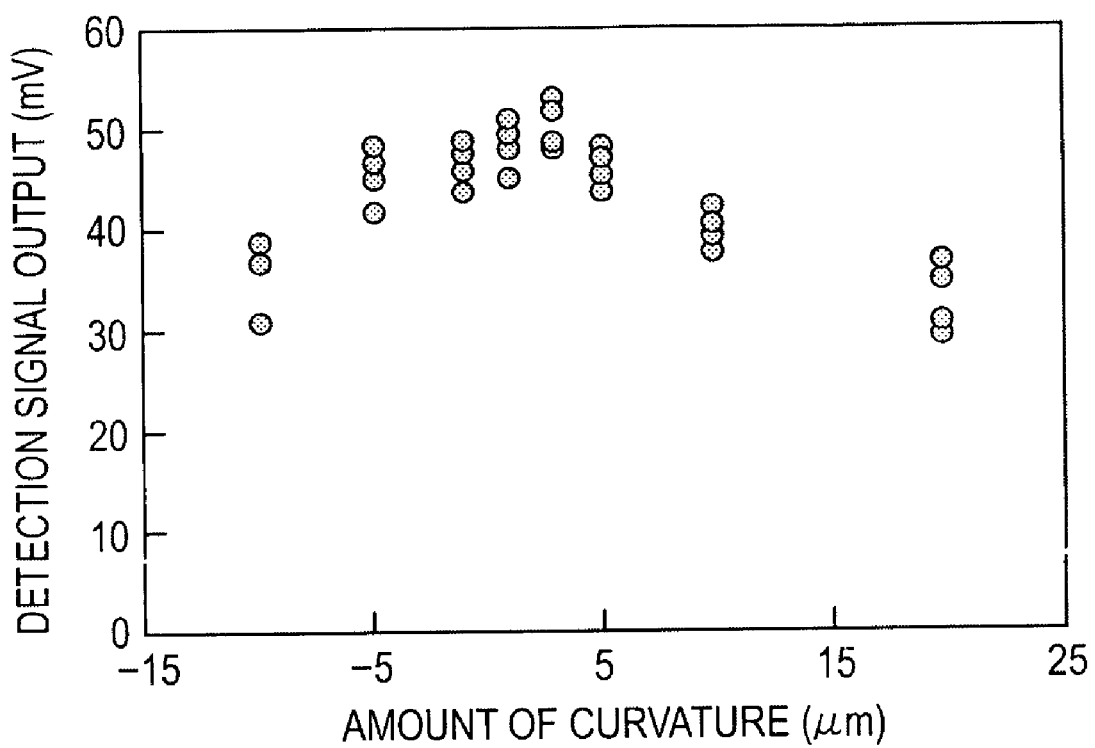
FIG. 58 is a graph showing the relation between the amount of curvature of a vibrator part and the detection signal output.

FIG. 58 is a graph showing the observed relation between the curvature of the vibrator part 23 and the vibration amplitude at a resonance point. In this figure, the curvature of the vibrator part 23 is expressed by a difference between the heights of the base part and the tip of the vibrator part 23. FIG. 58 confirms that when the curvature of the vibrator part 23 is within ±5 μm from the horizontal surface, the amplitude is kept high, while when the curvature exceeds ±10 μm, the amplitude is decreased. Therefore, when the curvature of the vibrator part 23 is suppressed to ±5 μm or less from the horizontal surface, a high resonance amplitude is obtained, and a high detection signal and high detection sensitivity are also obtained.

As descried above, the vibrating gyrosensor described in the specification has the following features:

1. The vibrating gyrosensor including a support substrate on which a wiring pattern having a plurality of lands is formed, and vibrating elements mounted on a surface of the support substrate, wherein each of the vibrating elements includes a base part having a mounting surface on which a plurality of terminal parts to be connected to the respective lands is formed, and a vibrator part integrally projected in a cantilever manner from a side of the base part and having a substrate-facing surface coplanar with the mounting surface of the base part, and the vibrator part has a first electrode layer, a piezoelectric thin film layer, a second electrode layer, and a insulating protective layer for sealing the first electrode layer, piezoelectric layer, and second electrode layer which are formed on the substrate-facing surface of the vibrator part in that order.

2. The vibrating gyrosensor described in 1, wherein the insulating protective layer includes at least a silicon oxide layer.

3. The vibrating gyrosensor described in 2, wherein an adhesive layer is formed on at least the lower side of the silicon oxide layer.

4. The vibrating gyrosensor described in 3, wherein the adhesive layer is an alumina layer.

5. The vibrating gyrosensor described in 1, wherein the insulating protective layer has a thickness of at least 2 times that of the second electrode layer.

6. The vibrating gyrosensor described in 1, wherein the insulating protective layer is wider than the first electrode layer and is formed to expose the substrate-facing surface of the vibrator along the peripheral line of the vibrator part.

7. The vibrating gyrosensor described in 1, wherein a curvature control film is formed on the upper surface of the vibrator part, for controlling the curvature of the vibrator part.

8. The vibrating gyrosensor described in 7, wherein the curvature of the vibrator part is within ±5 μm.

9. The vibrating gyrosensor described in 1, wherein each of the vibrating elements is formed using an undoped single crystal silicon substrate as a base material.

10. The vibrating gyrosensor described in 9, wherein the undoped single crystal silicon substrate has a volume resistivity of 100 Ω·cm or more.

11. The vibrating gyrosensor described in 1, wherein the surface of the support substrate is covered with a light-shielding cover member.

12. A method for manufacturing a vibrating gyrosensor including vibrating elements each including a base part having a mounting surface on which a plurality of terminal parts is formed, and a vibrator part integrally projected in a cantilever manner from a side of the base part and having a substrate-facing surface coplanar with the mounting surface of the base part, the method including the steps of forming a first electrode layer on the substrate-facing surface of the vibrator part, forming a piezoelectric layer on the first electrode layer, forming a second electrode layer on the piezoelectric layer, and forming an insulating protective layer to cover the piezoelectric layer and the first and second electrode layers.

13. The method described in 12, wherein the step of forming the insulating protective layer includes the steps of forming an adhesive layer on the substrate-facing surface of the vibrator part and forming a silicon oxide layer on the adhesive layer.

14. The method descried in 13, wherein the silicon oxide layer is deposited by sputtering in an argon gas atmosphere at a pressure of the discharge lower limit to 0.4 Pa.

15. The method described in 13, wherein the step of forming the insulating protective layer includes a step of forming a resist adhesive layer on the silicon oxide layer.

It should be understood by those skilled in the art that various modifications, combinations, sub-combinations and alterations may occur depending on design requirements and other factors insofar as they are within the scope of the appended claims or the equivalents thereof.

What is claimed is:

1. A vibrating gyrosensor comprising:
a support substrate on which a wiring pattern having a plurality of lands is formed; and
a vibrating element mounted on a surface of the support substrate the vibrating element having a base part having a mounting surface on which a plurality of terminals to be connected to the lands is formed, and a vibrator part integrally projected in a cantilever manner from one of the sides of the base part and having a substrate-facing surface coplanar with the mounting surface of the base part,
wherein,
the vibrator part has a first electrode layer, a piezoelectric layer, and a second electrode layer, which are formed on the substrate-facing surface in that order, and
a reinforcing part is formed at the base end of the vibrator part so that the sectional area of the vibrator part gradually increases toward the base part.

2. The vibrating gyrosensor according to claim 1, wherein the upper surface of the vibrator part is stepped down from the upper surface of the base part through an inclined part; and the reinforcing part is formed on the upper surface of the base end of the vibrator part along the inclined part.

3. The vibrating gyrosensor according to claim 1, wherein the reinforcing part is formed so that the width of the base end of the vibrator part gradually increases toward the side of the base part.

4. The vibrating gyrosensor according to claim 3, wherein the reinforcing part is curved at both sides of the base end of the vibrator part.

5. The vibrating gyrosensor according to claim 1, wherein the edges between the upper surface and the both side surfaces of the vibrator part are melted to form chamfered parts.

6. The vibrating gyrosensor according to claim 1, wherein at least one of the edges between the upper surface and the side surfaces of the vibrator part is curved.

7. The vibrating gyrosensor according to claim 1, wherein at least a portion of the surfaces other than the substrate-facing surface of the vibrator part is melted to form a smooth surface.

8. A vibrating gyrosensor comprising:
a support substrate on which a wiring pattern having a plurality of lands is formed; and
a vibrating element mounted on a surface of the support substrate, the vibrating element having a base part having a mounting surface on which a plurality of terminals to be connected to the lands is formed, and a vibrator part integrally projected in a cantilever manner from one of the sides of the base part and having a substrate-facing surface coplanar with the mounting surface of the base part,
wherein,
the vibrator part has a first electrode layer, a piezoelectric layer, a second electrode layer, and an insulating protective layer for sealing the first electrode layer, the piezoelectric layer, and the second electrode layer, which are formed on the substrate-facing surface in that order, and
a reinforcing part is formed at the base end of the vibrator so that the sectional area of the vibrator part gradually increases toward the base part.

9. The vibrating gyrosensor according to claim 8, wherein the insulating protective layer contains at least a silicon oxide layer.

10. The vibrating gyrosensor according to claim 9, wherein an adhesive layer is formed on at least the lower side of the silicon oxide layer.

11. The vibrating gyrosensor according to claim 10, wherein the adhesive layer is an alumina layer.

12. The vibrating gyrosensor according to claim 8, wherein the insulating protective layer has a thickness of at least 2 times that of the second electrode layer.

13. The vibrating gyrosensor according to claim 8, wherein the insulating protective layer is wider than the first electrode layer and is formed so that the substrate-facing surface of the vibrator is exposed along the peripheral line of the vibrator part.

14. The vibrating gyrosensor according to claim 8, wherein a curvature control film is formed on the upper surface of the vibrator part, for controlling the curvature of the vibrator.

15. The vibrating gyrosensor according to claim 14, wherein the curvature of the vibrator part is within +−5 µm.

16. A vibrating gyrosensor comprising:
a support substrate on which a wiring pattern having a plurality of lands is formed; and
a vibrating element mounted on a surface of the support substrate the vibrating element formed using an undoped single crystal silicon substrate as a base material and includes a base part having a mounting surface on which a plurality of terminals to be connected to the lands is formed, and a vibrator part integrally projected in a cantilever manner from one of the sides of the base part and having a substrate-facing surface coplanar with the mounting surface of the base part,
wherein,
the vibrator has a first electrode layer, a piezoelectric layer, and a second electrode layer, which are formed on the substrate-facing surface in that order, and
a reinforcing part is formed at the base end of the vibrator part so that the sectional area of the vibrator gradually increases toward the base part.

17. The vibrating gyrosensor according to claim 16, wherein the undoped single crystal silicon substrate has a volume resistivity of 100 Ωcm or more.

18. The vibrating gyrosensor according to claim 16, wherein the surface of the support substrate is covered with a light-shielding cover member.

* * * * *